(12) United States Patent
Khlat

(10) Patent No.: US 9,118,100 B2
(45) Date of Patent: Aug. 25, 2015

(54) ANTENNA SWITCHING CIRCUITRY FOR A WORLDPHONE RADIO INTERFACE

(71) Applicant: RF Micro Devices, Inc., Greensboro, NC (US)

(72) Inventor: Nadim Khlat, Midi-Pyrenees (FR)

(73) Assignee: RF Micro Devices, Inc., Greensboro, NC (US)

(*) Notice: Subject to any disclaimer, the term of this patent is extended or adjusted under 35 U.S.C. 154(b) by 0 days.

(21) Appl. No.: 13/944,972

(22) Filed: Jul. 18, 2013

(65) Prior Publication Data

US 2013/0337753 A1    Dec. 19, 2013

Related U.S. Application Data

(63) Continuation of application No. 13/943,969, filed on Jul. 17, 2013, and a continuation-in-part of application No. 13/852,527, filed on Mar. 28, 2013.

(60) Provisional application No. 61/673,014, filed on Jul. 18, 2012, provisional application No. 61/660,969, filed on Jun. 18, 2012, provisional application No. 61/789,007, filed on Mar. 15, 2013.

(51) Int. Cl.
*H04B 1/44* (2006.01)
*H04M 1/00* (2006.01)
(Continued)

(52) U.S. Cl.
CPC ... *H01P 1/15* (2013.01); *B81B 7/02* (2013.01); *H04B 1/44* (2013.01)

(58) Field of Classification Search
CPC ....... H04B 1/44; H04B 7/0602; H04B 7/0817

USPC ............... 455/78, 553.1, 562.1, 575.7, 552.1
See application file for complete search history.

(56) References Cited

U.S. PATENT DOCUMENTS 4,498,057 A    2/1985   Noro
5,502,422 A    3/1996   Newell et al.
(Continued)

OTHER PUBLICATIONS

Author Unknown, "3rd Generation Partnership Project; Technical Specification Group Radio Access Network; Evolved Universal Terrestrial Radio Access (E-UTRA); User Equipment (UE) Radio Transmission and Reception (Release 11)," Technical Specification 36.101, Version 11.1.0, Jun. 2012, 3GPP Organizational Partners, 336 pages.

(Continued)

*Primary Examiner* — Simon Nguyen
(74) *Attorney, Agent, or Firm* — Withrow & Terranova, P.L.L.C.

(57) ABSTRACT

This disclosure relates to radio frequency (RF) front-end circuitry. In one embodiment, the RF front-end circuitry is arranged to provide antenna switching functionality for a Worldphone or a World tablet. The RF front-end circuitry may include front-end switching circuitry, a multiple throw microelectromechanical switch (MTMEMS), a first antenna port, a second antenna port, and a third antenna port. The front-end switching circuitry of the RF front-end circuitry is configured to selectively couple one or more RF ports to either the first antenna port or the second antenna port. The MTMEMS is configured to selectively couple a pole port coupled to the third antenna port to any one of a set of throw ports, which may be RF ports or may be coupled to RF ports. As such, the RF front-end circuitry is capable of providing antenna switching functionality between three antennas for a Worldphone or World tablet.

20 Claims, 30 Drawing Sheets

(51) Int. Cl.
*H01P 1/15* (2006.01)
*B81B 7/02* (2006.01)

(56) References Cited

U.S. PATENT DOCUMENTS

| | | | |
|---|---|---|---|
| 6,091,970 | A | 7/2000 | Dean |
| 6,128,474 | A | 10/2000 | Kim et al. |
| 6,405,018 | B1 | 6/2002 | Reudink et al. |
| 7,187,945 | B2 | 3/2007 | Ranta et al. |
| 7,212,788 | B2 | 5/2007 | Weber et al. |
| 7,251,499 | B2* | 7/2007 | Ella et al. .................. 455/552.1 |
| 7,864,491 | B1 | 1/2011 | Bauder et al. |
| 7,872,547 | B2* | 1/2011 | Song et al. ...................... 455/78 |
| 7,973,645 | B1 | 7/2011 | Moretti et al. |
| 7,996,003 | B2 | 8/2011 | Maeda et al. |
| 8,208,867 | B2* | 6/2012 | Lum et al. ...................... 455/78 |
| 8,437,438 | B2* | 5/2013 | Kuwahara ..................... 375/347 |
| 8,565,701 | B2 | 10/2013 | Sanchez et al. |
| 8,571,489 | B2 | 10/2013 | Mikhemar et al. |
| 8,634,029 | B2 | 1/2014 | Pugel |
| 8,718,582 | B2 | 5/2014 | See et al. |
| 8,774,067 | B2* | 7/2014 | Rousu et al. .................. 370/297 |
| 2005/0245202 | A1* | 11/2005 | Ranta et al. .................... 455/78 |
| 2005/0277387 | A1* | 12/2005 | Kojima et al. .................. 455/78 |
| 2006/0012425 | A1 | 1/2006 | Ohnishi et al. |
| 2006/0025171 | A1* | 2/2006 | Ly et al. ...................... 455/553.1 |
| 2006/0240785 | A1 | 10/2006 | Fischer |
| 2006/0276132 | A1* | 12/2006 | Sheng-Fuh et al. .......... 455/41.2 |
| 2006/0293005 | A1 | 12/2006 | Hara et al. |
| 2007/0280185 | A1 | 12/2007 | McFarland et al. |
| 2008/0003797 | A1 | 1/2008 | Kim |
| 2009/0180403 | A1 | 7/2009 | Tudosoiu |
| 2009/0303007 | A1 | 12/2009 | Ryou et al. |
| 2010/0099366 | A1 | 4/2010 | Sugar et al. |
| 2010/0291888 | A1 | 11/2010 | Hadjichristos et al. |
| 2011/0241782 | A1 | 10/2011 | Clifton |
| 2011/0241787 | A1 | 10/2011 | Mastovich |
| 2011/0250926 | A1 | 10/2011 | Wietfeldt et al. |
| 2012/0235735 | A1 | 9/2012 | Spits et al. |
| 2013/0320803 | A1 | 12/2013 | Maeda |
| 2013/0321095 | A1* | 12/2013 | Lam et al. ...................... 333/103 |
| 2014/0051372 | A1 | 2/2014 | Shoshan et al. |
| 2014/0073371 | A1* | 3/2014 | Mujtaba et al. ................ 455/515 |

OTHER PUBLICATIONS

Author Unknown, "MIPI Alliance Application Note for Analog Control Interface—Envelope Tracking," ACI-ET, Version 1.0.0, Release 19, Oct. 4, 2012, 1 page.

Djoumessi, Erick Emmanuel, et al., "Electronically Tunable Diplexer for Frequency-Agile Transceiver Front-End," 2010 IEEE MTT-S International Microwave Symposium Digest (MTT), May 23-28, 2010, pp. 1472-1475.

Valkenburg, M.E., Van, "12.2 Pole Reciprocation." Analog Filter Design. New York: CBS College Publishing, 1982. pp. 327-333.

Wang, Zhao-Ming, et al., "The Design of a Symmetrical Diplexer Composed of Canonical Butterworth Two-Port Networks," 1988 IEEE International Symposium on Circuits and Systems, vol. 2, Jun. 7-9, 1988, pp. 1179-1182.

Williams, Arthur Bernard, et al. Electronic Filter Design Handbook, 3rd. ed. New York: McGraw-Hill, 1995, pp. 3.1-4.7 and 11.72-11.73.

Zverev, Anatol I., Handbook of Filter Synthesis, New York: John Wiley & Sons, 1967, pp. 192-193.

Notice of Allowance for U.S. Appl. No. 13/460,861, mailed Jan. 30, 2014, 9 pages.

Notice of Allowance for U.S. Appl. No. 13/045,604, mailed May 17, 2013, 11 pages.

Non-Final Office Action for U.S. Appl. No. 13/045,621, mailed May 31, 2013, 13 pages.

Notice of Allowance for U.S. Appl. No. 13/045,621, mailed Sep. 24, 2013, 10 pages.

Non-Final Office Action for U.S. Appl. No. 13/852,527, mailed Sep. 30, 2014, 19 pages.

Non-Final Office Action for U.S. Patent Application No. 13/852,309, mailed Oct. 14, 2014, 10 pages.

Final Office Action for U.S. Appl. No. 13/852,527, mailed Jan. 12, 2015, 21 pages.

Non-Final Office Action for U.S. Appl. No. 13/429,778, mailed Jan. 22, 2015, 5 pages.

Final Office Action for U.S. Appl. No. 13/852,309, mailed Feb. 18, 2015, 12 pages.

Notice of Allowance and Examiner-Initiated Interview Summary for U.S. Appl. No. 14/052,221, mailed Feb. 26, 2015, 9 pages.

Non-Final Office Action for U.S. Appl. No. 13/929,987, mailed Jan. 30, 2015, 11 pages.

Non-Final Office Action for U.S. Appl. No. 13/852,527, mailed Apr. 23, 2015, 23 pages.

Notice of Allowance for U.S. Appl. No. 13/942,778, mailed May 14, 2015, 10 pages.

Advisory Action for U.S. Appl. No. 13/852,309, mailed Apr. 29, 2015, 4 pages.

Advisory Action for U.S. Appl. No. 13/852,309, mailed May 27, 2015, 4 pages.

Non-Final Office Action for U.S. Appl. No. 14/051,601, mailed May 5, 2015, 6 pages.

Notice of Allowance for U.S. Appl. No. 13/929,987, mailed Jun. 23, 2015, 8 pages.

* cited by examiner

US 9,118,100 B2

ANTENNA SWITCHING CIRCUITRY FOR A WORLDPHONE RADIO INTERFACE

RELATED APPLICATIONS

This application is a continuation of U.S. patent application Ser. No. 13/943,969, filed on Jul. 17, 2013 and entitled "RF FRONT-END CIRCUITRY FOR RECEIVE MIMO SIGNALS," which claims the benefit of U.S. Provisional Patent Application Ser. No. 61/673,014, filed on Jul. 18, 2012, the disclosures of which are hereby incorporated herein by reference in their entireties.

This application is also a continuation-in-part of U.S. patent application Ser. No. 13/852,527, filed on Mar. 28, 2013 and entitled "DUAL ANTENNA INTEGRATED CARRIER AGGREGATION FRONT-END SOLUTION," which claims the benefit of and priority to U.S. Provisional Patent Application Ser. No. 61/660,969 filed on Jun. 18, 2012 and entitled "DUAL ANTENNA INTEGRATED CARRIER AGGREGATION FRONT-END SOLUTION," and U.S. Provisional Patent Application Ser. No. 61/789,007 filed on Mar. 15, 2013 and entitled "DUAL ANTENNA INTEGRATED CARRIER AGGREGATION FRONT-END SOLUTION," the disclosures of which are hereby incorporated herein by reference in their entireties.

FIELD OF THE DISCLOSURE

This disclosure relates generally to radio frequency (RF) front-end circuitry which may be provided in an RF front-end module. More specifically, this disclosure relates to antenna switching circuitry, which may be provided as RF front-end circuitry within an RF front-end module.

BACKGROUND

Radio frequency (RF) front-end modules are utilized in mobile communication devices (e.g., laptops, cellular phones, tablets, etc.) to handle RF signals transmitted to the mobile communication devices and/or received by the mobile communication devices. Manufacturers and consumers of mobile communication devices continue to demand increasingly greater rates of data exchange (data rates) and the ability to handle RF signals formatted in accordance with an increasing variety of RF communication standards and RF communication specifications. As such, the RF front-end module may include RF transceiver circuitry with a plurality of different transmit chains and receiver chains in order to process the various types of RF signals. The RF front-end modules may thus include RF front-end circuitry, such as antenna switching circuitry, that allows for RF signals to be routed to the various transmit chains and receiver chains from one or more common antennas.

For example, certain high band receive Long Term Evolution (LTE) diversity and receive LTE MIMO specifications for Worldphones and World tablets may require operation with three antennas, where any two of the three antennas are used simultaneously. Unfortunately, antenna switching solutions currently suffer from high insertions losses when operating at the high frequency ranges demanded by high band receive LTE diversity and receive LTE MIMO specifications for Worldphones and World tablets. Accordingly, antenna switching solutions are needed for Worldphones and World tablets that are capable of reducing insertion losses when operating in accordance with high band receive LTE diversity and receive LTE MIMO specifications.

SUMMARY

This disclosure relates generally to radio frequency (RF) front-end circuitry. In one embodiment, the RF front-end circuitry is arranged to provide antenna switching functionality for a Worldphone or a World tablet. The RF front end circuitry may include front-end switching circuitry, a multiple throw microelectromechanical switch (MTMEMS), a first antenna port for a first antenna, a second antenna port for a second antenna, and a third antenna port for a third antenna. As such, the RF front-end circuitry is configured to provide antenna switching functionality between three antennas as required by Worldphones and World tablets.

The front-end switching circuitry and the MTMEMS allow for routing of RF signals from the first, second, and third antenna ports. In particular, the front-end switching circuitry of the RF front-end circuitry is configured to selectively couple one or more RF ports to either the first antenna port or the second antenna port. Accordingly, the front-end switching circuitry allows for RF signals to be routed between the RF ports and the first and second antenna ports.

With regard to the MTMEMS, the MTMEMS has a pole port and a set of throw ports, which may also be RF ports or may be coupled directly or indirectly to RF ports. The pole port of the MTMEMS is coupled to the third antenna port and the MTMEMS is configured to selectively couple the pole port to any one of the throw ports. Accordingly, the MTMEMS allows for routing of RF signals from the third antenna port and the throw ports and thus allows for the RF front-end circuitry to operate in accordance with high band receive LTE diversity and/or receive LTE MIMO specifications. However, the MTMEMS may provide for better performance at higher frequencies and, more specifically, may reduce insertion losses when the RF front-end circuitry is operating with RF signals in high frequency ranges. As such, the RF front-end circuitry is capable of providing antenna switching functionality for three antennas as required by Worldphones and World tablets, while lowering insertion losses within high bands.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 3:
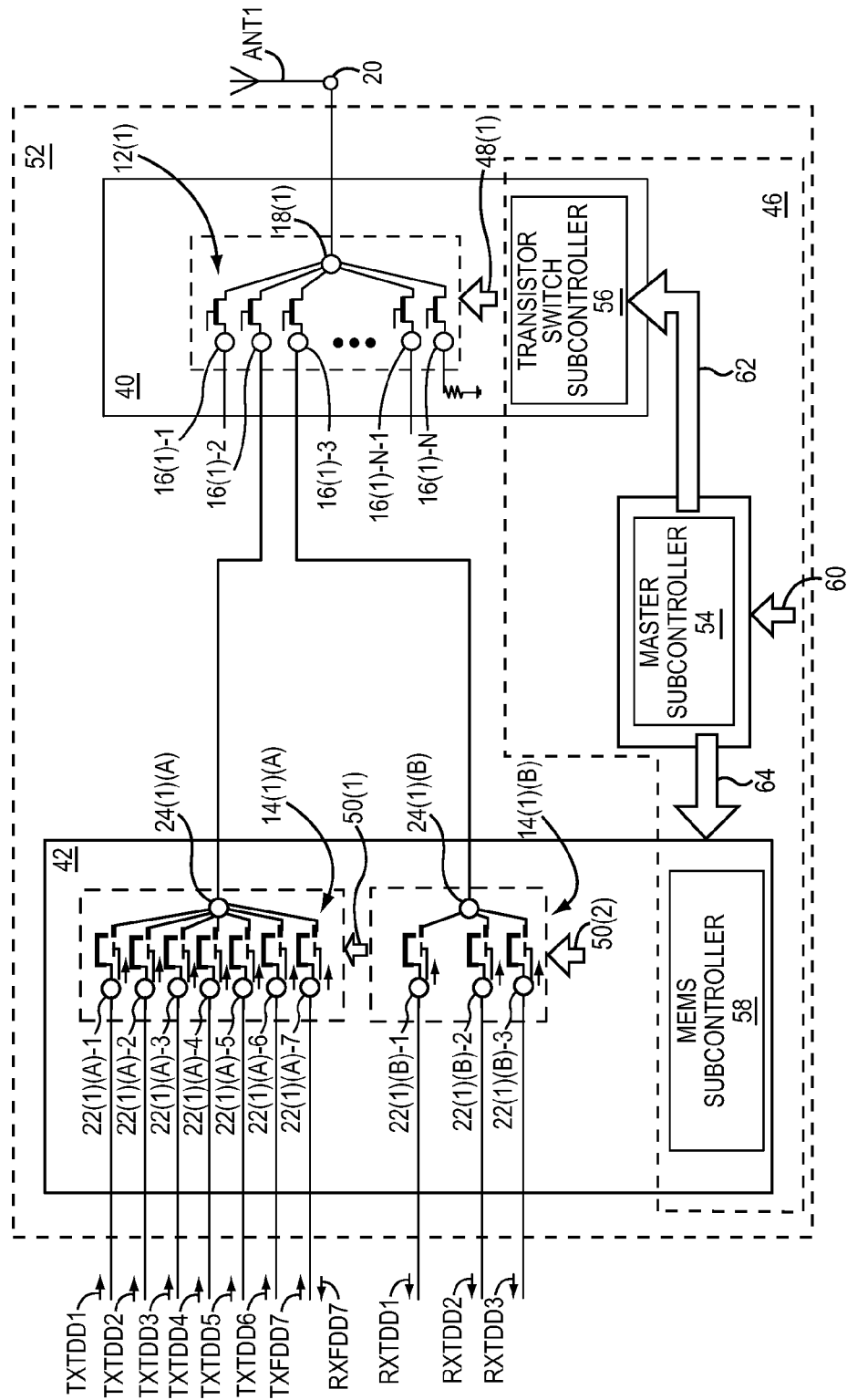

FIG. 3 illustrates exemplary RF front-end circuitry, wherein the RF front-end circuitry includes yet another embodiment of the antenna switching circuitry having an MTSTS coupled to an antenna port, a first MTMEMS operably associated with the MTSTS, a second MTMEMS operably associated with the MTSTS, and the control circuit, wherein throw ports of the first MTMEMS receive RF transmission signals from RF transceiver circuitry (not shown), throw ports of the second MTMEMS transmit RF receive signals to the RF transceiver circuitry, and one of the throw ports of the first MTMEMS further transmits another RF receive signal to the RF transceiver circuitry.

Figure 4:
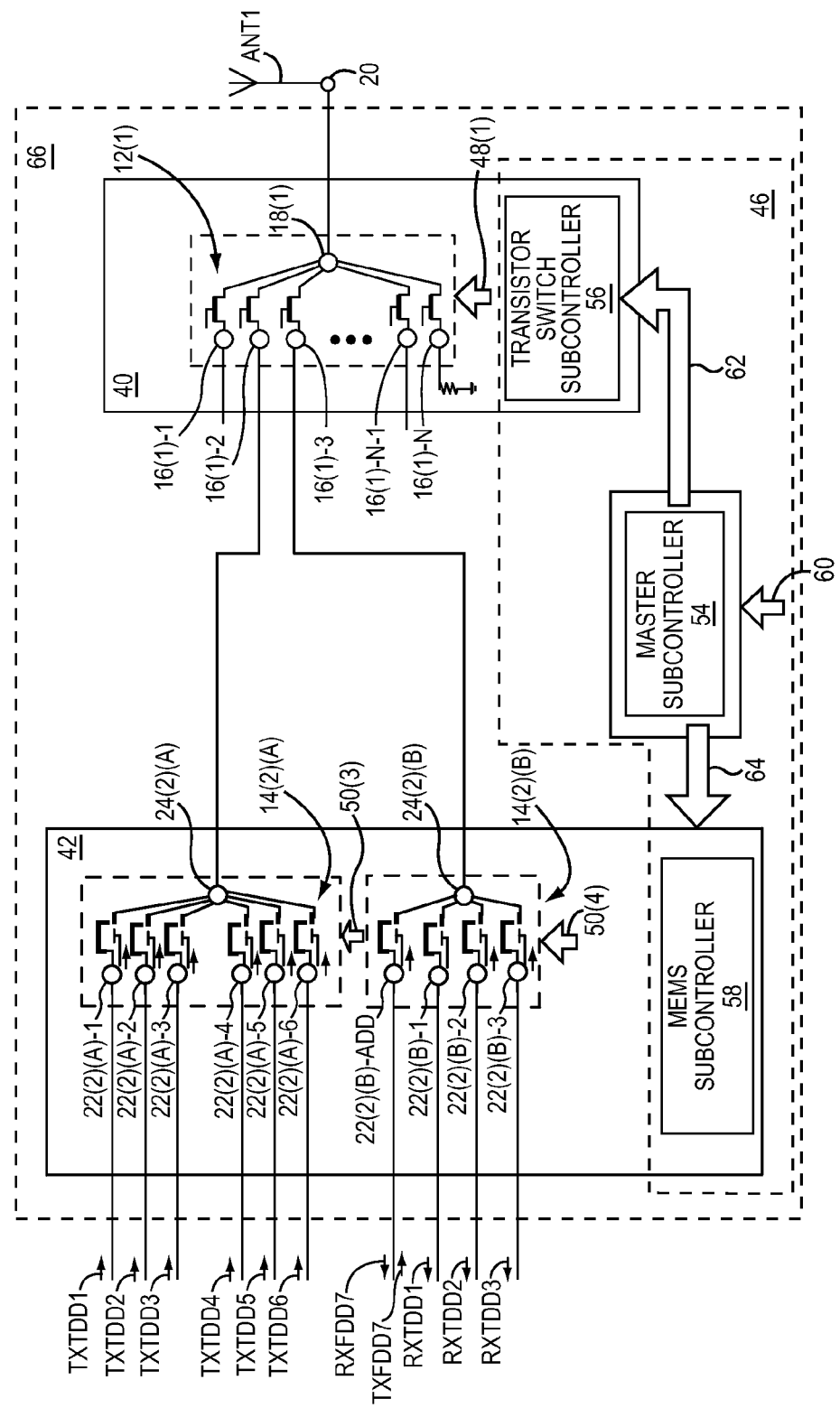

FIG. 4 illustrates exemplary RF front-end circuitry, wherein the RF front-end circuitry includes still another embodiment of the antenna switching circuitry having an MTSTS, a first MTMEMS operably associated with the MTSTS, and a second MTMEMS operably associated with the MTSTS, wherein the first MTMEMS and the second MTMEMS are similar to the first MTMEMS and the second MTMEMS shown in FIG. 3, but in this embodiment the second MTMEMS has a throw port that further receives one of the RF transmission signals from the RF transceiver circuitry (not shown).

Figure 5:
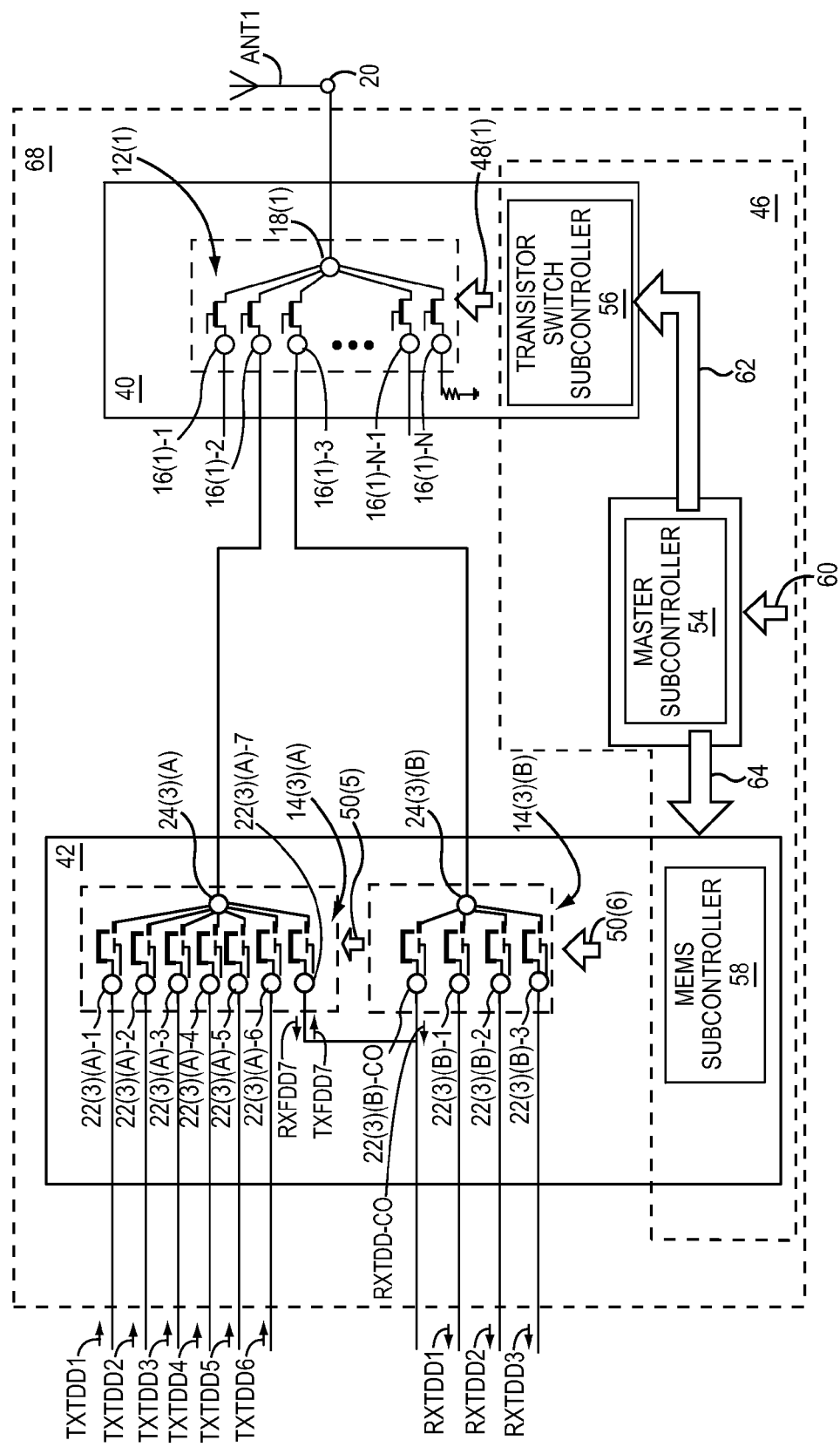

FIG. 5 illustrates exemplary RF front-end circuitry, wherein the RF front-end circuitry includes yet another embodiment of the antenna switching circuitry having an MTSTS, a first MTMEMS operably associated with the MTSTS, and a second MTMEMS operably associated with the MTSTS, wherein the first MTMEMS and the second MTMEMS are similar to the first MTMEMS and the second MTMEMS shown in FIG. 3, but in this embodiment the first MTMEMS has a throw port that is directly connected to a throw port of the second MTMEMS.

Figure 6:
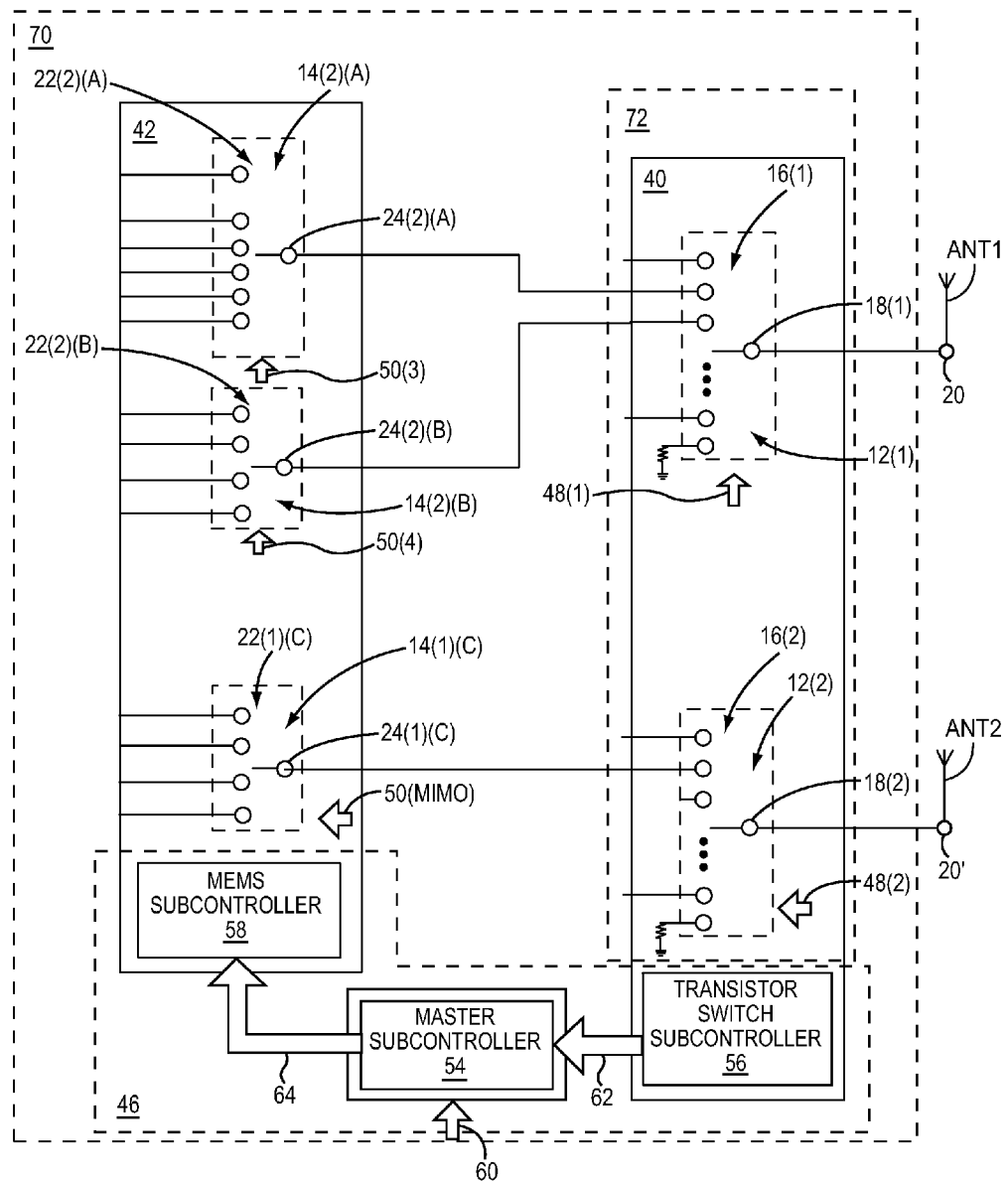

FIG. 6 illustrates exemplary RF front-end circuitry, wherein the RF front-end circuitry includes still another embodiment of the antenna switching circuitry having exemplary front-end switching circuitry coupled to a first antenna port and a second antenna port, the first MTMEMS shown in FIG. 4, the second MTMEMS shown in FIG. 4, and, additionally, a third MTMEMS.

Figure 6A:
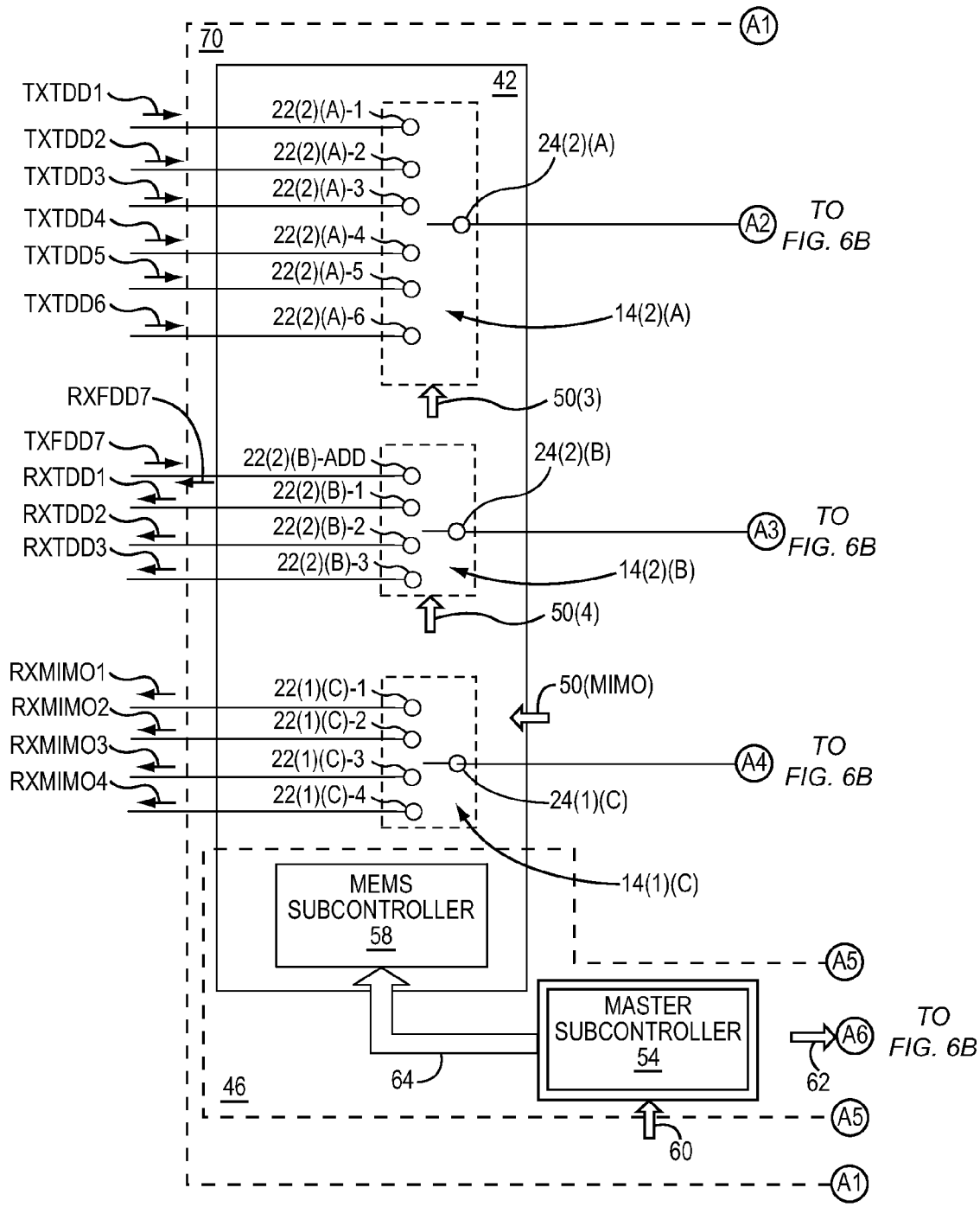

FIG. 6A is a more detailed illustration of the first MTMEMS, the second MTMEMS, and the third MTMEMS shown in FIG. 6, where the third MTMEMS receives multiple secondary receive MIMO signals.

Figure 6B:
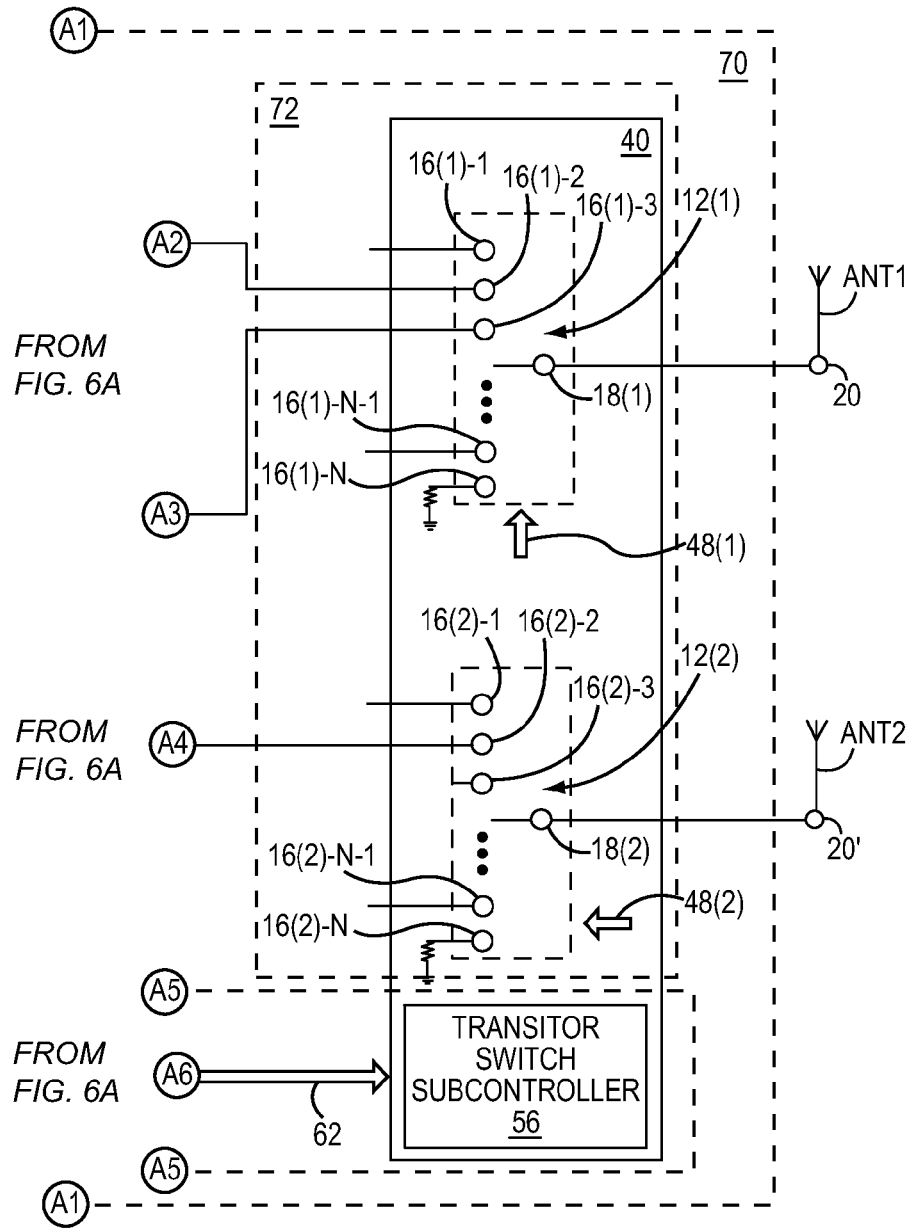

FIG. 6B is a more detailed illustration of low band switching circuitry and high band switching circuitry in the front-end switching circuitry of FIG. 6, wherein the low band switching circuitry is a single pole MTSTS (SPMTSTS) and the high band switching circuitry is another SPMTSTS.

Figure 7:
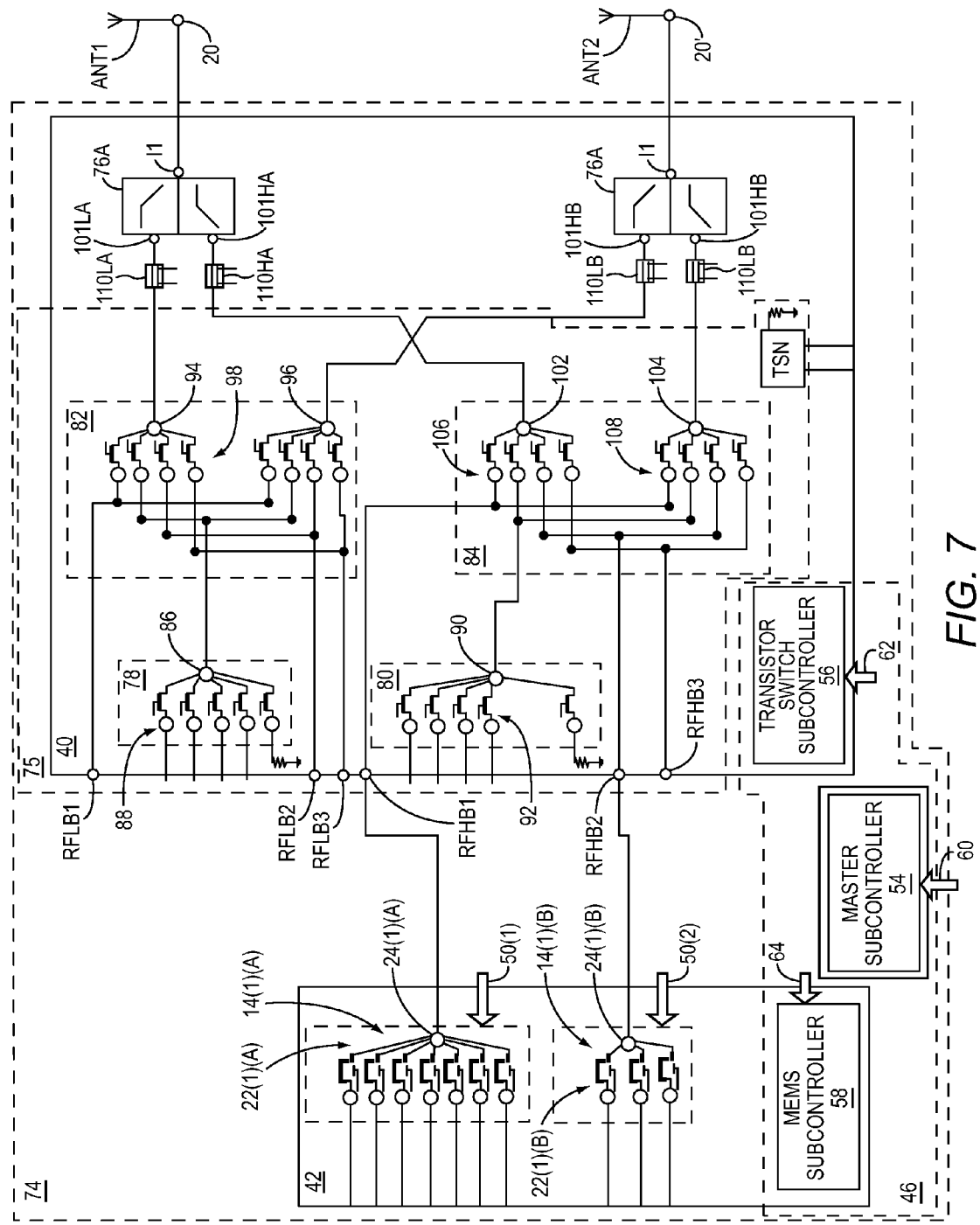

FIG. 7 illustrates exemplary RF front-end circuitry, wherein the RF front-end circuitry includes still another embodiment of the antenna switching circuitry that includes another embodiment of exemplary front-end switching circuitry coupled to the first antenna port and the second antenna port, the first MTMEMS shown in FIG. 3, and the second MTMEMS shown in FIG. 3.

Figure 7A:
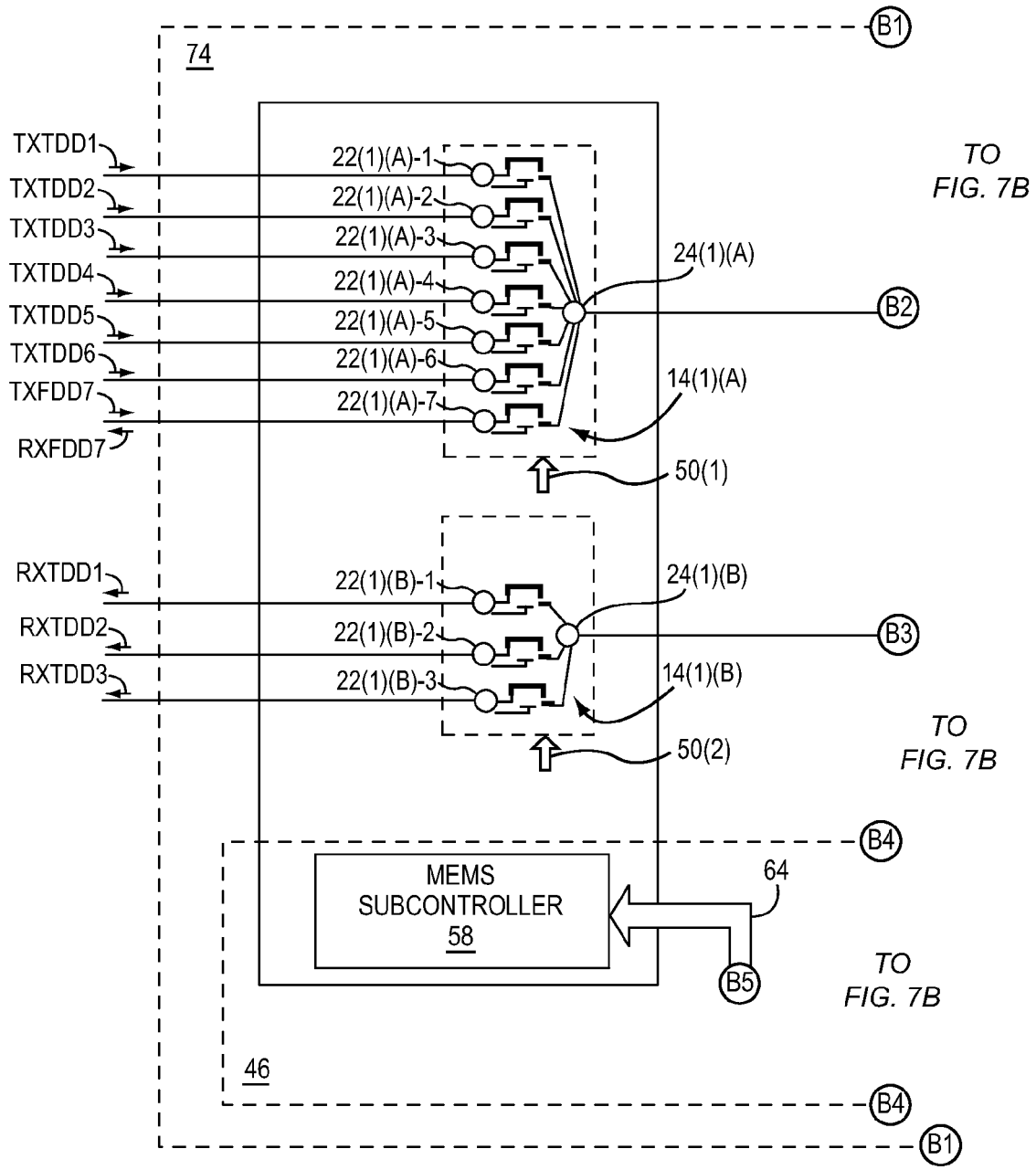

FIG. 7A is a more detailed illustration of the first MTMEMS and the second MTMEMS shown in FIG. 7.

Figure 7B:
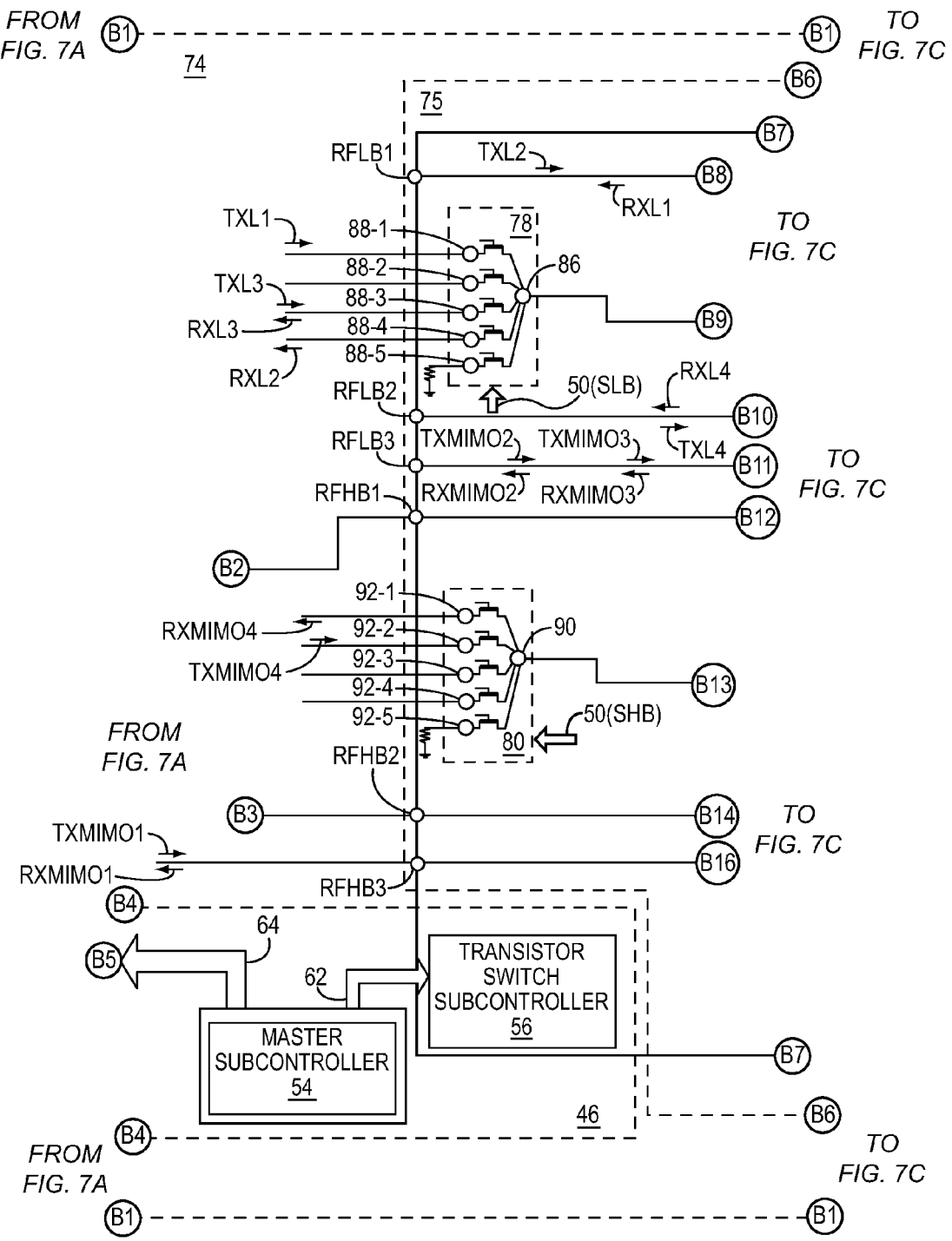

FIG. 7B is a more detailed illustration of low band switching circuitry and high band switching circuitry in the front-end switching circuitry of FIG. 7, wherein the low band switching circuitry is an SPMTSTS and the high band switching circuitry is another SPMTSTS.

Figure 7C:
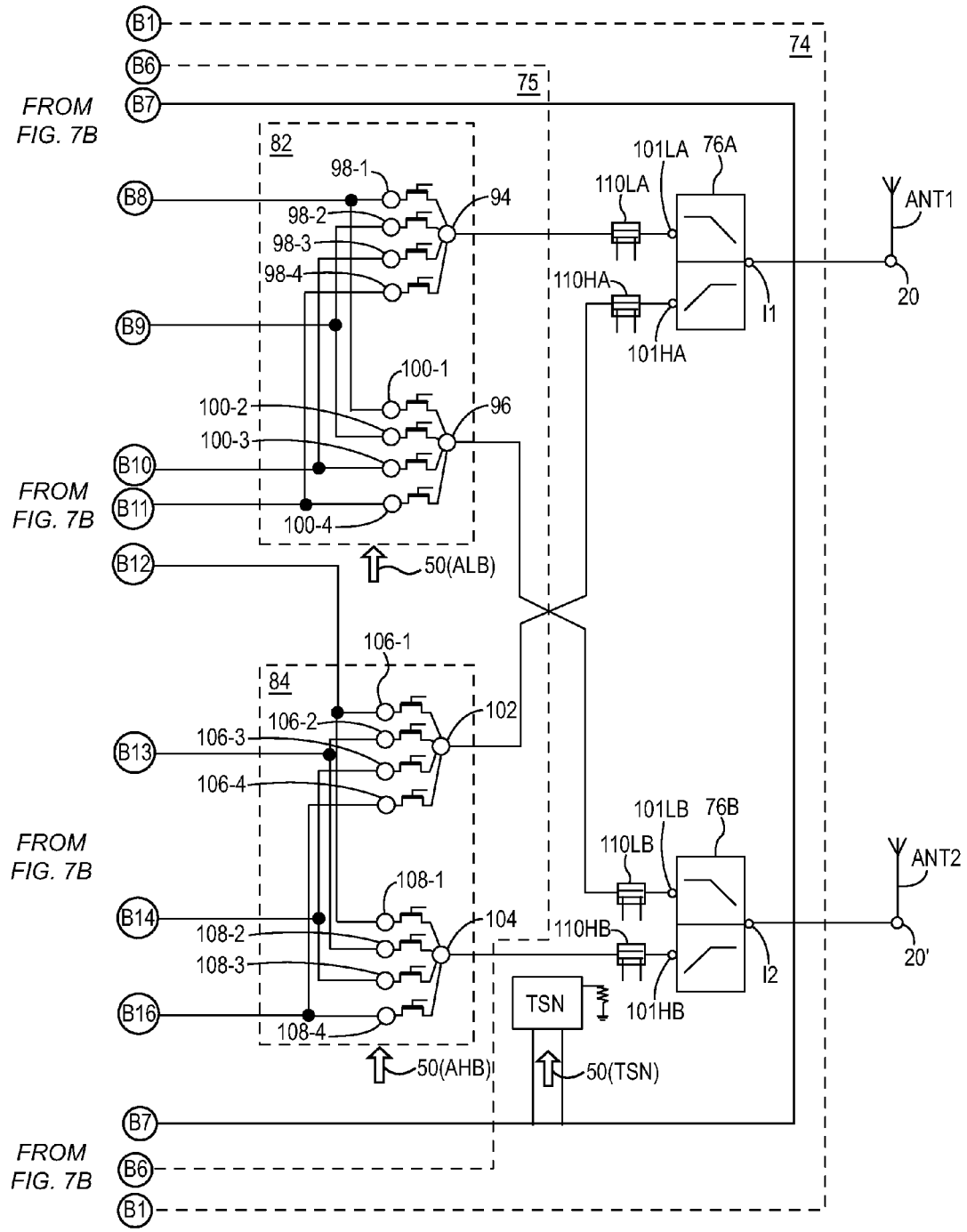

FIG. 7C is a more detailed illustration of low band antenna selection circuitry provided as a double pole MTSTS (DPMTSTS) in the front-end switching circuitry of FIG. 7, and high band antenna selection circuitry provided as a DPMTSTS in the front-end switching circuitry of FIG. 7, along with directional couplers and diplexers provided in the antenna switching circuitry of FIG. 7 between the front-end switching circuitry and the first and second antenna ports.

Figure 8:
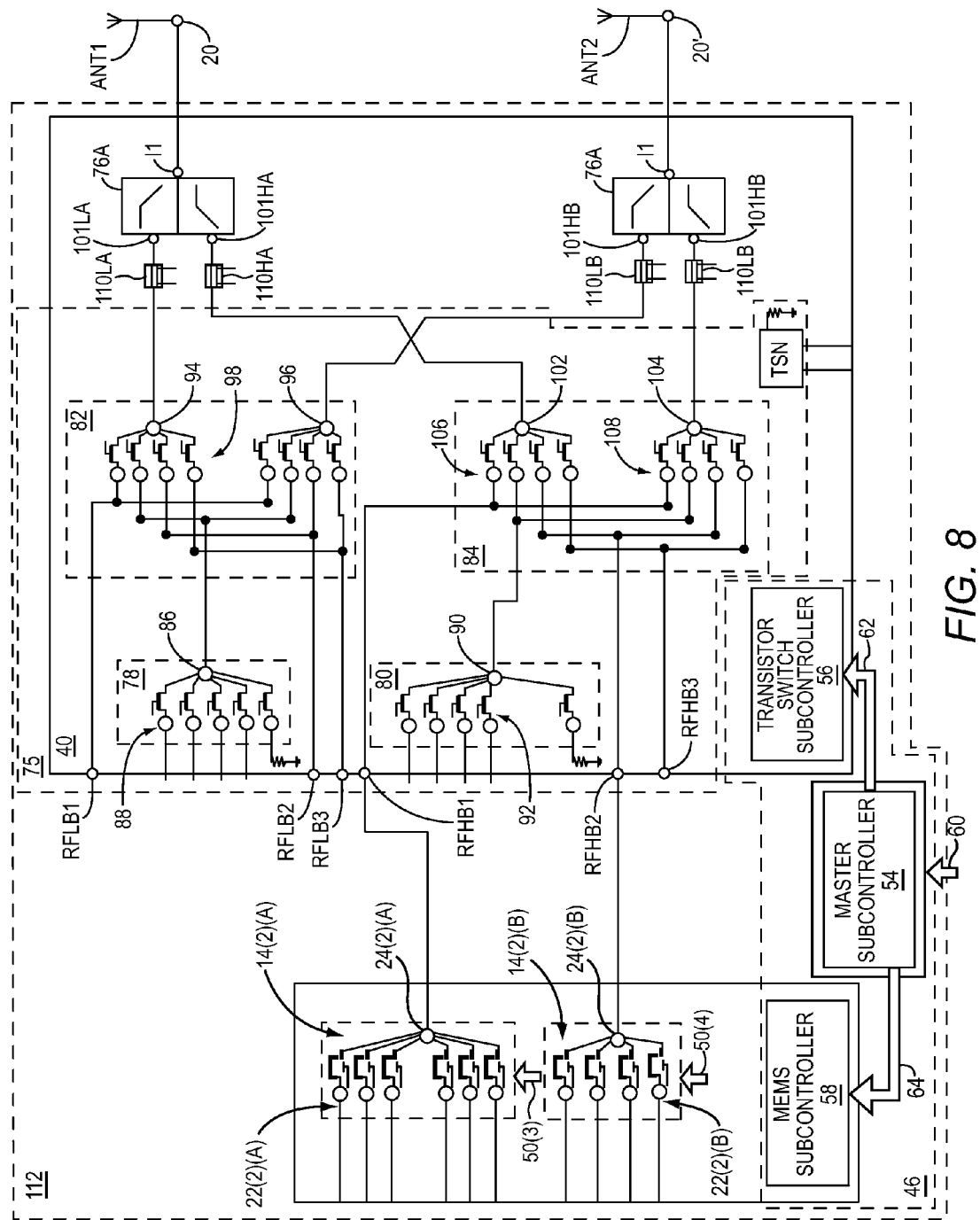

FIG. 8 illustrates exemplary RF front-end circuitry, wherein the RF front-end circuitry includes still another embodiment of the antenna switching circuitry that includes the front-end switching circuitry shown in FIG. 7, the first MTMEMS shown in FIG. 4, and the second MTMEMS shown in FIG. 4.

Figure 8A:
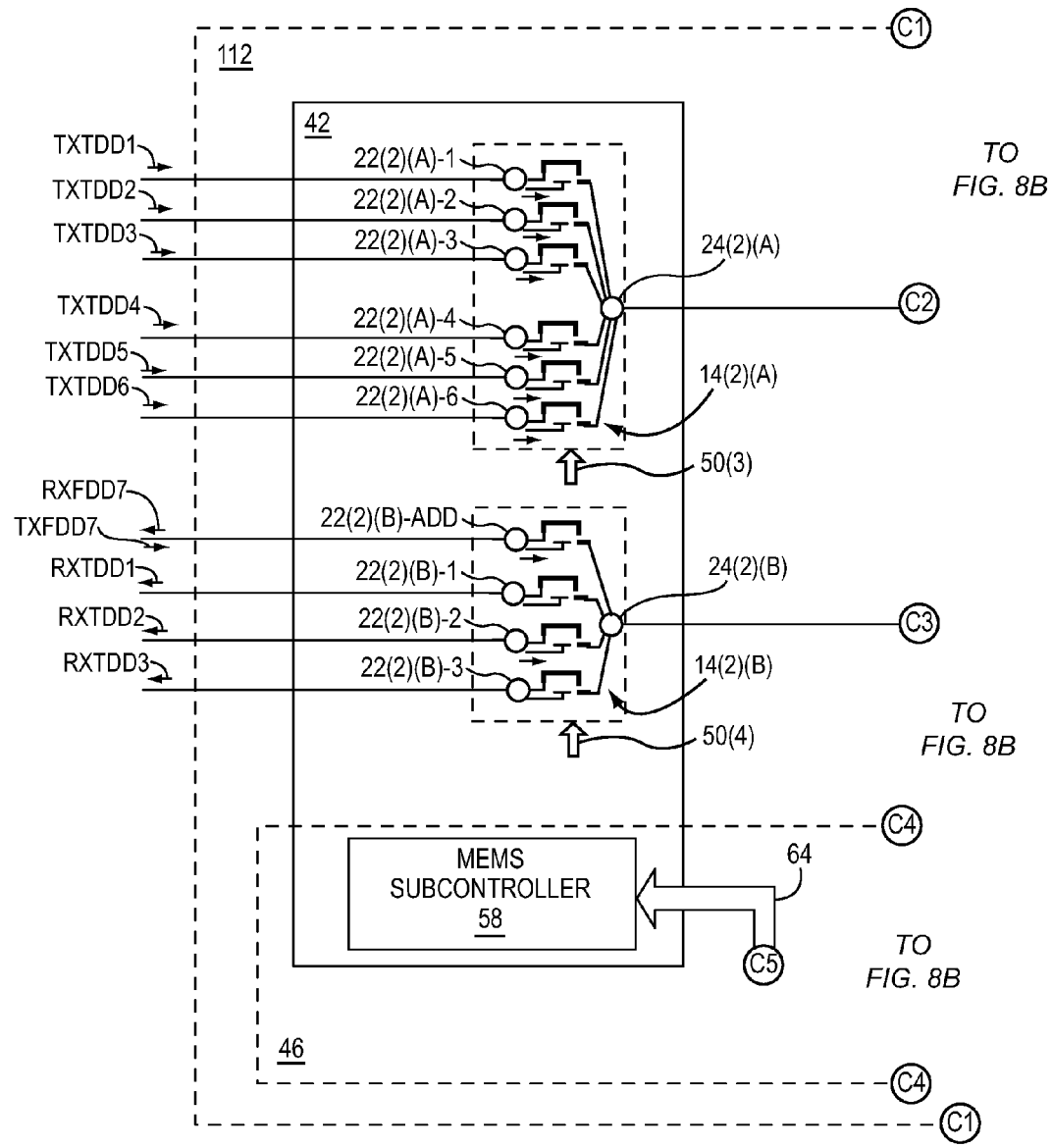

FIG. 8A is a more detailed illustration of the first MTMEMS shown in FIG. 8 and the second MTMEMS shown in FIG. 8.

Figure 8B:
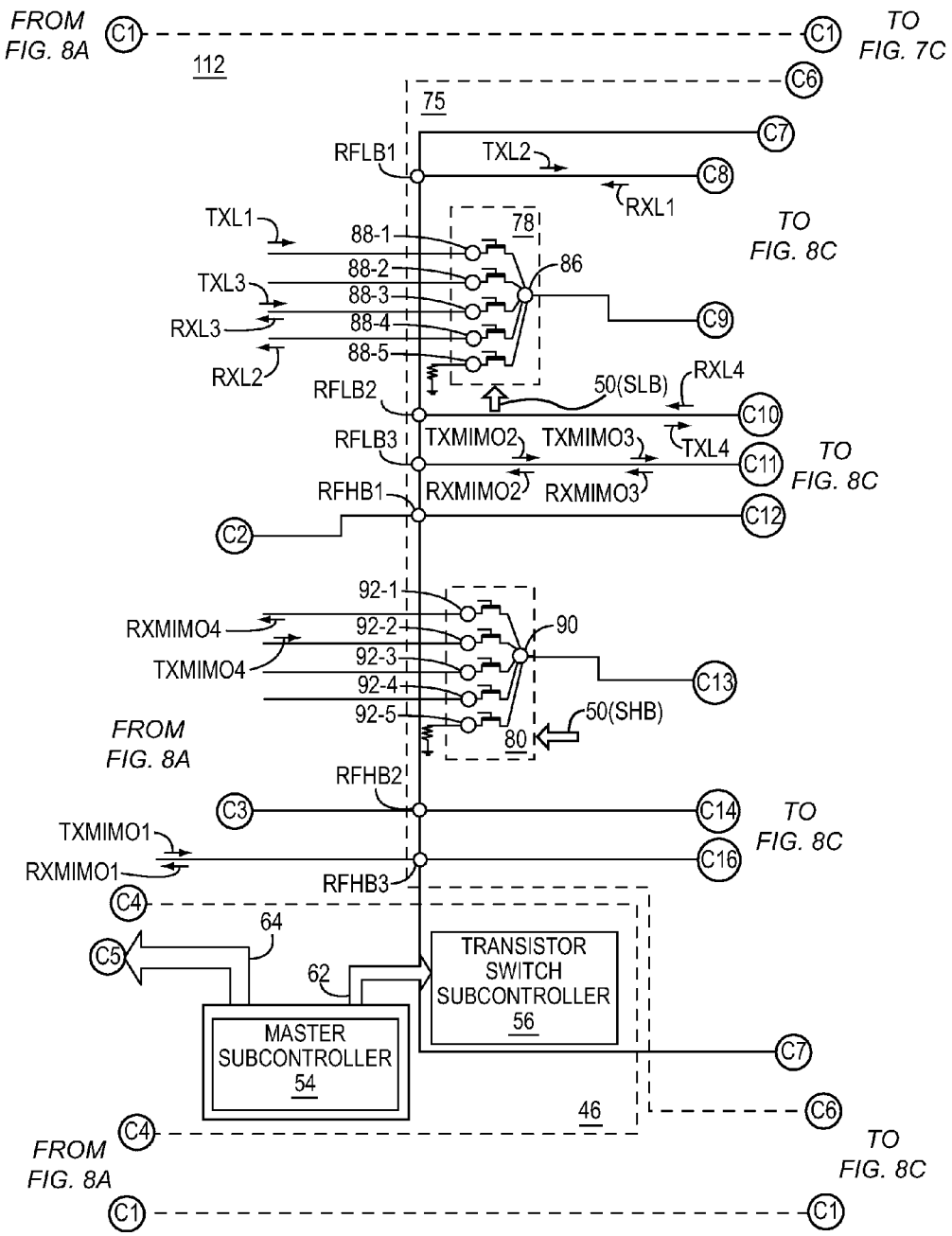

FIG. 8B is a more detailed illustration of the low band switching circuitry and the high band switching circuitry in the front-end switching circuitry of FIG. 8.

Figure 8C:
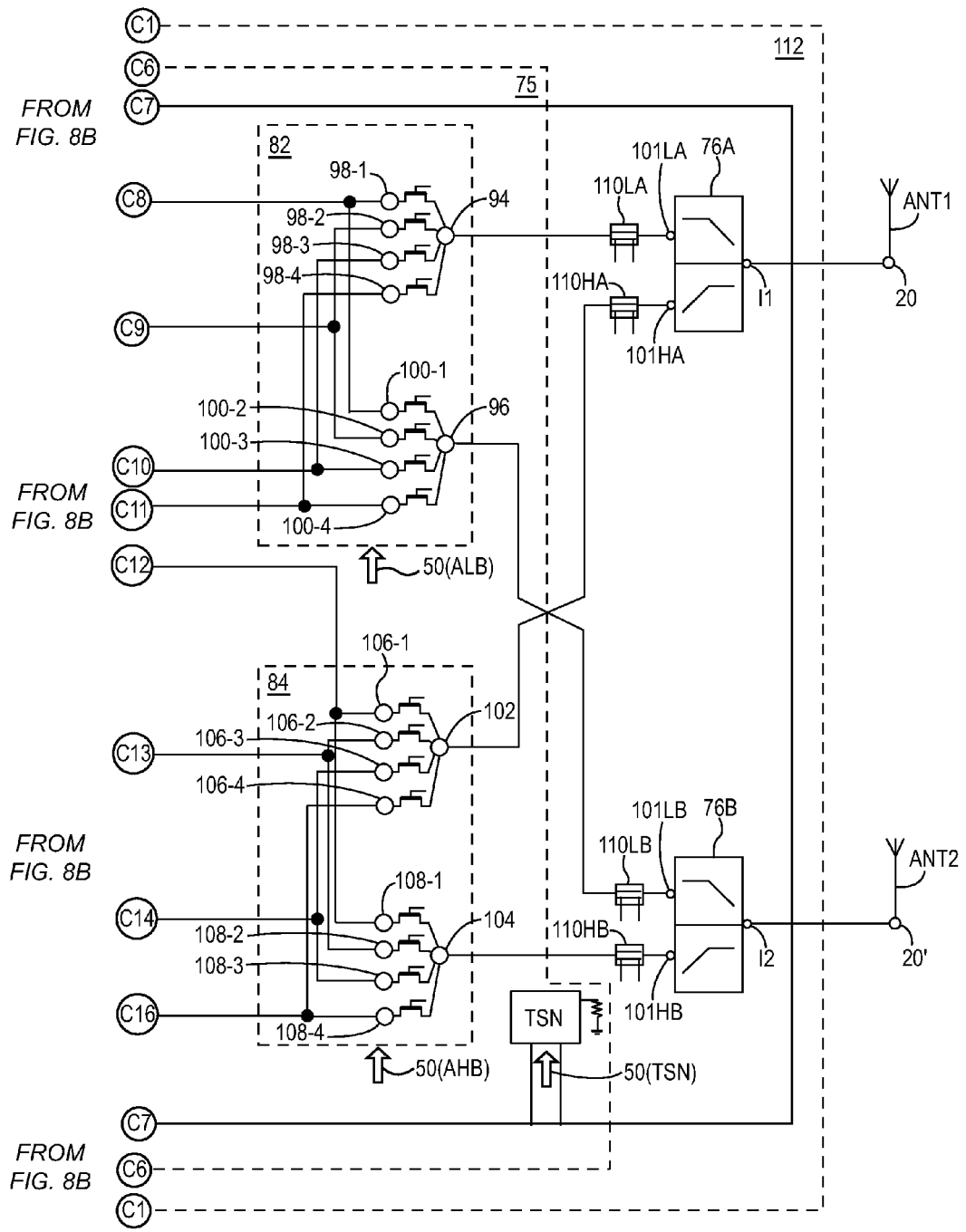

FIG. 8C is a more detailed illustration of the low band antenna selection circuitry in the front-end switching circuitry of FIG. 8 and the high band antenna selection circuitry in the front-end switching circuitry of FIG. 8, along with the directional couplers and the diplexers provided in the antenna switching circuitry of FIG. 8 between the front-end switching circuitry and the first and second antenna ports.

Figure 9:
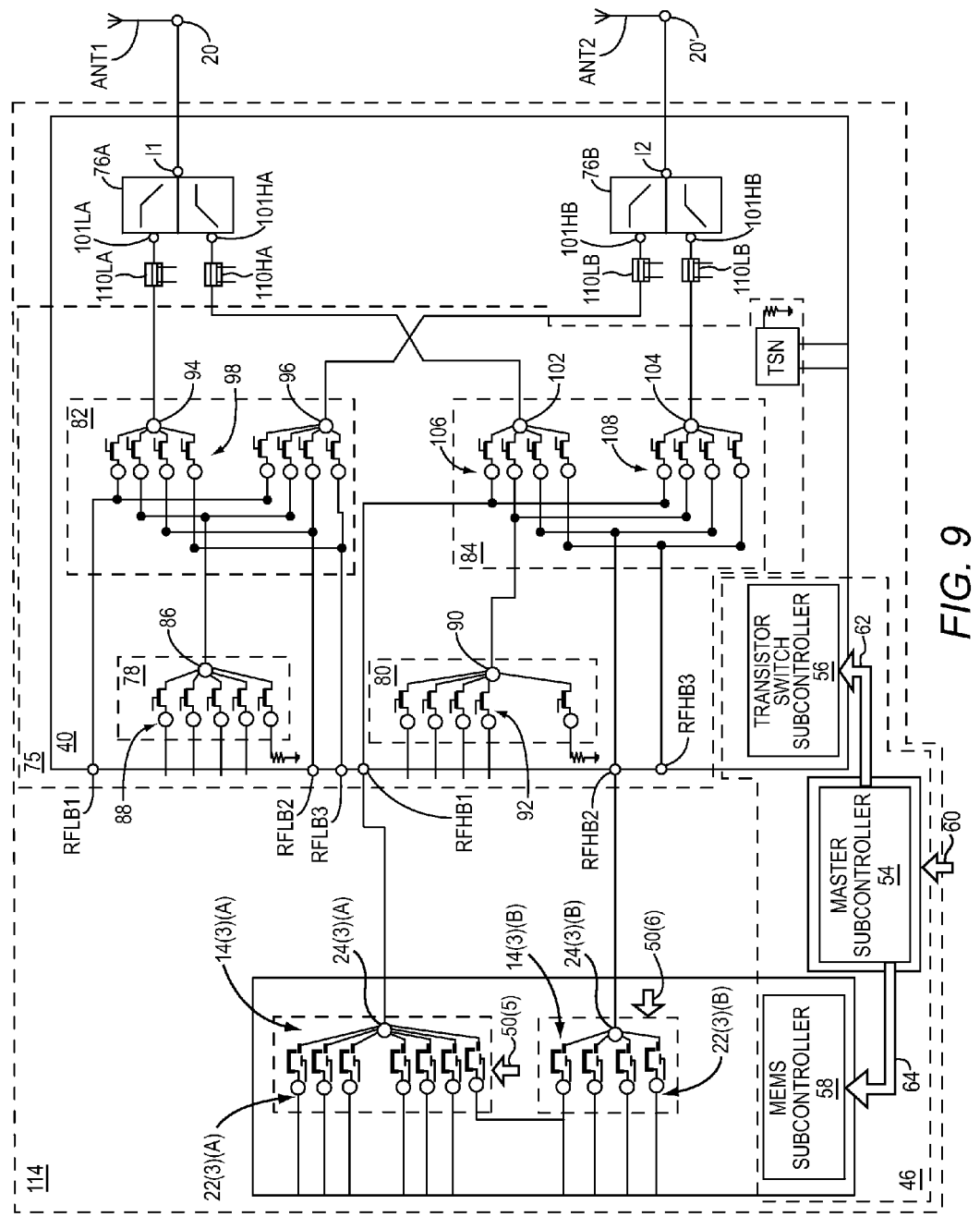

FIG. 9 illustrates exemplary RF front-end circuitry, wherein the RF front-end circuitry includes still another embodiment of the antenna switching circuitry that includes the front-end switching circuitry shown in FIG. 7, the first MTMEMS shown in FIG. 5, and the second MTMEMS shown in FIG. 5.

Figure 9A:
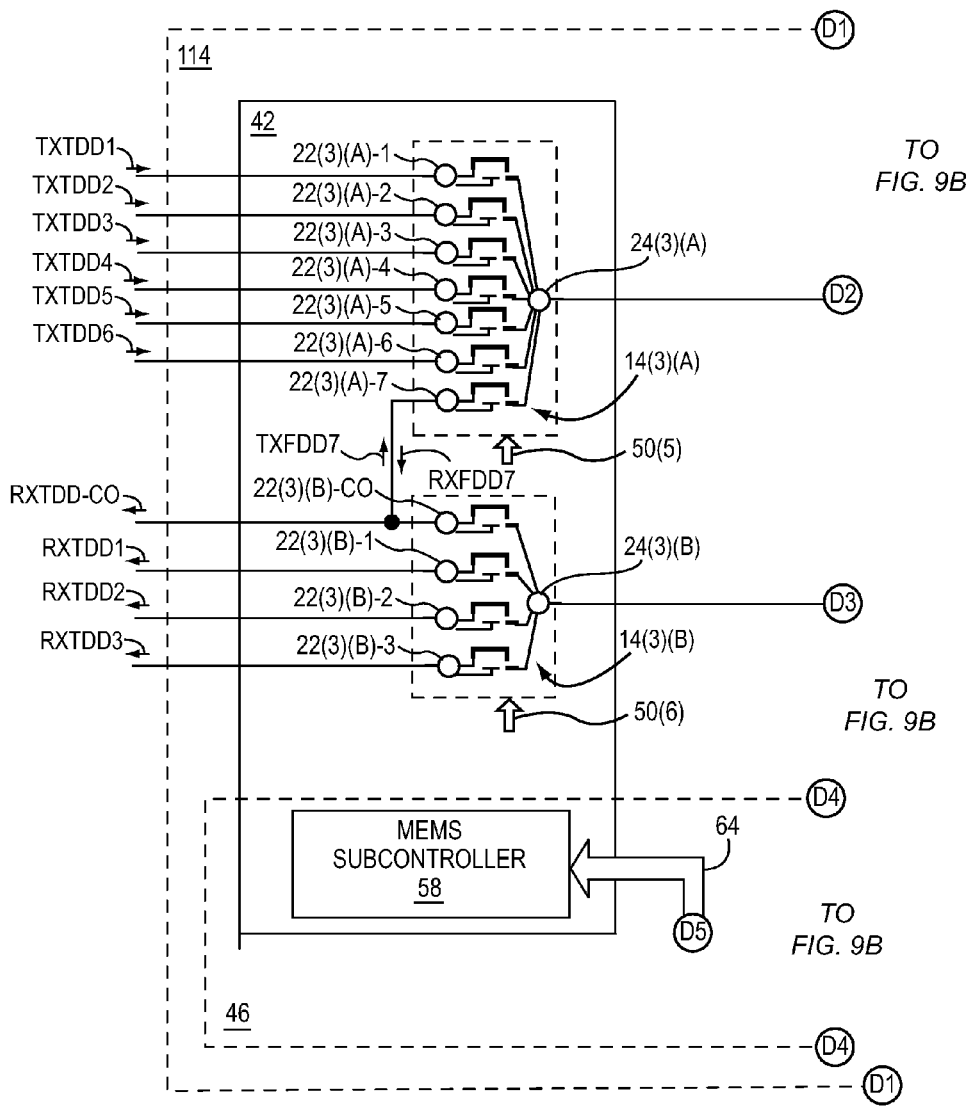

FIG. 9A is a more detailed illustration of the first MTMEMS shown in FIG. 9 and the second MTMEMS shown in FIG. 9.

Figure 9B:
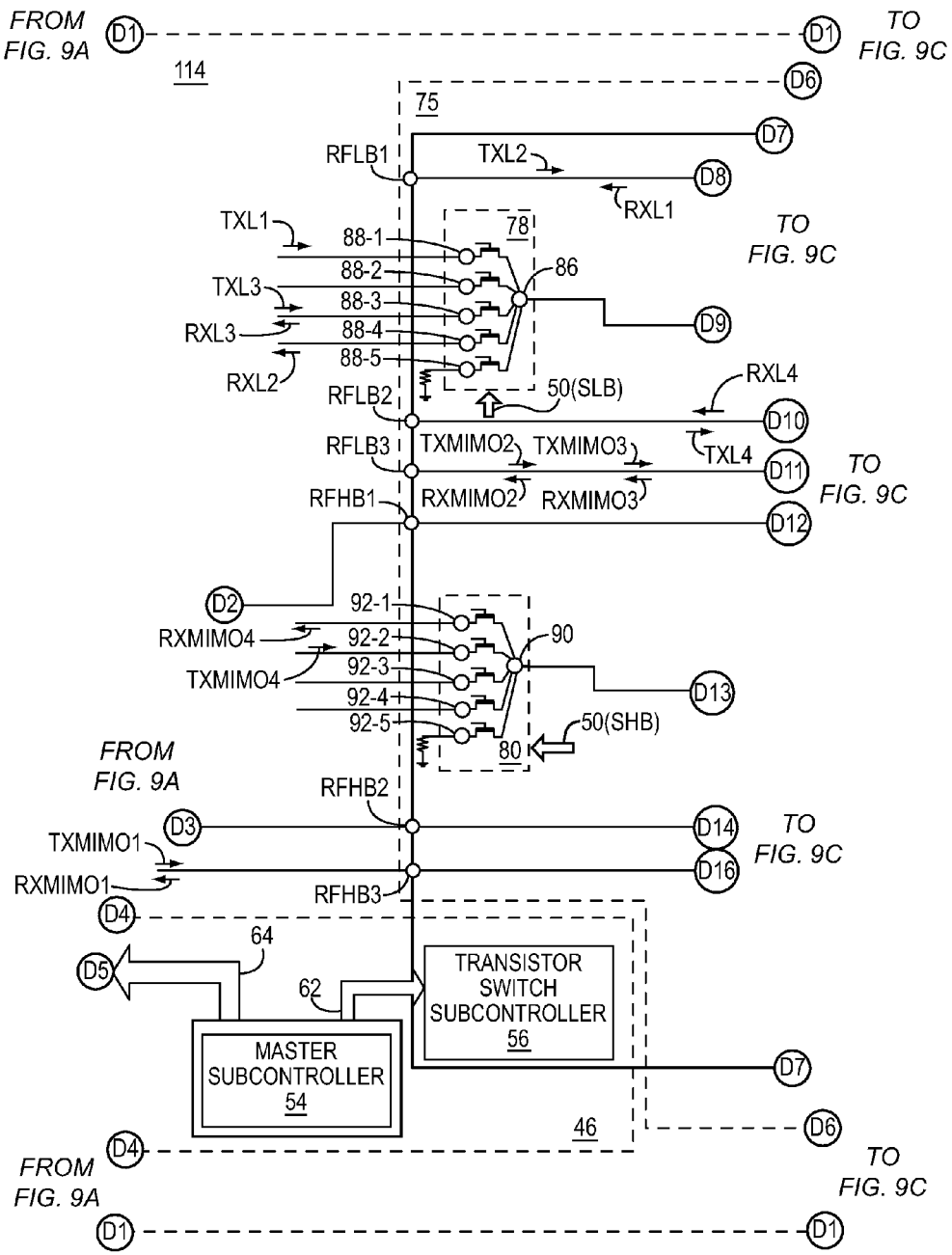

FIG. 9B is a more detailed illustration of the low band switching circuitry and the high band switching circuitry in the front-end switching circuitry of FIG. 9.

Figure 9C:
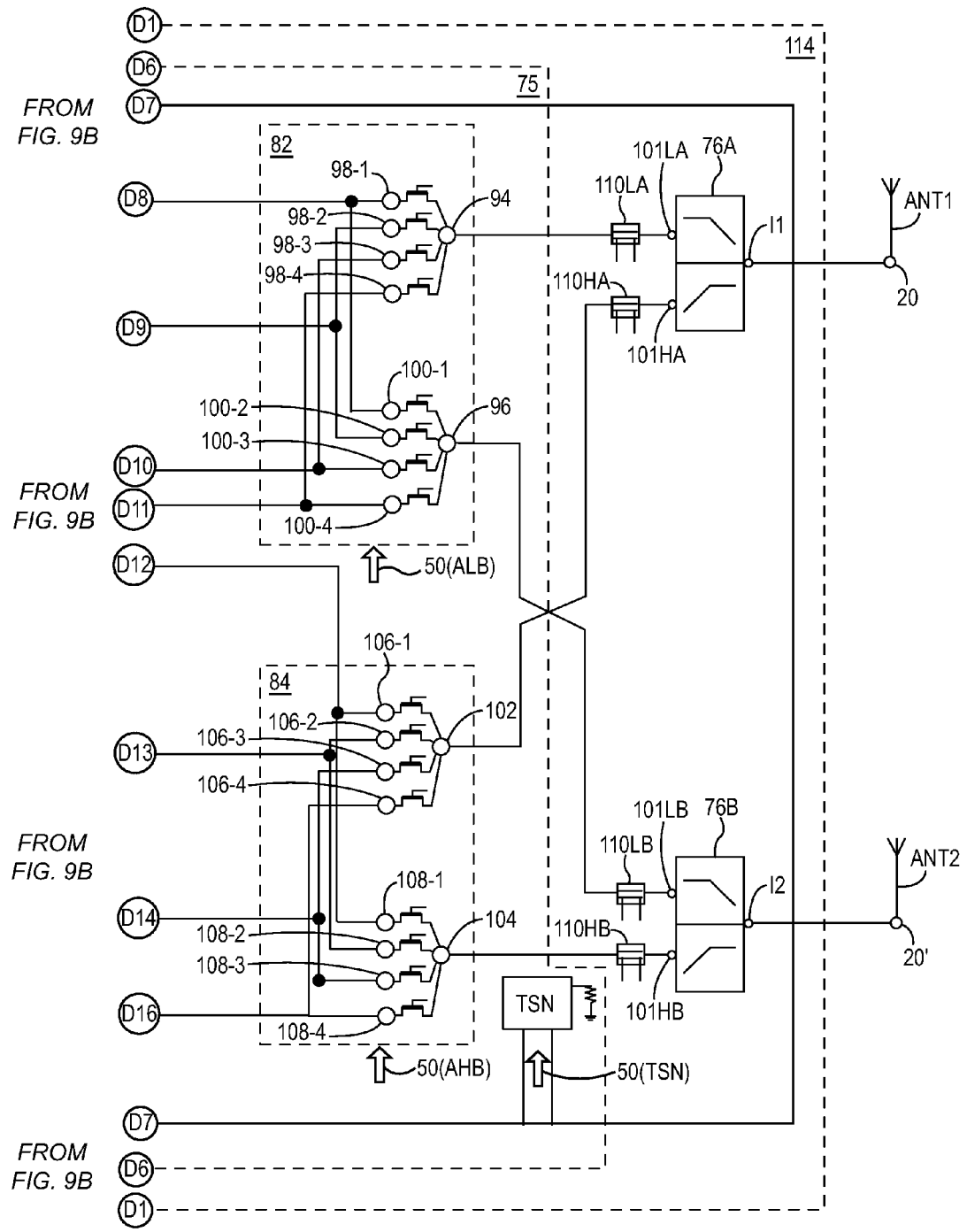

FIG. 9C is a more detailed illustration of the low band antenna selection circuitry in the front-end switching circuitry of FIG. 9 and the high band antenna selection circuitry in the front-end switching circuitry of FIG. 9, along with the directional couplers and the diplexers provided in the antenna switching circuitry of FIG. 9 between the front-end switching circuitry and the first and second antenna ports.

Figure 10:
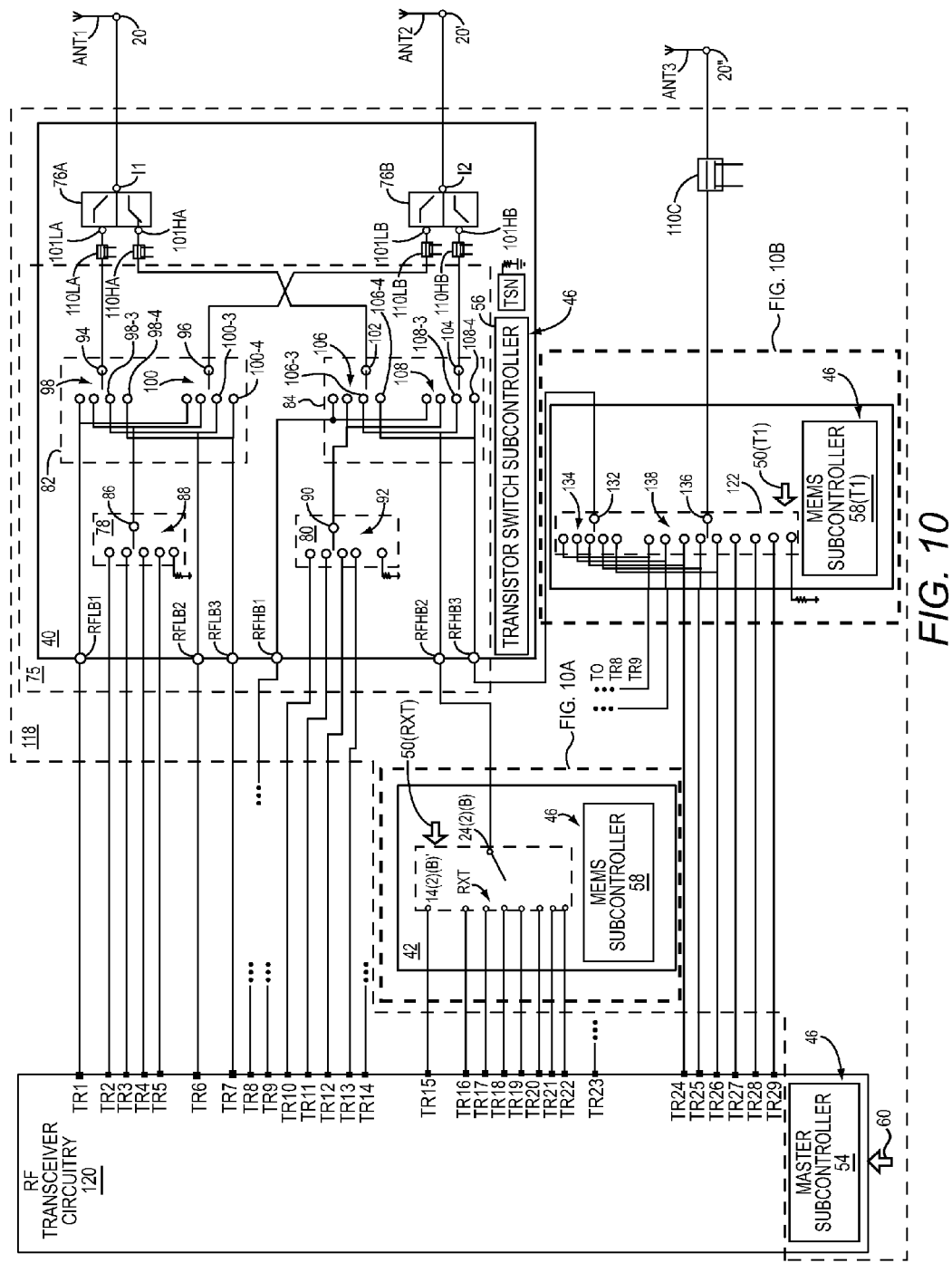

FIG. 10 illustrates exemplary RF front-end circuitry, wherein the RF front-end circuitry includes another embodiment of the antenna switching circuitry and the RF transceiver circuitry, wherein the antenna switching circuitry is for a Worldphone or World tablet that allows for operation with three antennas, and wherein the antenna switching circuitry includes the front-end switching circuitry shown in FIGS. 7, 7B, 7C, 8, 8B, 8C, 9, 9B, and 9C, another embodiment of an MTMEMS that includes throw ports coupled to receive secondary receive MIMO signals, and a double pole MTMEMS (DPMTMEMS) that is operably associated with the front-end switching circuitry and a third antenna port.

Figure 10A:
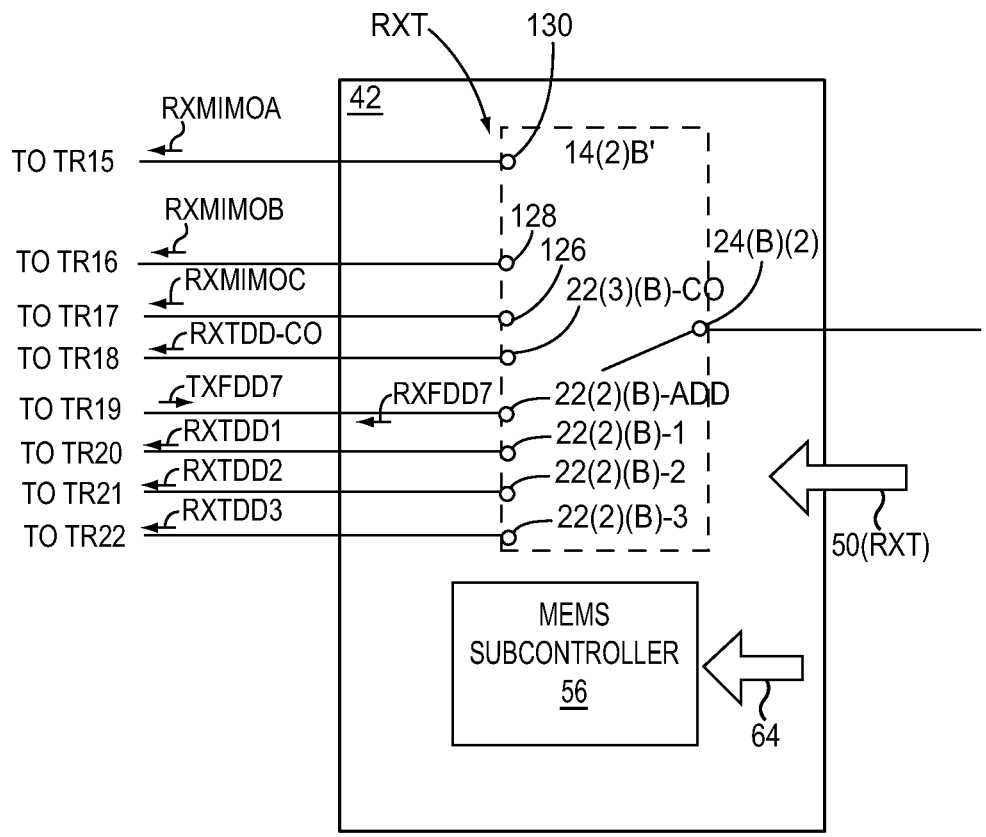

FIG. 10A is a more detailed illustration of the MTMEMS shown in FIG. 10 that includes throw ports coupled to receive secondary receive MIMO signals.

Figure 10B:
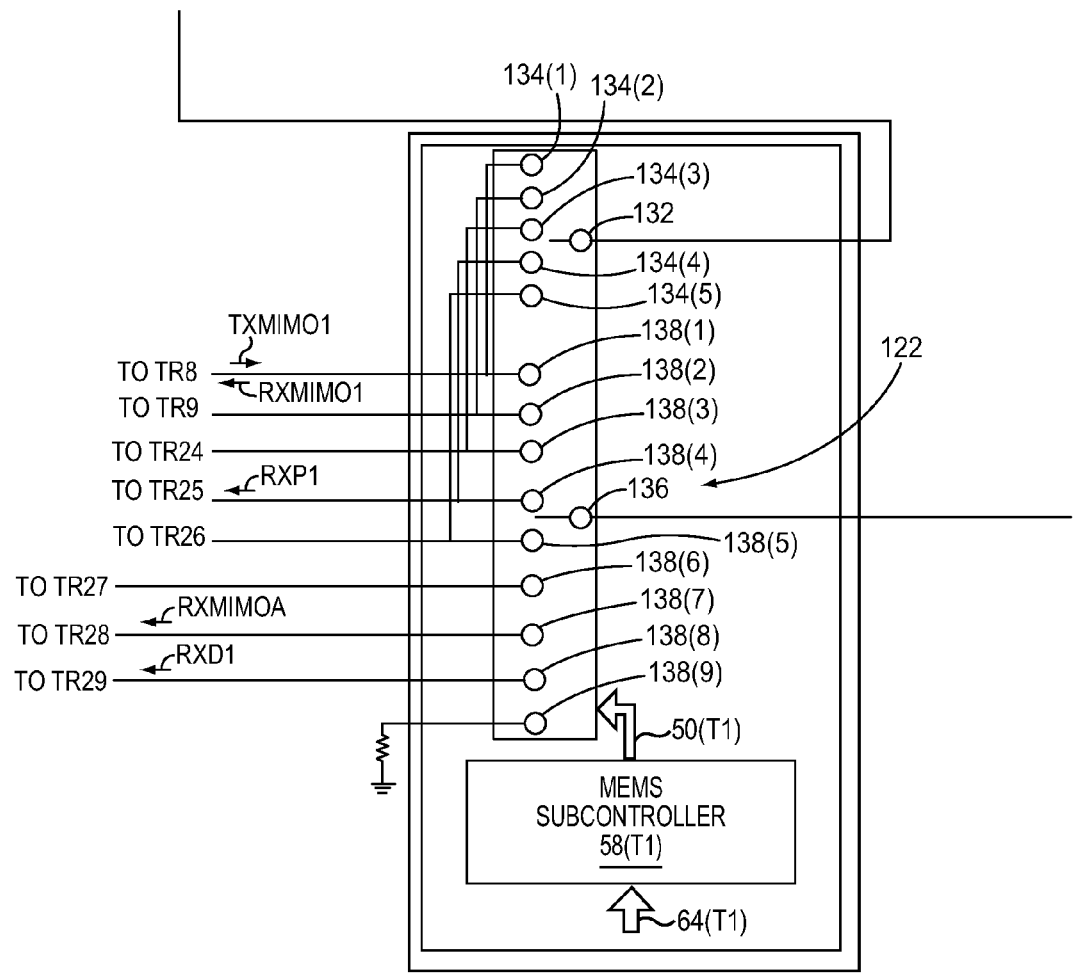

FIG. 10B is a more detailed illustration of the DPMTMEMS shown in FIG. 10.

Figure 11:
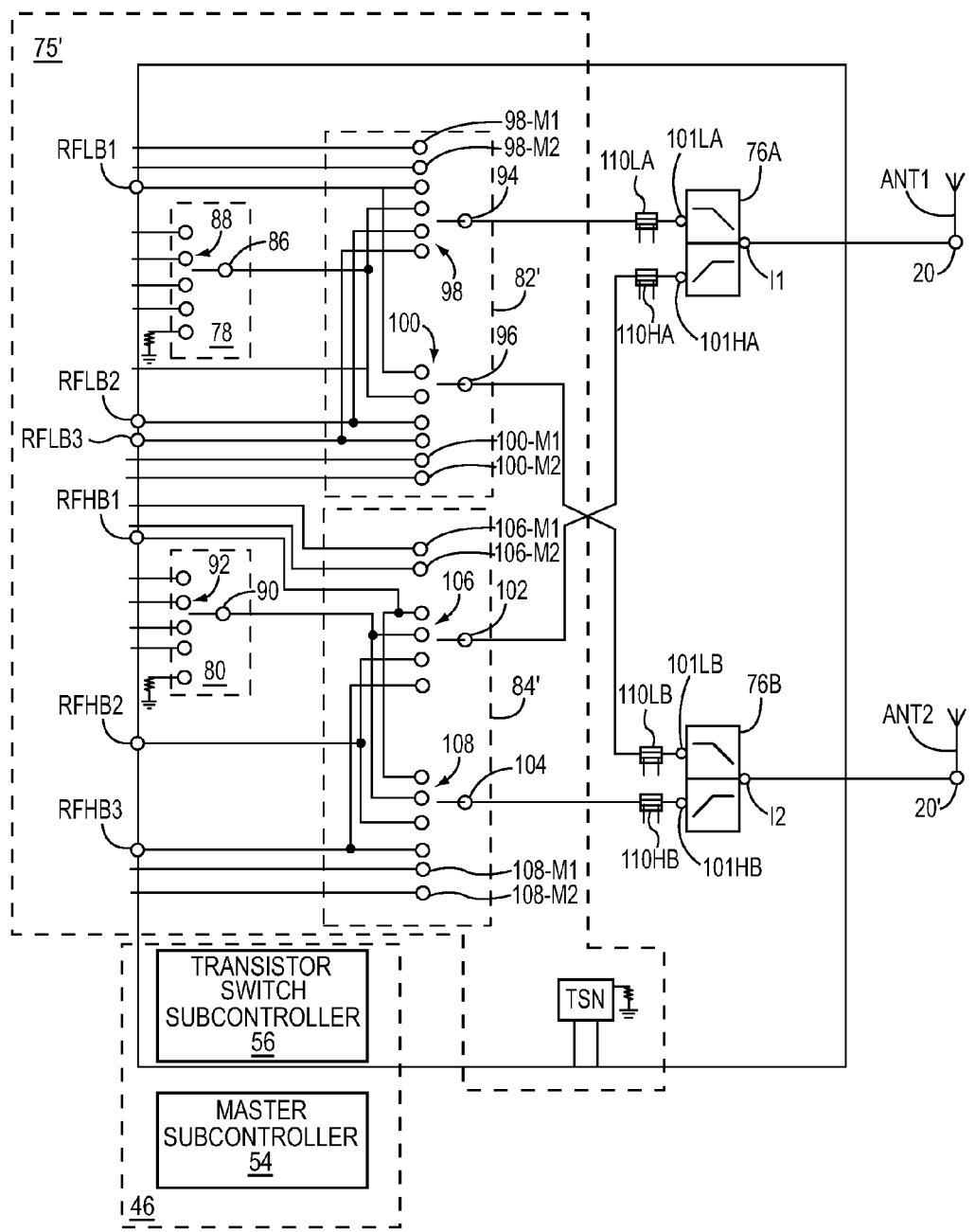

FIG. 11 illustrates exemplary RF front-end circuitry, wherein the RF front-end circuitry includes another embodiment of the front-end switching circuitry that is similar to the front-end switching circuitry shown in FIGS. 7, 7B, 7C, 8, 8B, 8C, 9, 9B, and 9C, except that the low band antenna selection circuitry of the front-end switching circuitry in FIG. 11 is a double pole MTSTS (DPMTSTS) that includes additional independent throw ports, and the high band antenna selection circuitry of the front-end switching circuitry in FIG. 11 is a DPMTMSTS that also includes additional independent throw ports.

Figure 11A:
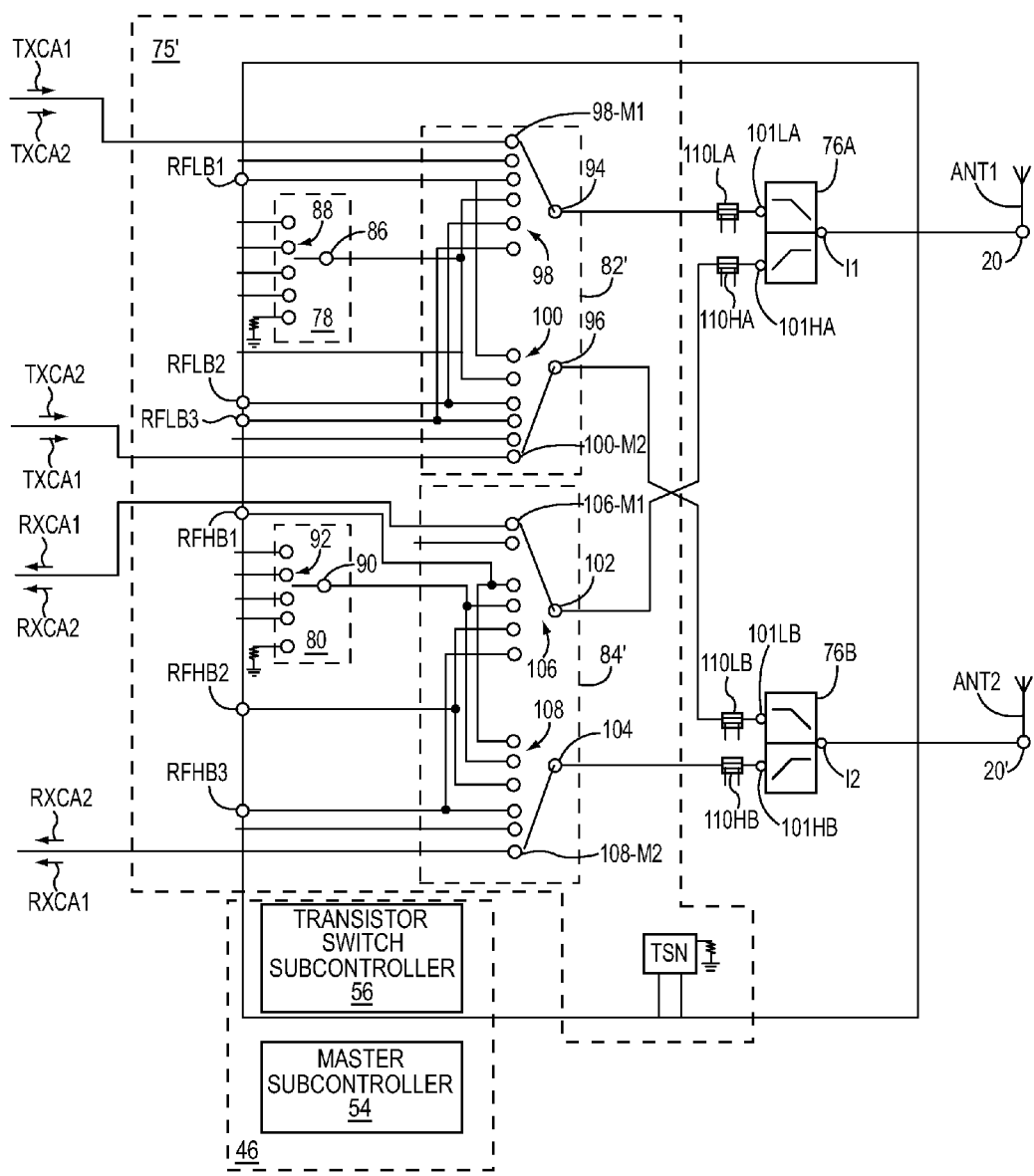

FIG. 11A is an illustration of the front-end switching circuitry shown in FIG. 11 operating in a low band/low band transmit/high band/high band receive (LLT/HHR) carrier aggregation mode.

Figure 11B:
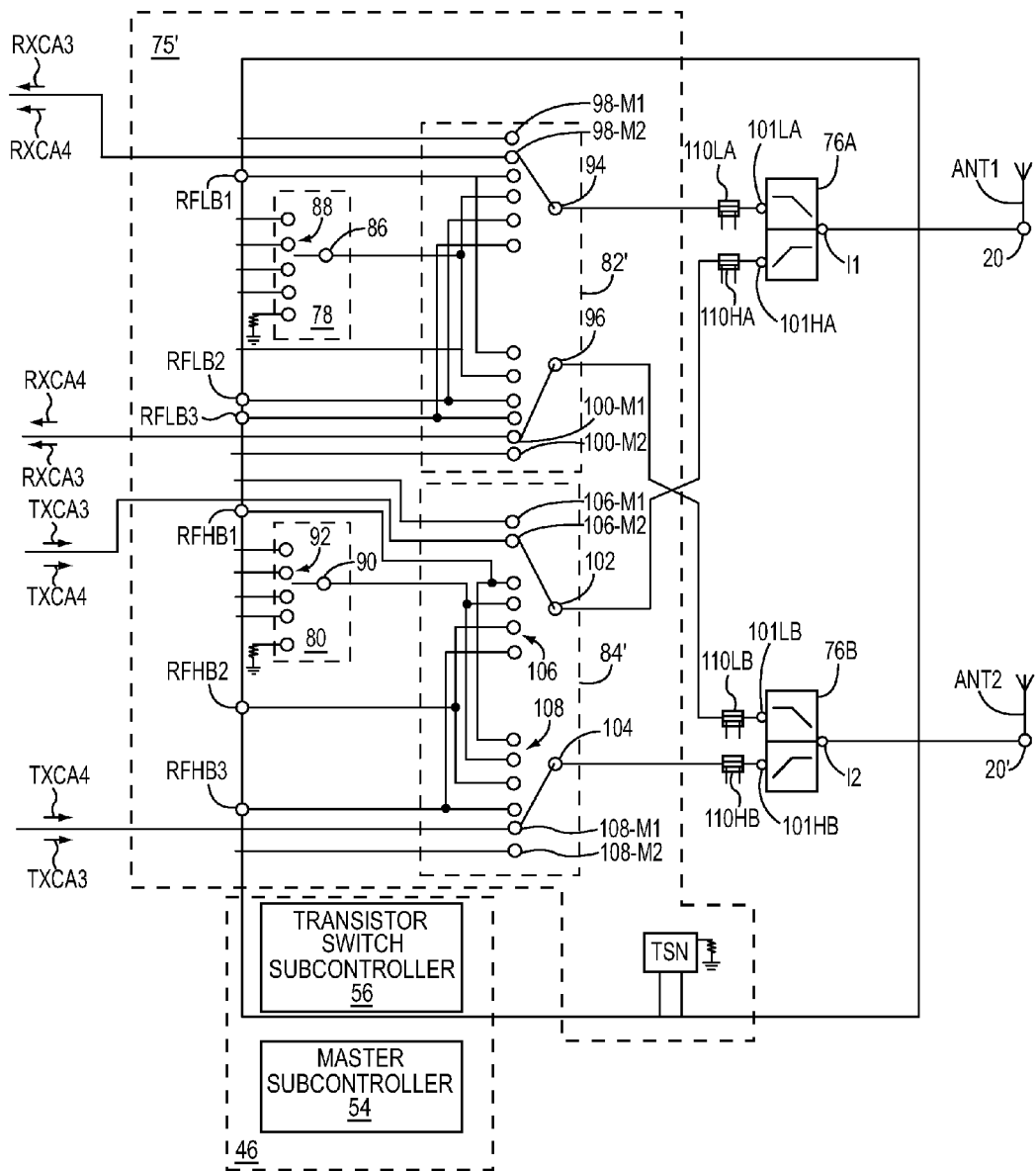

FIG. 11B is an illustration of the front-end switching circuitry shown in FIG. 11 operating in a high band/high band transmit/low band/low band receive (HHT/LLR) carrier aggregation mode.

Figure 11C:
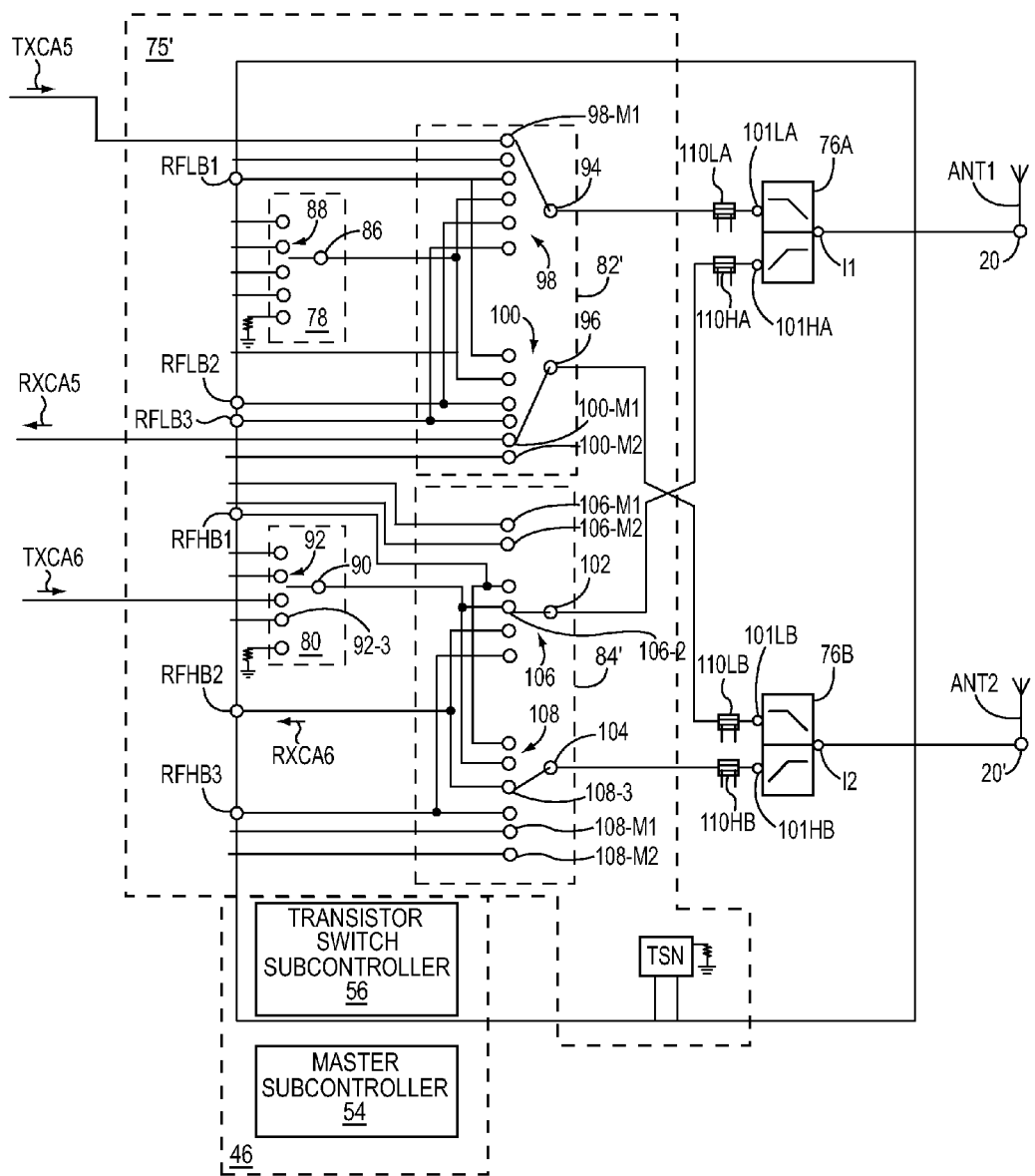

FIG. 11C is an illustration of the front-end switching circuitry shown in FIG. 11 operating in a low band/high band transmit/low band/high band receive (LHT/LHR) carrier aggregation mode.

Figure 11D:
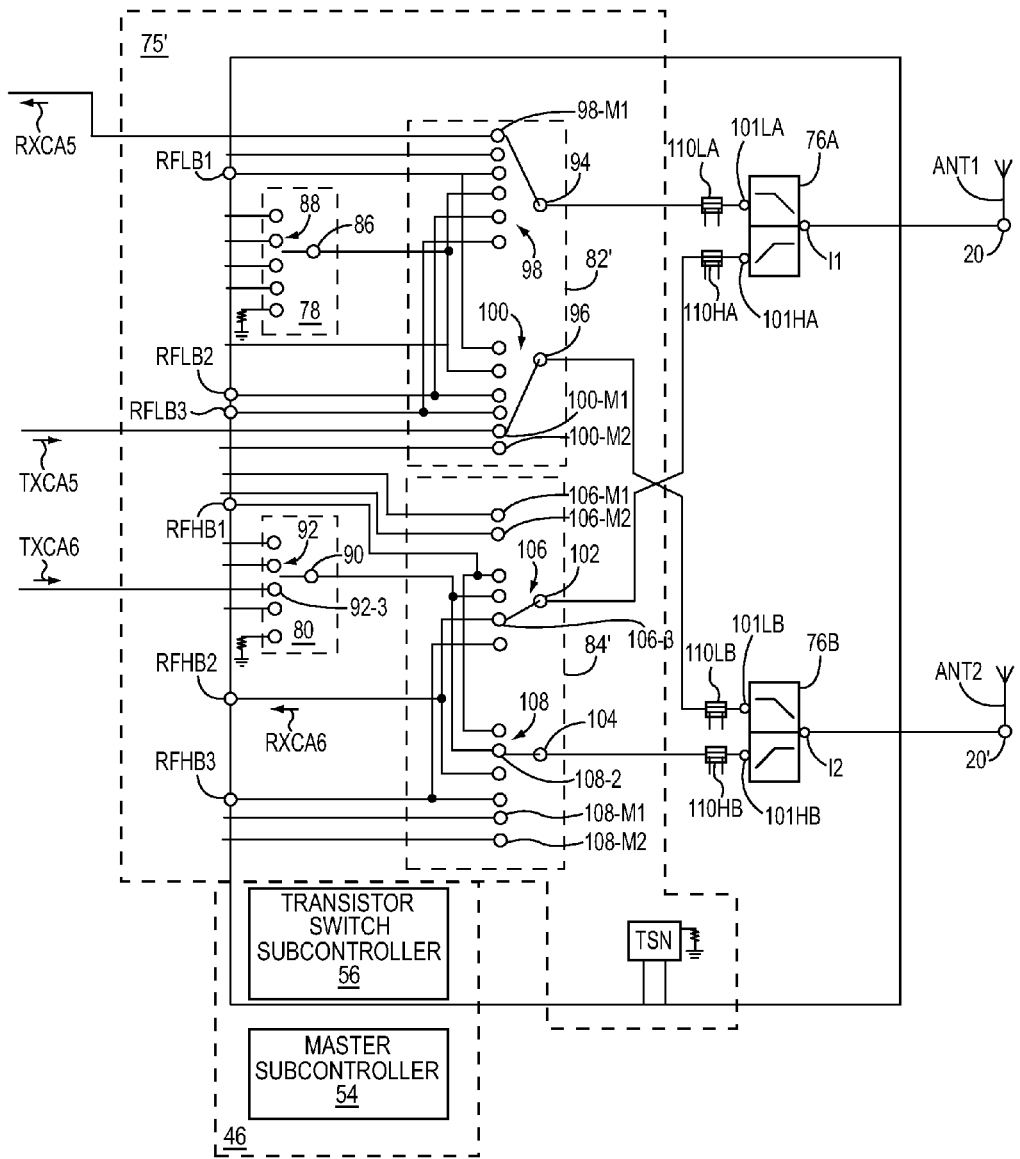

FIG. 11D is an illustration of the front-end switching circuitry shown in FIG. 11 operating in the LHT/LHR carrier aggregation mode after having swapped antennas.

Figure 12:
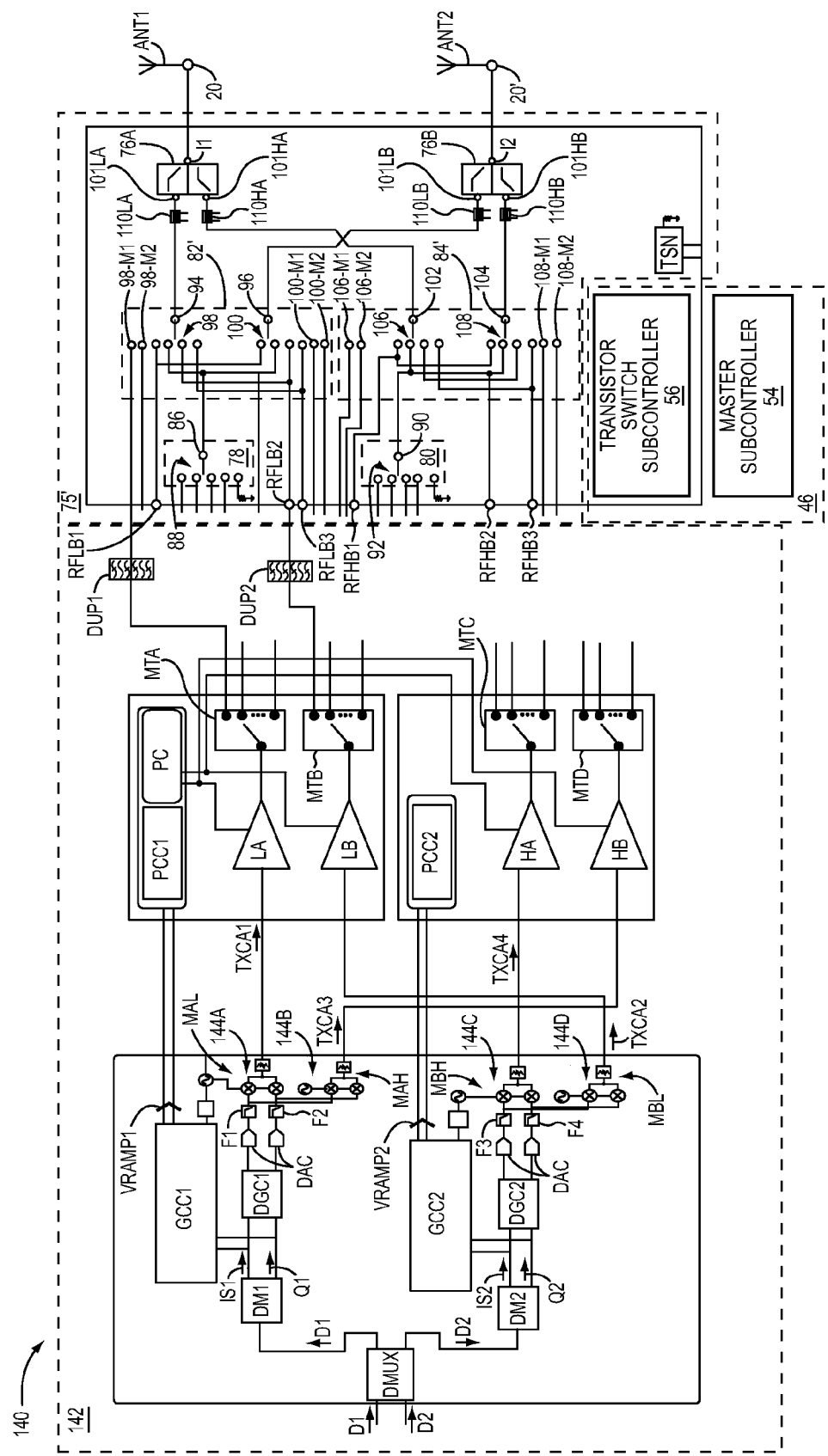

FIG. 12 illustrates exemplary RF front-end circuitry in one embodiment of an RF front-end module that includes the front-end switching circuitry shown in FIG. 11 and exemplary transmit chains operably associated with the front-end switching circuitry.

Figure 13:
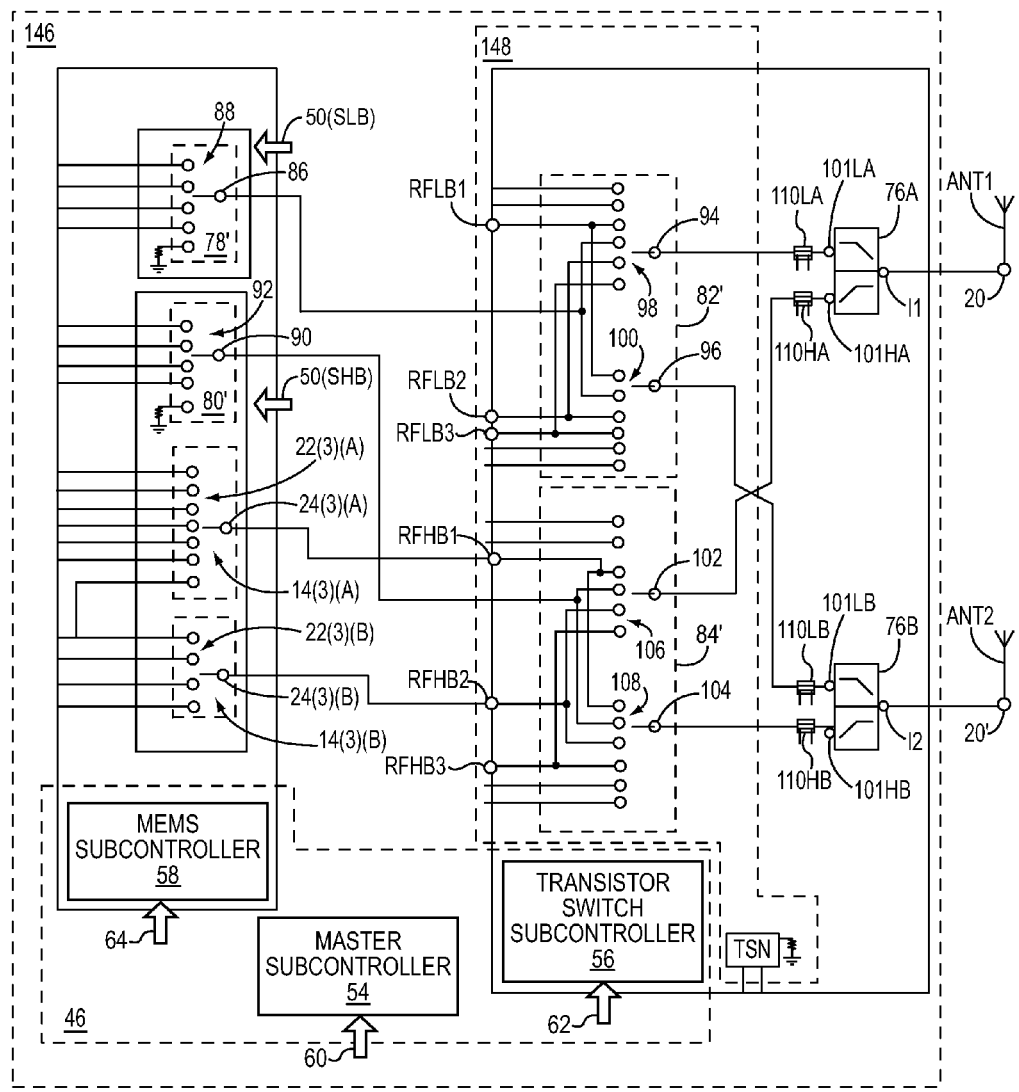

FIG. 13 illustrates exemplary RF front-end circuitry, wherein the RF front-end circuitry includes yet another embodiment of the antenna switching circuitry with another embodiment of the front-end switching circuitry, the first MTMEMS shown in FIG. 5, and the second MTMEMS shown in FIG. 5, and wherein the front-end switching circuitry includes the low band antenna selection circuitry and the high band antenna selection circuitry from FIG. 11, but the low band switching circuitry is provided as another MTMEMS and the high band switching circuitry is provided as yet another MTMEMS.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

This disclosure relates generally to RF front-end circuitry for routing radio frequency (RF) signals to and/or from one or more antennas (such as antenna switching circuitry), and methods of operating the same. For instance, different embodiments of the antenna switching circuitry are disclosed that have RF switching topologies, along with methods of operating these RF switching topologies. The antenna switching circuitry may be provided as RF front-end circuitry within an RF front-end module between one or more antenna ports and RF transceiver circuitry. The antenna switching circuitry disclosed herein allows one or more antenna ports to be selectively coupled to any one of a plurality of RF transceiver ports in the RF transceiver circuitry. The RF transceiver ports may be coupled to different receiver chains and/or transmit chains in the RF transceiver circuitry. In one embodiment, the antenna switching circuitry includes front-end switching circuitry configured to selectively couple the RF transceiver ports to at least one antenna port.

The front-end switching circuitry may include a multiple throw solid-state transistor switch (MTSTS). The MTSTS has a first set of throw ports and a first pole port. The first pole port may be an antenna port, or may be coupled to an antenna port. Furthermore, one or more of the first set of throw ports may be an RF port or ports, such as the RF transceiver port(s); may be coupled to other switching circuitry that selectively couples the throw port(s) to one or more RF ports (such as the RF transceiver ports); and/or may simply be coupled to the RF port(s) (such as the RF transceiver port(s)).

The RF front-end circuitry may also include a multiple throw microelectromechanical switch (MTMEMS) having a second set of throw ports and a second pole port. One or more of the second set of throw ports may be RF transceiver port(s), may be coupled to other switching circuitry that selectively couples the throw port(s) to the RF transceiver port(s), and/or may simply be coupled to the RF transceiver port(s).

The MTMEMS may provide a high level of isolation when the RF transceiver ports associated with the second set of throw ports are not being used with respect to an antenna coupled to the antenna port. More specifically, the second pole port of the MTMEMS is coupled to a first throw port in the first set of throw ports of the MTSTS. Accordingly, the first pole port of the MTSTS (and thus the associated antenna port) is selectively coupled to the second pole port of the MTMEMS when the first pole port of the MTSTS has been selectively coupled to the first throw port of the MTSTS. The first pole port of the MTSTS (and thus the antenna port associated with the first pole port) is decoupled from the second pole port of the MTMEMS when the first pole port of the MTSTS has not been selectively coupled to the first throw port of the MTSTS. Since the MTSTS may not provide a desired level of isolation, the MTMEMS is provided between the MTSTS and the RF transceiver ports associated with the second set of throw ports of the MTMEMS. The MTMEMS may mechanically disconnect the second set of throw ports and the second pole port.

To prevent hot switching, the MTSTS may be controlled to decouple the MTSTS from the second pole port of the MTMEMS, prior to the MTMEMS decoupling the second pole port from the selectively coupled throw port associated with the RF transceiver port. The MTSTS can thus be provided to prevent, or at least reduce, hot switching in the MTMEMS, and thus increase the life of the MTMEMS. As such, the switching topology may provide the benefit of increased isolation while preventing or reducing hot switching in the MTMEMS.

As explained in further detail below, this arrangement may be utilized to provide RF front-end circuitry (such as antenna switching circuitry) in RF front-end applications with various transceiver chains (i.e., receiver chains and/or transmit chains) that process RF signals within different communication bands, with different duplexing techniques, with different RF communication standards, and/or in accordance with different RF communication specifications for these RF communication standards. For example, the arrangement may be utilized in antenna switching circuitry in RF front-end modules and operate in accordance with Long Term Evolution (LTE)—Time Division Duplex (TDD) techniques; LTE-Frequency Division Duplex (FDD) techniques; or one or more different types of carrier aggregation techniques, such as LTE diversity techniques and/or LTE Multiple-Input and Multiple-Output (MIMO) techniques; and/or may provide antenna switching functionality for a front-end transceiver module of a Worldphone or World tablet.

Figure 1:
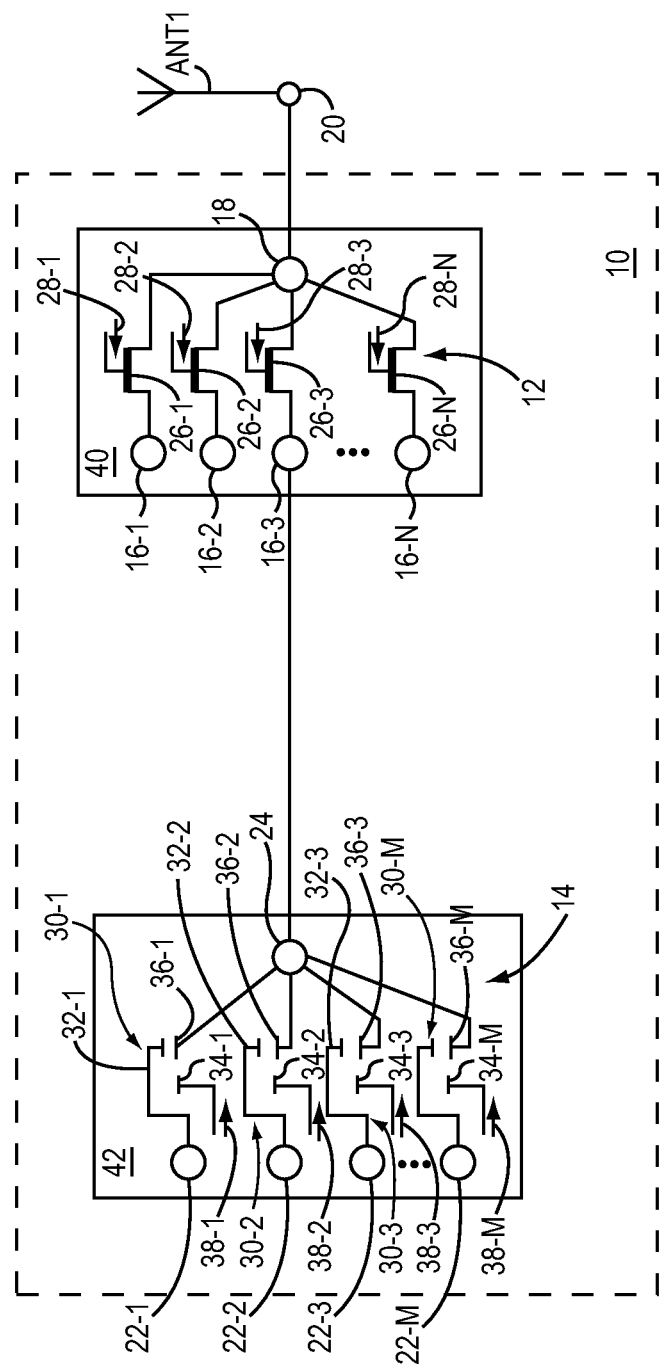
FIG. 1 illustrates exemplary RF front-end circuitry, wherein the RF front-end circuitry includes one embodiment of antenna switching circuitry having a multiple throw solid-state transistor switch (MTSTS) coupled to an antenna port (and an antenna) and a multiple throw microelectromechanical switch (MTMEMS) operably associated with the MTSTS.

FIG. 1 illustrates an exemplary embodiment of antenna switching circuitry 10. The antenna switching circuitry 10 is RF front-end circuitry that may be provided within an RF front-end module. The antenna switching circuitry 10 includes an MTSTS 12 and an MTMEMS 14. The MTSTS 12 has a first set of throw ports (referred to generically as elements 16, and specifically as elements 16-1, 16-2, 16-3, and 16-N) and a pole port 18. The MTSTS 12 is configured to selectively couple the pole port 18 to any of the first set of throw ports 16. In this embodiment, the pole port 18 is coupled to an antenna port 20, which is connected to an antenna ANT1. Thus, by selectively coupling the pole port 18 to one of the first set of throw ports 16, the antenna port 20 (and thus the antenna ANT1) is selectively coupled to the throw port 16 that was selected. In alternative embodiments, the pole port 18 may be the antenna port 20. Furthermore, the throw port 16, the pole port 18, and the antenna port 20 may be nodes, terminals, contacts, and/or the like.

The MTMEMS 14 has a second set of throw ports (referred to generically as elements 22, and specifically as elements 22-1, 22-2, 22-3, and 22-M) and a pole port 24. The pole port 24 is coupled to the throw port 16-3 in the first set of throw ports 16 of the MTSTS 12. Accordingly, when the pole port 18 is selectively coupled to the throw port 16-3 of the MTSTS 12, the pole port 18 is coupled to the pole port 24 of the MTMEMS 14. Thus, the antenna port 20 and the antenna ANT1 are also coupled to the pole port 24 of the MTMEMS 14 when the pole port 18 is selectively coupled to the throw port 16-3.

The MTMEMS 14 is configured to selectively couple the pole port 24 to any of the second set of throw ports 22. The second set of throw ports 22 may be coupled to RF transceiver ports, or they may be the RF transceiver ports themselves. When the pole port 24 is selectively coupled to one of the throw ports 22 in the second set of throw ports 22 of the MTMEMS 14, and when the pole port 18 is selectively coupled to the throw port 16-3 of the MTSTS 12, the pole port 18, and thus the antenna port 20, is selectively coupled to the selected one of the second set of throw ports 22 of the MTMEMS 14. For example, when the pole port 18 is selectively coupled to the throw port 16-3 and the pole port 24 is selectively coupled to the throw port 22-1, the pole port 18, and thus the antenna port 20, is selectively coupled to the throw port 22-1 in the MTMEMS 14. As another example, when the pole port 18 is selectively coupled to the throw port 16-3 and the pole port 24 is selectively coupled to the throw port 22-2, the pole port 18, and thus the antenna port 20, is selectively coupled to the throw port 22-2 in the MTMEMS 14. When the pole port 18 is selectively coupled to the throw port 16-3 and the pole port 24 is selectively coupled to the throw port 22-3, the pole port 18, and thus the antenna port 20, is selectively coupled to the throw port 22-3 in the MTMEMS 14. Finally, when the pole port 18 is selectively coupled to the throw port 16-3 and the pole port 24 is selectively coupled to the throw port 22-M, the pole port 18, and thus the antenna port 20, is selectively coupled to the throw port 22-M in the MTMEMS 14. Thus, when the pole port 18 is selectively coupled to the throw port 16-3, and when the pole port 24 is selectively coupled to the throw port 22-1, or the throw port 22-2, or the throw port 22-3, or the throw port 22-M, the antenna ANT1 may transmit an RF signal from and/or provide an RF signal to the selected one of the throw ports 22.

In this embodiment, the MTSTS 12 includes a set of transistors (referred to generically as elements 26, and specifically as elements 26-1, 26-2, 26-3, and 26-N). Each of the transistors 26 provides a path between the pole port 18 (and thus the antenna port 20 and the antenna ANT1) and one of the throw ports 16 in the first set of throw ports 16. The first transistor 26-1 provides a path between the pole port 18 and the throw port 16-1. The second transistor 26-2 provides a path between the pole port 18 and the throw port 16-2. The third transistor 26-3 provides a path between the pole port 18 and the throw port 16-3. The fourth transistor 26-N provides a path between the pole port 18 and the throw port 16-N. To selectively couple the pole port 18 and one of the throw ports 16, the path provided by the transistor 26 that corresponds to the throw port 16 is closed. Accordingly, the transistor 26 is turned on in order to close the path between the throw port 16 and the pole port 18. Thus, by turning the transistor 26 corresponding to the throw port 16 on, the pole port 18 is selectively coupled to the throw port 16.

Each of the transistors 26 may be any type of transistor suitable to comply with the performance parameters of a given RF application. In this embodiment, each of the transistors 26 is a field effect transistor (FET). As shown in FIG. 1, switch control signals (referred to generically as elements 28, and specifically as elements 28-1, 28-2, 28-3, and 28-N) are received by a gate of each of the transistors 26. When the switch control signal 28 is in an activation state, the transistor 26 that receives the switch control signal 28 is turned on. Thus, the transistor 26-1 is turned on when the switch control signal 28-1 is received in the activation state. In this case, the path provided by the transistor 26-1 from the pole port 18 to the throw port 16-1 is closed and the pole port 18 is selectively coupled to the throw port 16-1. The transistor 26-2 is turned on when the switch control signal 28-2 is received in the activation state. In this case, the path provided by the transistor 26-2 from the pole port 18 to the throw port 16-2 is closed and the pole port 18 is selectively coupled to the throw port 16-2. The transistor 26-3 is turned on when the switch control signal 28-3 is received in the activation state. In this case, the path provided by the transistor 26-3 from the pole port 18 to the throw port 16-3 is closed and the pole port 18 is selectively coupled to the throw port 16-3. The transistor 26-N is turned on when the switch control signal 28-N is received in the activation state. In this case, the path provided by the transistor 26-N from the pole port 18 to the throw port 16-N is closed and the pole port 18 is selectively coupled to the throw port 16-N.

Each of the throw ports 16 may also be decoupled from the pole port 18. To decouple each of the throw ports 16 from the pole port 18, the path between the pole port 18 and the throw port 16 is opened. Thus, to open the path between the pole port 18 and the throw port 16-1, the switch control signal 28-1 is received in a deactivation state and the transistor 26-1 is turned off. To open the path between the pole port 18 and the throw port 16-2, the switch control signal 28-2 is received in the deactivation state and the transistor 26-2 is turned off. To open the path between the pole port 18 and the throw port 16-3, the switch control signal 28-3 is received in the deactivation state and the transistor 26-3 is turned off. To open the path between the pole port 18 and the throw port 16-N, the switch control signal 28-N is received in the deactivation state and the transistor 26-N is turned off.

The pole port 24 of the MTMEMS 14 is thus coupled to the pole port 18, the antenna port 20, and the antenna ANT1 when the path between the pole port 18 and the throw port 16-3 is closed by turning on the transistor 26-3. As mentioned above, to turn on the transistor 26-3, the switch control signal 28-3 is provided in the activation state. In this case, the paths between the other throw ports 16-1, 16-2, and 16-N may be opened by turning off the transistors 26-1, 26-2, and 26-N. In this case, the switch control signals 28-1, 28-2, and 28-N are each provided in the deactivation state. Similarly, when one of the paths between the throw ports 16-1, 16-2, 16-N and the pole port 18 is closed, the paths between the other throw ports (16-2, 16-3, 16-N), (16-1, 16-3, 16-N), (16-1, 16-2, 16-3) and the pole port 18 are each open.

With regard to the MTMEMS 14, the MTMEMS 14 includes a plurality of microelectromechanical switches (MEMSs, referred to generically as elements 30, and specifically as elements 30-1, 30-2, 30-3, and 30-M) that provide paths between the pole port 24 and each of the throw ports 22 in the second set of throw ports 22.

Each MEMS 30 has an actuation member (referred to generically as elements 32, and specifically as 32-1, 32-2, 32-3, and 32-M) with an anchored end, an arm, and a contact end. The anchored end of each of the actuation members 32 may be attached to a contact and/or an anchor pad. Each of the MEMSs 30 also includes an actuator plate (referred to generically as elements 34, and specifically as elements 34-1, 34-2, 34-3, and 34-M) and a contact portion (referred to generically as elements 36, and specifically as elements 36-1, 36-2, 36-3, and 36-M). The arm of each of the actuation members 32 is suspended over the actuator plate 34, and the contact end of each of the actuation members 32 is suspended over the contact portion 36. To actuate each of the MEMSs 30, an electric potential is generated between the actuator plate 34 of the MEMS 30 and the arm of the actuation member 32. The electrical potential creates an attractive force, which pulls the arm, and thereby the contact end of the actuation member 32, towards the actuator plate 34. As a result, the actuation member 32 is moved so that the contact end of the actuation member 32 is placed in electrical contact with the contact portion 36. Switch control signals (referred to generically as elements 38, and specifically as elements 38-1, 38-8, 38-3, and 38-M) are received by each of the actuator plates 34 to control the actuation of the actuation members 32.

To selectively couple the pole port 24 to one of the second set of throw ports 22 of the MTMEMS 14, the path from the throw port 22 to the pole port 24 is closed. For instance, the path from the throw port 22-1 to the pole port 24 is closed when the actuation member 32-1 of the MEMS 30-1 has been actuated so that the contact end of the actuation member 32-1 makes electrical contact with the contact portion 36-1. To actuate the actuation member 32-1 so that the contact end of the actuation member 32-1 makes contact with the contact portion 36-1, the switch control signal 38-1 is received in an activation state.

The path from the throw port 22-2 to the pole port 24 is closed when the actuation member 32-2 of the MEMS 30-2 has been actuated so that the contact end of the actuation member 32-2 makes electrical contact with the contact portion 36-2. To actuate the actuation member 32-2 so that the contact end of the actuation member 32-2 makes contact with the contact portion 36-2, the switch control signal 38-2 is received in an activation state.

The path from the throw port 22-3 to the pole port 24 is closed when the actuation member 32-3 of the MEMS 30-3 has been actuated so that the contact end of the actuation member 32-3 makes electrical contact with the contact portion 36-3. To actuate the actuation member 32-3 so that the contact end of the actuation member 32-3 makes contact with the contact portion 36-3, the switch control signal 38-3 is received in an activation state.

The path from the throw port 22-M to the pole port 24 is closed when the actuation member 32-M of the MEMS 30-M has been actuated so that the contact end of the actuation member 32-M makes electrical contact with the contact portion 36-M. To actuate the actuation member 32-M so that the contact end of the actuation member 32-M makes contact with the contact portion 36-M, the switch control signal 38-M is received in an activation state.

For each throw port 22 in the MTMEMS 14, the path from the throw port 22 to the pole port 24 is open when the actuation member 32 of the MEMS 30 has the contact end suspended, and thus not making electrical contact with the contact portion 36. The throw port 22-1 is thus decoupled from the pole port 24 and the path from the throw port 22-1 to the pole port 24 is open when the contact end of the actuation member 32-1 is suspended over the contact portion 36-1. In this case, the switch control signal 38-1 is received in a deactivation state.

The throw port 22-2 is decoupled from the pole port 24 and the path from the throw port 22-2 to the pole port 24 is open when the contact end of the actuation member 32-2 is suspended over the contact portion 36-2. In this case, the switch control signal 38-2 is received in a deactivation state.

The throw port 22-3 is decoupled from the pole port 24 and the path from the throw port 22-3 to the pole port 24 is open when the contact end of the actuation member 32-3 is suspended over the contact portion 36-3. In this case, the switch control signal 38-3 is received in a deactivation state.

The throw port 22-M is decoupled from the pole port 24 and the path from the throw port 22-M to the pole port 24 is open when the contact end of the actuation member 32-M is suspended over the contact portion 36-M. In this case, the switch control signal 38-M is received in a deactivation state.

When the throw port 22-1, the throw port 22-2, the throw port 22-3, or the throw port 22-M is selectively coupled, the throw ports 22-2, 22-3, 22-M, the throw ports 22-1, 22-3, 22-M, the throw ports 22-1, 22-2, 22-M, and the throw ports 22-1, 22-2, 22-3 are decoupled, respectively. When any one of the MEMS 30-1, the MEMS 30-2, the MEMS 30-3, or the MEMS 30-M is closed, the MEMS 30-2, 30-3, 30-M, the MEMS 30-1, 30-3, 30-M, the MEMS 30-1, 30-2, 30-M, and the MEMS 30-1, 30-2, 30-3 are open, respectively. Accordingly, any one of the throw ports 22 of the MTMEMS 14 may be selectively coupled to the antenna ANT1 by turning on the transistor 26-3 simultaneously with any one of the MEMSs 30.

In FIG. 1, the MTSTS 12 is formed on a semiconductor substrate 40. The semiconductor substrate 40 has a semiconductor body formed from a wafer and/or doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. Furthermore, metallic layers may be formed on a top, within, and/or on a bottom of the substrate body to provide terminals, traces, coils, contact pads, connections, passive impedance elements, active components, and/or the like. Also, any type of suitable semiconductor technology may be provided in accordance with a topology of the semiconductor substrate 40. For example, the semiconductor technology may be Complementary Metal-On-Oxide Semiconductor (CMOS) technology, BiComplementary Metal-On-Oxide Semiconductor (BiCMOS) technology, Silicon-On-Insulator (SOI) technology, and/or the like. In this embodiment, a topology of the semiconductor substrate 40 is provided in accordance with SOI technology, and thus the semiconductor material of the semiconductor body is Si. An integer N identifies the number of throw ports 16 in the first set of throw ports 16 of the MTSTS 12. The integer N may be any integer greater than one (1). In alternative embodiments, the MTSTS 12 may include other sets of throw ports similar to the throw ports 16. Furthermore, the MTSTS 12 is shown with the throw port 16-3 coupled to the MTMEMS 14. As explained in further detail below, the other throw ports 16-1, 16-2, 16-N may be coupled to other upstream and/or downstream RF circuits. For example, the other throw ports 16-1, 16-2, 16-N may be coupled to other MTSTSs (like the MTSTS 12 shown in FIG. 1) other MTMEMSs (like the MTMEMS 14 shown in FIG. 1), RF transceiver ports, RF transceiver circuitry, duplexers, transmit chains, receiver chains, digital-to-analog converters, and/or the like. Also, the MTSTS 12 shown in FIG. 1 is a single pole (SP) MTSTS. However, the MTSTS 12 may include any number of pole ports. For instance, as explained in further detail below, multiple antenna ports and multiple antennas may be coupled to the pole ports so that they can be selectively coupled to the throw ports 22 of the MTMEMS 14 and/or another set of throw ports.

In FIG. 1, the MTMEMS 14 may be on the same semiconductor substrate 40 as the MTSTS 12 or on a different substrate. In this embodiment, the MTMEMS 14 is formed on a substrate 42. The substrate 42 may be a semiconductor substrate, a glass substrate, a polymer substrate, a metal substrate, a ceramic substrate, and/or the like. The substrate body may thus be formed of a suitable corresponding material or corresponding materials. Furthermore, metallic layers may be formed on a top, within, and/or on a bottom of the substrate body to provide terminals, traces, coils, connections, contact pads, passive impedance elements, active components, and/or the like. An integer M identifies the number of throw ports 22 in the second set of throw ports 22 of the MTMEMS 14. The integer M may be any integer greater than one (1). In alternative embodiments, the MTMEMS 14 may include other sets of throw ports similar to the throw ports 22.

The MTMEMS 14 is shown with the pole port 24 coupled to the MTSTS 12. The other throw ports 22 may be coupled to other upstream and/or downstream RF circuits. For example, the other throw ports 22 may be coupled to other MTSTSs (like the MTSTS 12 shown in FIG. 1), other MTMEMSs (like the MTMEMS 14 shown in FIG. 1), RF transceiver ports, RF transceiver circuitry, duplexers, transmit chains, receiver chains, digital-to-analog converters, and/or the like. Also, the MTMEMS 14 shown in FIG. 1 is an SPMTMEMS. However, the MTMEMS 14 may include any number of pole ports and other sets of throw ports.

Figure 2:
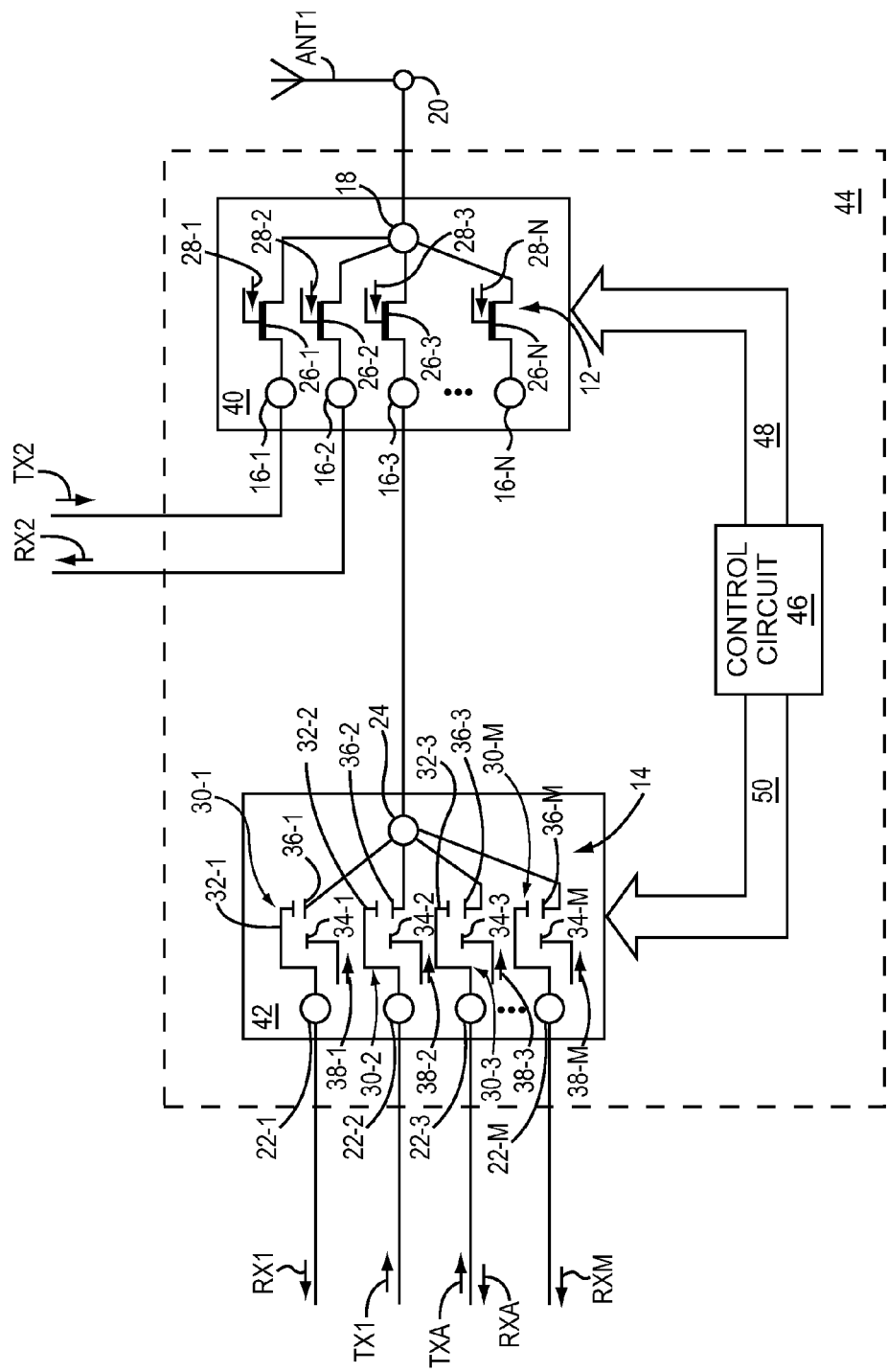
FIG. 2 illustrates exemplary RF front-end circuitry, wherein the RF front-end circuitry includes another embodiment of the antenna switching circuitry, which is the same as the antenna switching circuitry shown in FIG. 1, but further includes a control circuit.

FIG. 2 illustrates exemplary RF front-end circuitry that includes another embodiment of antenna switching circuitry 44. The antenna switching circuitry 44 in FIG. 2 is the same as the antenna switching circuitry 10 shown in FIG. 1, except that the antenna switching circuitry 44 further includes a control circuit 46. The control circuit 46 is operably associated with the MTSTS 12 and the MTMEMS 14. The control circuit 46 is operable to generate a switch control output 48 that controls the MTSTS 12.

More specifically, the switch control output 48 includes the switch control signals 28. By generating the switch control output 48 with the switch control signals 28, the control circuit 46 is configured to control the selective coupling of the pole port 18 to any one of the throw ports 16 in the first set of throw ports 16. In response to the control circuit 46 generating the switch control output 48, either the pole port 18 may be selectively coupled to one of the throw ports 16 or may be decoupled from all of the throw ports 16.

To couple the pole port 24 of the MTMEMS 14 to the pole port 18 and the antenna port 20, the control circuit 46 is configured to generate the switch control output 48 such that the pole port 18 is selectively coupled to the throw port 16-3. Accordingly, the control circuit 46 generates the switch control output 48 such that the transistor 26-3 is turned on and closes the path from the pole port 18 to the throw port 16-3. Furthermore, the switch control output 48 is generated such that the paths to the throw ports 16-1, 16-2, 16-N are open, and thus, the throw ports 16-1, 16-2, 16-N are decoupled from the pole port 18.

In this embodiment, the control circuit 46 generates the switch control output 48 such that the switch control signal 28-3 is in the activation state and each of the switch control signals 28-1, 28-2, 28-N is in the deactivation state. In addition, the control circuit 46 may generate the switch control output 48 so that the pole port 18 is decoupled from the throw port 16-3, and thus from the pole port 24 of the MTMEMS 14. In this case, the switch control output 48 is generated such that the switch control signal 28-3 is in the deactivation state. The control circuit 46 may generate the switch control output 48 so that any of the other throw ports 16-1, 16-2, 16-N are selectively coupled, or none of the other throw ports 16-1, 16-2, 16-N, is selectively coupled to the pole port 18.

As mentioned above, the MTSTS 12 is configured to selectively couple the pole port 18 to any of the throw ports 16. Accordingly, the control circuit 46 is configured to generate the switch control output 48 so that the switch control output 48 may be in different switch control output permutations. The MTSTS 12 is responsive to the switch control output 48 so as to selectively couple the pole port 18 to one of the throw ports 16 in accordance with the particular switch control output permutation of the switch control output 48. For example, the MTSTS 12 selectively couples the pole port 18 to the throw port 16-1 and decouples the pole port 18 from the other throw ports 16-2, 16-3, 16-N in response to the switch control output 48 having a switch control output permutation P16-1. Additionally, the MTSTS 12 selectively couples the pole port 18 to the throw port 16-2 and decouples the pole port 18 from the other throw ports 16-1, 16-3, 16-N in response to the switch control output 48 having a switch control output permutation P16-2. Also, the MTSTS 12 selectively couples the pole port 18 to the throw port 16-3 and decouples the pole port 18 from the other throw ports 16-1, 16-2, 16-N in response to the switch control output 48 having a switch control output permutation P16-3. Furthermore, the MTSTS 12 selectively couples the pole port 18 to the throw port 16-N and decouples the pole port 18 from the other throw ports 16-1, 16-2, 16-3 in response to the switch control output 48 having a switch control output permutation P16-N. Finally, the MTSTS 12 is configured to decouple all of the throw ports 16 from the pole port 18 in response to the switch control output 48 being generated by the control circuit 46 to have a switch control output permutation P16-CL.

Table I below indicates which paths from the throw ports 16 to the pole port 18 are closed or open as a result of the different switch control output permutations P16-1, P16-2, P16-3, P16-N, P16-CL, and also indicates the states of the switch control signals 28 for the different switch control output permutations P16-1, P-16-2, P16-3, P16-N, P16-CL.

TABLE I

| | Switch Control Output 48 | | | | | | | |
|---|---|---|---|---|---|---|---|---|
| | State of the Paths From Throw Ports 16 to Pole Port 18 Closed (C)/Open (O) | | | | Activation State (AS)/Deactivation State (DS) of Switch Control Signals 28 | | | |
| Permutation | 16-1 | 16-2 | 16-3 | 16-N | 28-1 | 28-2 | 28-3 | 28-N |
| P16-1 | C | O | O | O | AS | DS | DS | DS |
| P16-2 | O | C | O | O | DS | AS | DS | DS |
| P16-3 | O | O | C | O | DS | DS | AS | DS |
| P16-N | O | O | O | C | DS | DS | DS | AS |
| P16-CL | O | O | O | O | DS | DS | DS | DS |

The control circuit 46 is also configured to control the MTMEMS 14 so as to control the selective coupling of the pole port 24 in the MTMEMS 14 to the throw ports 22. To do this, the control circuit 46 is configured to generate a switch control output 50. As with the switch control output 48, the control circuit 46 is configured to generate the switch control output 50 in accordance with the throw port 22 to be selectively coupled to the pole port 24. As such, the control circuit 46 is configured to generate the switch control output 50 so that the switch control output 50 has different switch control output permutations in accordance with the throw port 22 to be selectively coupled to the pole port 24. The MTMEMS 14 selectively couples the pole port 24 to the throw port 22-1 and decouples the pole port 24 from the throw ports 22-2, 22-3, 22-M in response to the switch control output 50 having a switch control output permutation P22-1. The MTMEMS 14 selectively couples the pole port 24 to the throw port 22-2 and decouples the pole port 24 from the throw ports 22-1, 22-3, 22-M in response to the switch control output 50 having a switch control output permutation P22-2. The MTMEMS 14 selectively couples the pole port 24 to the throw port 22-3 and decouples the pole port 24 from the throw ports 22-1, 22-2, 22-M in response to the switch control output 50 having a switch control output permutation P22-3. The MTMEMS 14 selectively couples the pole port 24 to the throw port 22-M and decouples the pole port 24 from the throw ports 22-1, 22-2, 22-3 in response to the switch control output 50 having a switch control output permutation P22-M. The MTMEMS 14 decouples all of the throw ports 22 from the pole port 24 in response to the switch control output 50 having a switch control output permutation P22-CL.

Table II below indicates which paths from the throw ports 22 to the pole port 24 are opened and closed as a result of the state of the switch control signals 38, and also indicates the states of the switch control signals 38 for the different switch control output permutations P22-1, P22-2, P22-3, P22-M, and P22-CL.

TABLE II

| | Switch Control Output 50 | | | | | | | |
|---|---|---|---|---|---|---|---|---|
| | State of the Paths From Throw Ports 22 to Pole Port 24 Closed (C)/Open (O) | | | | Activation State (AS)/Deactivation State (DS) of Switch Control Signals 38 | | | |
| Permutation | 22-1 | 22-2 | 22-3 | 22-M | 38-1 | 38-2 | 38-3 | 38-M |
| P22-1 | C | O | O | O | AS | DS | DS | DS |
| P22-2 | O | C | O | O | DS | AS | DS | DS |
| P22-3 | O | O | C | O | DS | DS | AS | DS |
| P22-M | O | O | O | C | DS | DS | DS | AS |
| P22-CL | O | O | O | O | DS | DS | DS | DS |

In this embodiment, the throw ports 22 of the MTMEMS 14 are coupled to RF transceiver circuitry (not shown). The throw port 22-1 is coupled to transmit an RF receive signal RX1 to a receiver chain (not shown) within the RF transceiver circuitry. The throw port 22-2 is coupled to receive an RF transmission signal TX1 from a transmit chain in the RF transceiver circuitry. The throw port 22-3 is coupled to both a receiver chain and a transmit chain within the RF transceiver circuitry. Thus, the throw port 22-3 both transmits an RF receive signal RXA to the receiver chain and receives an RF transmission signal TXA from the transmit chain in the RF transceiver circuitry. The throw port 22-M is also coupled to the receiver chain in the RF transceiver circuitry. The throw port 22-M thus transmits an RF receive signal RXM to the receiver chain in the RF transceiver circuitry.

The RF signals RX1, TX1, RXA, TXA, and RXM may each be any type of RF signal. As such, the RF signals RX1, TX1, RXA, TXA, and RXM may be formatted in accordance with any RF communication standard or any RF communication specification within the RF communication standard. For example, the RF signals RX1, TX1, RXA, TXA, and RXM may be formatted in accordance with 2G Global System for Mobile Communications (GSM) standards, 3G standards, LTE standards, and/or the like.

Additionally, the RF signals RX1, TX1, RXA, TXA, and RXM may be duplexed and/or multiplexed in accordance with different RF communication specifications defined by an RF communication standard, and may thus be provided within the RF communication bands defined by the RF communication specifications of the RF communication standard. For instance, the RF signals RX1, TX1, RXA, TXA, RXM may be formatted in accordance with specifications of the 2G GSM standard (such as a Digital Communication System (DCS) specification, a Personal Communications Service (PCS) specification), GSM specifications, Enhanced Data Rates for GSM Evolution (EDGE) specifications of the 3G standard, and different specifications of the LTE standard. Furthermore, the RF signals RX1, TX1, RXA, TXA, RXM may be duplexed in accordance with TDD, FDD, Space Division Multiplexing (SDM), Code Division Multiple Access Multiplexing (CDMA), Orthogonal Frequency Division Multiple Access Multiplexing (OFDMA), MIMO, and/or the like.

In this embodiment, the RF receive signal RX1 and the RF transmission signal TX1 are both formatted in accordance with different LTE-TDD specifications, and are each within a different RF communication band. The RF transmission signal TXA and the RF receive signal RXA are both duplexed in accordance with an LTE-FDD specification, and are provided within a transmission band and a receive band of an RF communication band defined by the LTE-FDD specification. The RF receive signal RXM is a receive MIMO signal and is formatted in accordance with a MIMO specification.

As shown in FIG. 2, the throw port 16-1 is operable to receive an RF transmission signal TX2. The RF transmission signal TX2 is an RF transmission signal provided within the same RF communication band as the RF receive signal RX1. Thus, the RF transmission signal TX2 is also an LTE-TDD-type signal. The throw port 16-2 is operable to receive an RF receive signal RX2. The RF receive signal RX2 is a corresponding RF receive signal for the RF communication band of the RF transmission signal TX1. Thus, the RF receive signal RX2 is also an LTE-TDD-type signal.

The control circuit 46 is operable in both a first LTE-TDD mode and a second LTE-TDD mode. In the first LTE-TDD mode, the control circuit 46 controls the MTSTS 12 and the MTMEMS 14 in accordance with performance metrics defined by the LTE-TDD specification for the RF transmission signal TX2 and the RF receive signal RX1. As such, the control circuit 46 controls the selective coupling of the MTMEMS 14 such that the pole port 24 is selectively coupled to the throw port 22-1. To initiate operation in the first LTE-TDD mode, the control circuit 46 generates the switch control output 50 so that the switch control output 50 has the switch control permutation P22-1 (see Table II). The switch control output 50 is maintained by the control circuit 46 so as to have the switch control permutation P22-1 so long as the control circuit 46 is in the first LTE-TDD mode and the control circuit 46 is not transitioning to another mode.

For TDD operation, the RF transmission signal TX2 and the RF receive signal RX1 are separated in the time domain such that each is provided in accordance with time slots defined by the LTE-TDD specification for the RF transmission signal TX2 and the RF receive signal RX1. Thus, during each of the time slots designated for the RF receive signal RX1 in the first LTE-TDD mode, the RF receive signal RX1 is received by the antenna ANT1 at the antenna port 20 and is transmitted to the throw port 22-1. Similarly, during each of the time slots designated for the RF transmission signal TX2 in the first LTE-TDD mode, the RF transmission signal TX2 is received at the throw port 16-1 and is transmitted by the antenna ANT1 at the antenna port 20. The timing requirements of the time slots for the RF receive signal RX1 and the time slots for the RF transmission signal TX2 are defined by the LTE-TDD specification.

The time slots for the RF transmission signal TX2 and the RF receive signal RX1 may be approximately temporally mutually exclusive so that each of the RF transmission signal TX2 and the RF receive signal RX1 is being transmitted and received by the antenna ANT1 at different times. During a time slot for the RF receive signal RX1, and while the control circuit 46 is in the first LTE-TDD mode, the control circuit 46 controls the selective coupling of the MTSTS 12 so that the pole port 18 is selectively coupled to the throw port 16-3. More specifically, the control circuit 46 generates the switch control output 48 so that the switch control output 48 is provided in accordance with the permutation P16-3 during the time slot for the RF receive signal RX1. Accordingly, the antenna ANT1, the antenna port 20, and the pole port 18 are coupled to the throw port 22-1 such that the RF receive signal RX1 may be received by the antenna ANT1 and transmitted from the throw port 22-1 to the receiver chain in the RF transceiver circuitry. Furthermore, the pole port 18 is decoupled from the throw port 16-1 during the time slot for the RF receive signal RX1 because the switch control output 48 is generated in accordance with the switch control output permutation P16-3. Alternatively, a half-duplexing may be defined by the LTE-TDD specification, and thus time slots for the RF receive signal RX1 and the RF transmission signal TX2 may partially overlap.

During a time slot for the RF transmission signal TX2 and during the first LTE-TDD mode, the control circuit 46 decouples the pole port 18 from the throw port 16-3 and controls the selective coupling of the MTSTS 12 such that the pole port 18 is selectively coupled to the throw port 16-1. More specifically, the control circuit 46 generates the switch control output 48 such that the switch control output 48 is provided in accordance with the switch control output permutation P16-1 (see Table I). However, the control circuit 46 still generates the switch control output 50 so that the pole port 24 remains selectively coupled to the throw port 22-1 (see Table II).

Thus, while the control circuit 46 is in the first LTE-TDD mode, the switch control output 48 is generated in accordance with the switch control output permutation P16-1 and the switch control output 50 is generated in accordance with the switch control output permutation P22-1 during the time slot for the RF transmission signal TX2. Also, the RF transmission signal TX2 is received at the throw port 16-1 and is transmitted from the pole port 18 to the antenna port 20, and by the antenna ANT1. While the control circuit 46 is in the first LTE-TDD mode, the procedures described above with respect to the RF receive signal RX1 are repeated by the control circuit 46 during each time slot for the RF receive signal RX1. Similarly, the procedures described above with respect to the RF transmission signal TX2 are repeated by the control circuit 46 for each time slot of the RF transmission signal TX2.

Note that while the control circuit 46 is in the first LTE-TDD mode, the control circuit 46 maintains the pole port 24 selectively coupled to the throw port 22-1, and the control circuit 46 controls the selective coupling of the pole port 18 so that the pole port 18 is switched from the throw port 16-1 to the throw port 16-3 in accordance with the time slots for transmission and reception defined by the LTE-TDD specification of the RF receive signal RX1 and the RF transmission signal TX2. Since the control circuit 46 switches the MTSTS 12, and not the MTMEMS 14, while the control circuit 46 is in the first LTE-TDD mode, the amount of switching required by the MTMEMS 14 and the MEMS 30-1 may be significantly reduced, thereby extending the life of the MEMS 30-1 and the MTMEMS 14.

To terminate the first LTE-TDD mode, the control circuit 46 may decouple the pole port 18 from the throw port 16-3 if a final time slot was for the RF receive signal RX1. The control circuit 46 decouples the pole port 18 from the throw port 16-3 of the MTSTS 12 before the control circuit 46 decouples the pole port 24 from the throw port 22-1 of the MTMEMS 14. This helps prevent or reduce hot switching and helps to extend the life of the MEMS 30-1 and the MTMEMS 14. For example, the control circuit 46 may generate the switch control output 48 in accordance with one of the switch control output permutations P16-2 or P16-CL. After the pole port 18 has been decoupled from the throw port 16-3 of the MTSTS 12, the control circuit 46 controls the selective coupling of the MTMEMS 14 to decouple the pole port 24 from the throw port 22-1 of the MTMEMS 14. For example, the control circuit 46 may generate the switch control output 50 in accordance with one of the switch control output permutations P22-2 or P22-M. Otherwise, if the final time slot is for the RF transmission signal TX2, the control circuit 46 may immediately decouple the throw port 22-1 from the pole port 24, or alternatively, may first decouple the pole port 18 from all of the throw ports 16 and then decouple the throw port 22-1 from the pole port 24.

In the second LTE-TDD mode, the control circuit 46 controls the selective coupling of the MTMEMS 14 such that the pole port 24 is selectively coupled to the throw port 22-2. The control circuit 46 generates the switch control output 50 so that the switch control output 50 has the switch control permutation P22-2 (see Table II). The switch control output 50 is maintained so as to have the switch control permutation P22-2 while the control circuit 46 is in the second LTE-TDD mode. For TDD operation, the RF transmission signal TX1 and the RF receive signal RX2 are separated in the time domain such that each is provided in accordance with time slots defined by an LTE-TDD specification for their RF communication band. Thus, in the second LTE-TDD mode, the RF transmission signal TX1 is received by the throw port 22-2 and is transmitted by the antenna ANT1 at the antenna port 20 during the time slots designated for the RF transmission signal TX1 by the LTE-TDD specification of the RF transmission signal TX1 and the RF receive signal RX2. Similarly, the RF receive signal RX2 is received from the antenna ANT1 at the antenna port 20 and transmitted to the throw port 16-2 during the time slots designated by the LTE-TDD standard of the RF transmission signal TX1 and the RF receive signal RX2. The time slots for the RF transmission signal TX1 and the RF receive signal RX2 may be approximately temporally mutually exclusive so that each of the RF transmission signal TX1 and the RF receive signal RX2 is being transmitted and received by the antenna ANT1 at different times.

During each of the time slots for the RF transmission signal TX1, and while the control circuit 46 is in the second LTE-TDD mode, the control circuit 46 controls the selective coupling of the MTSTS 12 so that the pole port 18 is selectively coupled to the throw port 16-3 during a time slot for the RF transmission signal TX1. More specifically, the control circuit 46 generates the switch control output 48 so that the switch control output 48 is provided in accordance with the switch control output permutation P16-3 (see Table I) during a time slot for the RF transmission signal TX1. Accordingly, the antenna ANT1, the antenna port 20, and the pole port 18 are coupled to the throw port 22-2 such that the RF transmission signal TX1 is received by the throw port 22-2 from a transmit chain in the RF transceiver circuitry and is transmitted by the antenna ANT1. Furthermore, the pole port 18 is decoupled from the throw port 16-2 during the time slot for the RF transmission signal TX1 because the switch control output 48 is generated in accordance with the switch control output permutation P16-3.

During a time slot for the RF receive signal RX2 and during the second LTE-TDD mode, the control circuit 46 decouples the pole port 18 from the throw port 16-3 and controls the selective coupling of the MTSTS 12 such that the pole port 18 is selectively coupled to the throw port 16-2. More specifically, the control circuit 46 generates the switch control output 48 such that the switch control output 48 is provided in accordance with the switch control output permutation P16-2. However, the control circuit 46 still generates the switch control output 50 so that the pole port 24 remains selectively coupled to the throw port 22-2. Thus, while the control circuit 46 is in the second LTE-TDD mode, the switch control output 48 is generated in accordance with the switch control output permutation P16-2 and the switch control output 50 is generated in accordance with the switch control output permutation P22-2 during the time slot for the RF receive signal RX2. Thus, the RF receive signal RX2 is received from the antenna ANT1 at the antenna port 20 and is transmitted to the throw port 16-2 during the time slot for the RF receive signal RX2. While the control circuit 46 is in the second LTE-TDD mode, the switch control output 48 is generated in the switch control output permutation P16-3 so that the pole port 18 is selectively coupled to the throw port 16-3 and is decoupled from the throw port 16-2 during each of the time slots for the RF transmission signal TX1. Similarly, while the control circuit 46 is in the second LTE-TDD mode, the switch control output 48 is generated in the switch control permutation P16-2 so that the pole port 18 is selectively coupled to the throw port 16-2 during each of the time slots for the RF receive signal RX2.

Note that while the control circuit 46 is in the second LTE-TDD mode, the control circuit 46 maintains the pole port 24 selectively coupled to the throw port 22-2, and the control circuit 46 controls the selective coupling of the pole port 18 so that the pole port 18 is switched between the throw port 16-2 and the throw port 16-3 in accordance with the time slots for transmission and reception defined by the LTE-TDD specification of the RF receive signal RX2 and the RF transmission signal TX1. Since the control circuit 46 switches the MTSTS 12, and not the MTMEMS 14, while the control circuit 46 is in the second LTE-TDD mode, the amount of switching required by the MTMEMS 14 and the MEMS 30-2 may be significantly reduced, thereby extending the life of the MEMS 30-2 and the MTMEMS 14.

To terminate the second LTE-TDD mode, the control circuit 46 may decouple the pole port 18 from the throw port 16-3 if a final time slot was for the RF transmission signal TX1. The control circuit 46 decouples the pole port 18 from the throw port 16-3 of the MTSTS 12 before the control circuit 46 decouples the pole port 24 from the throw port 22-2 of the MTMEMS 14. This helps to prevent or reduce hot switching and helps extend the life of the MEMS 30-2 and the MTMEMS 14. For example, the control circuit 46 may generate the switch control output 48 in accordance with one of the switch control output permutations P16-1, P16-N, or P16-CL. After the pole port 18 has been decoupled from the throw port 16-3 of the MTSTS 12, the control circuit 46 controls the selective coupling of the MTMEMS 14 to decouple the pole port 24 from the throw port 22-2 of the MTMEMS 14. For example, the control circuit 46 may generate the switch control output 50 in accordance with one of the switch control output permutations P22-1, P22-3, or P22-M.

In this embodiment, the RF transmission signal TXA and the RF receive signal RXA are each formatted in accordance with an LTE-FDD specification. Thus, the RF transmission signal TXA and the RF receive signal RXA are provided within the RF communication band defined by the LTE-FDD mode. The RF receive signal RXA and the RF transmission signal TXA are separated within the frequency domain by two different carrier frequencies, one within a transmission band of the RF communication band, and one within a receive band of the RF communication band.

The control circuit 46 is further operable in an LTE-FDD mode. While the control circuit 46 is in the LTE-FDD mode, the control circuit 46 controls the selective coupling of the MTSTS 12 such that the pole port 18 is selectively coupled to the throw port 16-3 of the MTSTS 12. In addition, the control circuit 46 controls the selective coupling of the MTMEMS 14 such that the pole port 24 is selectively coupled to the throw port 22-3. More specifically, the control circuit 46 generates the switch control output 48 such that the switch control output 48 is provided in accordance with the switch control output permutation P16-3, and generates the switch control output 50 such that the switch control output 50 is generated in accordance with the switch control output permutation P22-3 while the control circuit 46 is in the LTE-FDD mode. As such, the RF receive signal RXA may be received and the RF transmission signal TXA may be transmitted simultaneously by the antenna ANT1 at the antenna port 20, while the control circuit 46 is in the LTE-FDD mode. Thus, the antenna ANT1, the antenna port 20, the pole port 18, and the throw port 22-3 are coupled while the control circuit 46 is in the LTE-FDD mode. Therefore, the RF receive signal RXA may be transmitted from the throw port 22-3 and the RF transmission signal TXA may be received at the throw port 22-3 simultaneously while the control circuit 46 is in the LTE-FDD mode.

To terminate the LTE-FDD mode, the control circuit 46 may initially decouple the pole port 18 from the throw port 16-3. The control circuit 46 decouples the pole port 18 from the throw port 16-3 of the MTSTS 12 before the control circuit 46 decouples the pole port 24 from the throw port 22-3 of the MTMEMS 14. For example, the control circuit 46 may generate the switch control output 48 in accordance with one of the switch control output permutations P16-1, P16-2, P16-N, or P16-CL. After the pole port 18 has been decoupled from the throw port 16-3 of the MTSTS 12, the control circuit 46 controls the selective coupling of the MTMEMS 14 to decouple the pole port 24 from the throw port 22-3 of the MTMEMS 14. This helps prevent or reduce hot switching and helps extend the life of the MEMS 30-3 and the MTMEMS 14. For example, the control circuit 46 may generate the switch control output 50 in accordance with one of the switch control output permutations P22-1, P22-2, or P22-CL.

The control circuit 46 is also configured to operate in a MIMO mode. As shown in FIG. 2, the throw port 22-M of the MTMEMS 14 is operable to output the receive MIMO signal RXM to a MIMO receiver chain (not shown) within the RF transceiver circuitry. The control circuit 46 is configured to operate in the MIMO mode. While the control circuit 46 is in the MIMO mode, the control circuit 46 is configured to control the selective coupling of the MTSTS 12 such that the pole port 18 is selectively coupled to the throw port 16-3 of the MTSTS 12. The control circuit 46 is also configured to selectively couple the pole port 24 to the throw port 22-M of the MTMEMS 14. Accordingly, the receive MIMO signal RXM is received by the antenna ANT1 at the antenna port 20 and transmitted from the throw port 22-M of the MTMEMS 14 to the MIMO receiver chain in the RF transceiver circuitry. Thus, while the control circuit 46 is in the MIMO mode, the control circuit 46 may generate the switch control output 48 in accordance with the switch control output permutation P16-3 and the switch control output 50 in accordance with the switch control output permutation P22-M in order to receive the receive MIMO signal RXM on the antenna ANT1 at the antenna port 20, and may transmit the receive MIMO signal RXM from the throw port 22-M to the MIMO receiver chain. Note, however, that the receive MIMO mode may be dynamic, and while the control circuit 46 is in the MIMO mode, other receive MIMO signals or transmission MIMO signals may be received and/or transmitted by the antenna ANT1 and transmitted and/or received from the throw port 22-M simultaneously or non-simultaneously with the receive MIMO signal RXM.

Also, the antenna ANT1 and the antenna port 20 may be decoupled from the throw port 22-M under certain circumstances defined by a MIMO specification that corresponds to the MIMO mode. However, under these circumstances, the decoupling may be performed by the MTSTS 12, where the switch control output 50 is maintained in the switch control output permutation P22-M, while the switch control output permutation of the switch control output 48 may be changed. For example, the switch control output 48 may be generated in accordance with the switch control output permutation P16-CL and the antenna port 20 may be decoupled from all of the throw ports 16-1-16-N. The termination of the MIMO mode by the control circuit 46 may decouple the pole port 18 from the throw port 16-3 and then decouple the pole port 24 from the throw port 22-M.

FIG. 3 illustrates exemplary RF front-end circuitry that includes yet another embodiment of antenna switching circuitry 52. In this embodiment, the antenna switching circuitry 52 includes one embodiment of an MTSTS 12(1). The MTSTS 12(1) shown in FIG. 3 is similar to the MTSTS 12 shown in FIGS. 1 and 2. However, in this embodiment, the MTSTS 12(1) is configured to selectively couple a pole port 18(1) with any one of a set of throw ports (referred to generically as elements 16(1), and specifically as 16(1)-1, 16(1)-2, 16(1)-3, 16(1)-N−1, 16(1)-N). The pole port 18(1) is coupled to the antenna port 20 and the antenna ANT1. In this embodiment, the throw port 16(1)-N is coupled to ground and is thus a grounded throw port. Furthermore, in this embodiment, the antenna switching circuitry 52 includes an MTMEMS 14(1)(A) and an MTMEMS 14(1)(B). The MTMEMS 14(1)(A) is similar to the MTMEMS 14 shown in FIGS. 1 and 2, but in this embodiment, the integer M is equal to 7 and the MTMEMS 14(1)(A) includes a pole port 24(1)(A) and a set of throw ports (referred to generically as elements 22(1)(A), and specifically as elements 22(1)(A)-1-22(1)(A)-7). The antenna switching circuitry 52 also includes an MTMEMS 14(1)(B). The MTMEMS 14(1)(B) includes a pole port 24(1) (B) and a set of throw ports (referred to generically as elements 22(1)(B), and specifically as elements 22(1)(B)-1-22 (1)(B)-3). Thus, the MTMEMS 14(1)(B) is the same as the MTMEMS 14 shown in FIGS. 1 and 2, where the integer M is equal to 3. In this embodiment, the pole port 24(1)(A) of the MTMEMS 14(1)(A) is coupled to the throw port 16(1)-2, while the pole port 24(1)(B) of the MTMEMS 14(1)(B) is coupled to the throw port 16(1)-3 of the MTSTS 12(1). The MTMEMS 14(1)(A) is configured to selectively couple the pole port 24(1)(A) to any one of the throw ports 22(1)(A) in the same manner as described above with respect to the MTMEMS 14 of FIG. 1. Similarly, the MTMEMS 14(1)(B) is configured to selectively couple the pole port 24(1)(B) to any one of the throw ports 22(1)(B) in the same manner as described above with respect to FIGS. 1 and 2.

FIG. 3 also illustrates an exemplary embodiment of the control circuit 46. In this embodiment, the control circuit 46 includes a master subcontroller 54, a transistor switch subcontroller 56, and a MEMS subcontroller 58. The master subcontroller 54, the transistor switch subcontroller 56, and the MEMS subcontroller 58 may each be Mobile Industry Processor Interface (MIPI) subcontrollers. The master subcontroller 54 is a master MIPI. The transistor switch subcontroller 56 is configured to control the selective coupling of the MTSTS 12(1) as a slave MIPI subcontroller. The MEMS subcontroller 58 is configured to control the selective coupling of both the MTMEMS 14(1)(A) and the MTMEMS 14(1)(B) as a slave MIPI subcontroller. The master subcontroller 54 may be communicatively associated with the MEMS subcontroller 58 and the transistor switch subcontroller 56 through a communication bus, such as a MIPI communication bus.

The master subcontroller 54 is configured to receive a control mode input 60 that is indicative of a particular mode of operation of the antenna switching circuitry 52. In accordance with the control mode input 60, the master subcontroller 54 may generate a transistor switch control mode output 62 and a MEMS switch control mode output 64 in response to the control mode input 60. The master subcontroller 54 may transmit the transistor switch control mode output 62 to the transistor switch subcontroller 56 via the communication bus, such as the MIPI communication bus. The transistor switch subcontroller 56 generates a switch control output 48(1) in accordance with the transistor switch control mode output 62. The switch control output 48(1) is analogous to the switch control output 48 described above with respect to FIG. 2. The MEMS subcontroller 58 is configured to generate a switch control output 50(1) and a switch control output 50(2) in response to the MEMS switch control mode output 64. The switch control output 50(1) is analogous to the switch control output 50 described above with respect to FIG. 2, and operates to selectively couple the pole port 24(1)(A) of the MTMEMS 14(1)(A) to one of the throw ports 22(1)(A). The switch control output 50(2) is also analogous to the switch control output 50 described above with respect to FIG. 2, and is operable to selectively couple the pole port 24(1)(B) of the MTMEMS 14(1)(B) to one of the throw ports 22(1)(B).

Each of the throw ports 22(1)(A) of the MTMEMS 14(1) (A) and the throw ports 22(1)(B) of the MTMEMS 14(1)(B) is coupled to RF transceiver circuitry (not shown) so as to transmit and/or receive RF signals. More specifically, the throw ports 22(1)(A)-1, 22(1)(A)-2, 22(1)(A)-3, 22(1)(A)-4, 22(1)(A)-5, 22(1)(A)-6, 22(1)(A)-7 each receive one of RF transmission signals TXTDD1, TXTDD2, TXTDD3, TXTDD4, TXTDD5, TXTDD6, TXFDD7, respectively. Each of the RF transmission signals TXTDD1, TXTDD2, TXTDD3, TXTDD4, TXTDD5, TXTDD6 may be provided in different RF communication bands and may be formatted in accordance with different LTE-TDD specifications for those RF communication bands. The RF transmission signal TXFDD7 is received from a transmit chain in the RF transceiver circuitry at the throw port 22(1)(A)-7. The RF transmission signal TXFDD7 is formatted in accordance with an LTE-FDD specification. As such, an RF receive signal RXFDD7 is transmitted to a receiver chain and is formatted in accordance with the LTE-FDD specification for the RF transmission signal TXFDD7. Accordingly, in this embodiment, the RF transmission signals TXTDD1, TXTDD2, TXTDD3, TXTDD4, TXTDD5, TXTDD6 formatted in accordance with the LTE-TDD specifications are grouped with the RF transmission signal TXFDD7 and the RF receive signal RXFDD7 formatted in accordance with the LTE-FDD specification.

The throw ports 22(1)(B)-1, 22(1)(B)-2, 22(1)(B)-3 each transmit RF receive signals RXTDD1, RXTDD2, RXTDD3 to receiver chains in the RF transceiver circuitry. In this embodiment, the RF receive signal RXTDD1 is formatted in accordance with the LTE-TDD specification of the RF transmission signal TXTDD1. Also, the RF receive signal RXTDD2 is formatted in accordance with the LTE-TDD specification of the RF transmission signal TXTDD2. Furthermore, the RF receive signal RXTDD3 is formatted in accordance with the LTE-TDD specification of the RF transmission signal TXTDD3. The control circuit 46 may operate in various LTE-TDD modes to comply with the requirements for the different LTE-TDD specifications.

In one of the LTE-TDD modes, the control circuit 46 controls the MTSTS 12(1), the MTMEMS 14(1)(A), and the MTMEMS 14(1)(B) in accordance with performance metrics defined by the LTE-TDD specification for the RF transmission signal TXTDD1 and the RF receive signal RXTDD1. As such, the control circuit 46 controls the selective coupling of the MTMEMS 14(1)(A) such that the pole port 24(1)(A) is selectively coupled to the throw port 22(1)(A)-1. To initiate operation in the LTE-TDD mode, the control circuit 46 generates the switch control output 50(1) with a switch control output permutation that results in the pole port 24(1)(A) being selectively coupled to the throw port 22(1)(A)-1. The switch control output 50(1) is maintained by the control circuit 46 so as to have this switch control output permutation so long as the control circuit 46 is in the LTE-TDD mode and the control circuit 46 is not transitioning to another mode.

The control circuit 46 controls the selective coupling of the MTMEMS 14(1)(B) such that the pole port 24(1)(B) is selectively coupled to the throw port 22(1)(B)-1. To initiate operation in the LTE-TDD mode, the control circuit 46 generates the switch control output 50(2) with a switch control output permutation that results in the pole port 24(1)(B) being selectively coupled to the throw port 22(1)(B)-1. The switch control output 50(2) is maintained by the control circuit 46 so as to have this switch control output permutation so long as the control circuit 46 is in the LTE-TDD mode and the control circuit 46 is not transitioning to another mode. Thus, while the control circuit 46 is in the LTE-TDD mode, the pole port 24(1)(B) and the pole port 24(1)(A) are simultaneously maintained selectively coupled to the throw port 22(1)(B)-1 and throw port 22(1)(A)-1, respectively.

During each of the time slots in the LTE-TDD mode designated for the RF receive signal RXTDD1, the control circuit 46 controls the selective coupling of the MTSTS 12(1) so that the pole port 18(1) is selectively coupled to the throw port 16(1)-3. The RF receive signal RXTDD1 is received by the antenna ANT1 at the antenna port 20 and is transmitted to the throw port 22(1)(B)-1. Similarly, during each of the time slots in the LTE-TDD mode designated for the RF transmission signal TXTDD1, the control circuit 46 controls the selective coupling of the MTSTS 12(1) so that the pole port 18(1) is selectively coupled to the throw port 16(1)-2. Thus, the RF transmission signal TXTDD1 is received at the throw port 22(1)(A)-1 and is transmitted by the antenna ANT1 at the antenna port 20. The timing requirements of the time slots for the RF receive signal RXTDD1 and the time slots of the RF transmission signal TXTDD1 are defined by the LTE-TDD standard.

To terminate the LTE-TDD mode, the control circuit 46 may initially decouple the pole port 18(1) from the throw ports 16(1)-2 and 16(1)-3. For example, the control circuit 46 may selectively couple the pole port 18(1) of the MTSTS 12(1) to the throw port 16(1)-N because the throw port 16(1)-N is grounded. After the pole port 18(1) has been decoupled from the throw ports 16(1)-2 and 16(1)-3, the control circuit 46 controls the selective coupling of the MTMEMS 14(1)(A) to decouple the pole port 24(1)(A) from the throw port 22(1)(A)-1 of the MTMEMS 14(1)(A). The control circuit 46 also controls the selective coupling of the MTMEMS 14(1)(B) to decouple the pole port 24(1)(B) from the throw port 22(1)(B)-1 of the MTMEMS 14(1)(B) after the pole port 18(1) has been decoupled from the throw ports 16(1)-2 and 16(1)-3.

The control circuit 46 is further operable in an LTE-FDD mode. In this embodiment, the RF transmission signal TXFDD7 is received by the throw port 22(1)(A)-7 from a transmit chain and the RF receive signal RXFDD7 is transmitted from the throw port 22(1)(A)-7 to an RF receive chain. The RF transmission signal TXFDD7 and the RF receive signal RXFDD7 are formatted in accordance with the LTE-FDD specification.

While the control circuit 46 is in the LTE-FDD mode, the control circuit 46 controls the selective coupling of the MTSTS 12(1) such that the pole port 18(1) is selectively coupled to the throw port 16(1)-3 of the MTSTS 12(1), as in the first LTE-TDD mode. In addition, the control circuit 46 controls the selective coupling of the MTMEMS 14(1)(A) such that the pole port 24(1)(A) is selectively coupled to the throw port 22(1)(A)-7. As such, while the control circuit 46 is in the LTE-FDD mode, the RF receive signal RXFDD7 may be received, and the RF transmission signal TXFDD7 may be transmitted simultaneously by the antenna ANT1 at the antenna port 20. Thus, the antenna ANT1, the antenna port 20, the pole port 18(1), and the throw port 22(1)(A)-7 are selectively coupled by the control circuit 46. Therefore, the RF receive signal RXFDD7 may be transmitted from the throw port 22(1)(A)-7 and the RF transmission signal TXFDD7 may be received at the throw port 22(1)(A)-7 simultaneously while the control circuit 46 is in the LTE-FDD mode. With regard to the MTMEMS 14(1)(B), the control circuit 46 decouples the pole port 24(1)(B) from all of the throw ports 22(1)(B).

To terminate the LTE-FDD mode, the control circuit 46 may initially decouple the pole port 18(1) from the throw port 16(1)-3. The control circuit 46 decouples the pole port 18(1) from the throw port 16(1)-3 of the MTSTS 12(1) before the control circuit 46 decouples the pole port 24(1)(A) from the throw port 22(1)(A)-7 of the MTMEMS 14(1)(A). After the pole port 18(1) has been decoupled from the throw port 16(1)-3 of the MTSTS 12(1), the control circuit 46 controls the selective coupling of the MTMEMS 14(1)(A) to decouple the pole port 24(1)(A) from the throw port 22(1)(A)-7. This helps to prevent or reduce hot switching and helps extend the life of the MTMEMS 14(1)(A).

FIG. 4 illustrates exemplary RF front-end circuitry that includes yet another embodiment of antenna switching circuitry 66, which may be provided as RF front-end circuitry within an RF front-end module. In this embodiment, the antenna switching circuitry 66 includes the same MTSTS 12(1) described above with respect to FIG. 3. In this embodiment, the antenna switching circuitry 66 includes an MTMEMS 14(2)(A) and an MTMEMS 14(2)(B). The MTMEMS 14(2)(A) is similar to the MTMEMS 14 shown in FIGS. 1 and 2, but in this embodiment, the integer M is equal to six (6) and the MTMEMS 14(2)(A) includes a pole port 24(2)(A) and a set of throw ports (referred to generically as elements 22(2)(A), and specifically as elements 22(2)(A)-1-22(2)(A)-6).

The antenna switching circuitry 66 also includes the MTMEMS 14(2)(B). The MTMEMS 14(2)(B) includes a pole port 24(2)(B) and a set of throw ports (referred to generically as elements 22(2)(B), and specifically as elements 22(2)(B)-ADD, 22(2)(B)-1, 22(2)(B)-2, 22(2)(B)-3). Thus, the MTMEMS 14(2)(B) is the same as the MTMEMS 14 shown in FIGS. 1 and 2, where the integer M is equal to four (4). In this embodiment, the pole port 24(2)(A) of the MTMEMS 14(2)(A) is coupled to the throw port 16(1)-2, while the pole port 24(2)(B) of the MTMEMS 14(2)(B) is coupled to the throw port 16(1)-3 of the MTSTS 12(1). The MTMEMS 14(2)(A) is configured to selectively couple the pole port 24(2)(A) to any one of the throw ports 22(2)(A) in the same manner as described above with respect to the MTMEMS 14 of FIGS. 1 and 2. Similarly, the MTMEMS 14(2)(B) is configured to selectively couple the pole port 24(2)(B) to any one of the throw ports 22(2)(B) in the same manner as described above with respect to FIGS. 1 and 2.

The antenna switching circuitry 66 also includes the control circuit 46 described above with respect to FIG. 2. In this embodiment, the MEMS subcontroller 58 is configured to generate a switch control output 50(3) and a switch control output 50(4) in response to the MEMS switch control mode output 64 generated by the master subcontroller 54. The switch control output 50(3) is analogous to the switch control output 50 described above with respect to FIG. 2, and operates to selectively couple the pole port 24(2)(A) of the MTMEMS 14(2)(A) to one of the throw ports 22(2)(A). The switch control output 50(4) is also analogous to the switch control output 50 described above with respect to FIG. 2, and is operable to selectively couple the pole port 24(2)(B) of the MTMEMS 14(2)(B) to one of the throw ports 22(2)(B). Like the throw ports 22(1)(A) of the MTMEMS 14(1)(A) shown in FIG. 3, the throw ports 22(2)(A)-1, 22(2)(A)-2, 22(2)(A)-3, 22(2)(A)-4, 22(2)(A)-5, 22(2)(A)-6 each receive the RF transmission signals TXTDD1, TXTDD2, TXTDD3, TXTDD4, TXTDD5, TXTDD6, respectively. Also, like the throw ports 22(1)(B) of the MTMEMS 14(1)(B) in FIG. 3, the throw ports 22(2)(B)-1, 22(2)(B)-2, 22(2)(B)-3 of the MTMEMS 14(2)(B) transmit the RF receive signals RXTDD1, RXTDD2, RXTDD3. The control circuit 46 is operable in the LTE-TDD mode described above, where the throw ports 22(2)(A)-1, 22(2)(A)-2, 22(2)(A)-3, 22(2)(A)-4, 22(2)(A)-5, 22(2)(A)-6 correspond to the throw ports 22(2)(A)-1, 22(2)(A)-2, 22(2)(A)-3, 22(2)(A)-4, 22(2)(A)-5, 22(2)(A)-6 in FIG. 3, respectively. Also, with regard to the LTE-TDD mode, the throw ports 22(2)(B)-1, 22(2)(B)-2, 22(2)(B)-3 correspond to the throw ports 22(2)(B)-1, 22(2)(B)-2, 22(2)(B)-3 in FIG. 3, respectively.

The control circuit 46 is further operable in another LTE-FDD mode. As shown in FIG. 4, unlike the MTMEMS 14(1)(A) shown in FIG. 3, the MTMEMS 14(2)(A) includes the additional throw port 22(2)(B)-ADD. In this embodiment, the RF transmission signal TXFDD7 is received by the throw port 22(2)(B)-ADD from a transmit chain and the RF receive signal RXFDD7 is transmitted from the throw port 22(2)(B)-ADD to a receiver chain. Accordingly, in this embodiment, the RF receive signals RXTDD1, RXTDD2, RXTDD3, which are formatted in accordance with the LTE-TDD specifications, are grouped with the RF transmission signal TXFDD7 and the RF receive signal RXFDD7, which are formatted in accordance with the LTE-FDD specification.

While the control circuit 46 is in the LTE-FDD mode, the control circuit 46 controls the selective coupling of the MTSTS 12(1) such that the pole port 18(1) is selectively coupled to the throw port 16(1)-3 of the MTSTS 12(1). In addition, the control circuit 46 controls the selective coupling of the MTMEMS 14(2)(B) such that the pole port 24(2)(B) is selectively coupled to the throw port 22(2)(B)-ADD. As such, while the control circuit 46 is in the LTE-FDD mode, the RF receive signal RXFDD7 may be received, and the RF transmission signal TXFDD7 may be transmitted, simultaneously by the antenna ANT1 at the antenna port 20. Thus, the antenna ANT1, the antenna port 20, the pole port 18(1), and the throw port 22(2)(B)-ADD are selectively coupled by the control circuit 46. Therefore, the RF receive signal RXFDD7 may be transmitted from the throw port 22(2)(B)-ADD to a receiver chain in RF transceiver circuitry (not shown) and the RF transmission signal TXFDD7 may be received at the throw port 22(2)(B)-ADD from a transmit chain in the RF transceiver circuitry simultaneously while the control circuit 46 is in the LTE-FDD mode.

To terminate the LTE-FDD mode, the control circuit 46 may initially decouple the pole port 18(1) from the throw port 16(1)-3. The control circuit 46 decouples the pole port 18(1) from the throw port 16(1)-3 of the MTSTS 12(1) before the control circuit 46 decouples the pole port 24(2)(B) from the throw port 22(2)(B)-ADD of the MTMEMS 14(2)(B). After the pole port 18(1) has been decoupled from the throw port 16(1)-3 of the MTSTS 12(1), the control circuit 46 controls the selective coupling of the MTMEMS 14(2)(B) to decouple the pole port 24(2)(B) from the throw port 22(2)(B)-ADD of the MTMEMS 14(2)(B). This helps to prevent or reduce hot switching and helps extend the life of the MTMEMS 14(2)(B).

FIG. 5 illustrates yet another embodiment of antenna switching circuitry 68, which may be provided as RF front-end circuitry within an RF front-end module. In this embodiment, the antenna switching circuitry 68 also includes the MTSTS 12(1) described above with regard to FIG. 3. Furthermore, in this embodiment, the antenna switching circuitry 68 includes an MTMEMS 14(3)(A) and an MTMEMS 14(3)(B). The MTMEMS 14(3)(A) is similar to the MTMEMS 14 shown in FIGS. 1 and 2, but in this embodiment, the integer M is equal to seven (7) and the MTMEMS 14(3)(A) includes a pole port 24(3)(A) and a set of throw ports (referred to generically as elements 22(3)(A), and specifically as elements 22(3)(A)-1 to 22(3)(A)-7). The pole port 24(3)(A) of the MTMEMS 14(3)(A) is coupled to the throw port 16(1)-2 of the MTSTS 12(1).

Additionally, the MTMEMS 14(3)(B) includes a pole port 24(3)(B) and a set of throw ports (referred to generically as elements 22(3)(B), and specifically as elements 22(3)(B)-CO, 22(3)(B)-1, 22(3)(B)-2, 22(3)(B)-3). Thus, the MTMEMS 14(3)(B) is the same as the MTMEMS 14 shown in FIGS. 1 and 2, where the integer M is equal to 4. In this embodiment, the pole port 24(3)(B) of the MTMEMS 14(3)(B) is coupled to the throw port 16(1)-3 of the MTSTS 12(1). The MTMEMS 14(3)(A) is configured to selectively couple the pole port 24(3)(A) to any one of the throw ports 22(3)(A) in the same manner as described above with respect to the MTMEMS 14 of FIG. 1. Similarly, the MTMEMS 14(3)(B) is configured to selectively couple the pole port 24(3)(B) to any one of the throw ports 22(3)(B) in the same manner as described above with respect to the MTMEMS 14 shown in FIGS. 1 and 2.

The antenna switching circuitry 68 also includes the control circuit 46 described above with respect to FIG. 2. In this embodiment, the MEMS subcontroller 58 is configured to generate a switch control output 50(5) and a switch control output 50(6) in response to the MEMS switch control mode output 64(3). The switch control output 50(5) is analogous to the switch control output 50 described above with respect to FIG. 2, and operates to selectively couple the pole port 24(3)(A) of the MTMEMS 14(3)(A) to one of the throw ports 22(3)(A). The switch control output 50(6) is also analogous to the switch control output 50 described above with respect to FIG. 2, and is operable to selectively couple the pole port 24(3)(B) of the MTMEMS 14(3)(B) to one of the throw ports 22(3)(B). Like the throw ports 22(1)(A) of the MTMEMS 14(1)(A) shown in FIG. 3, the throw ports 22(3)(A)-1, 22(3)(A)-2, 22(3)(A)-3, 22(3)(A)-4, 22(3)(A)-5, 22(3)(A)-6, each receive the RF transmission signals TXTDD1, TXTDD2, TXTDD3, TXTDD4, TXTDD5, and TXTDD6, respectively. Also, like the throw ports 22(1)(B) of the MTMEMS 14(1)(B) in FIG. 3, the throw ports 22(3)(B)-1, 22(3)(B)-2, 22(3)(B)-3 of the MTMEMS 14(3)(B) transmit the RF receive signals RXTDD1, RXTDD2, RXTDD3. The control circuit 46 is operable in the LTE-TDD mode described above, where the throw ports 22(3)(A)-1, 22(3)(A)-2, 22(3)(A)-3, 22(3)(A)-4, 22(3)(A)-5, 22(3)(A)-6 correspond to the throw ports 22(2)(A)-1, 22(2)(A)-2, 22(2)(A)-3, 22(2)(A)-4, 22(2)(A)-5, 22(2)(A)-6 in FIG. 3, respectively. Also, with regard to the LTE-TDD mode, the throw ports 22(3)(B)-1, 22(3)(B)-2, 22(3)(B)-3 correspond to the throw ports 22(2)(B)-1, 22(2)(B)-2, 22(2)(B)-3 in FIG. 3, respectively.

Similar to the MTMEMS 14(1)(B) in FIG. 3, the throw port 22(3)(A)-7 of the MTMEMS 14(3)(A) of FIG. 5 is operable to receive the RF transmission signal TXFDD7 from RF transceiver circuitry (not shown) and transmit the RF receive signal RXFDD7 to the RF transceiver circuitry. The control circuit 46 is thus operable in the LTE-FDD mode described above with respect to FIG. 3. However, in this embodiment, the MTMEMS 14(3)(B) further includes a throw port 22(3)(B)-CO. The throw port 22(3)(B)-CO is directly connected to the throw port 22(3)(A)-7 of the MTMEMS 14(3)(C). The throw port 22(3)(B)-CO is coupled to receive an RF receive signal RXTDD-CO, which is formatted in accordance with an LTE-TDD specification. Accordingly, in this embodiment, LTE-FDD signals and LTE-TDD signals have been co-banded and thus may utilize the some or all of the same circuitry in the RF transceiver circuitry (not shown). More specifically, the RF transmission signal TXFDD7 and the RF receive signal RXFDD7 are co-banded with the RF receive signal RXTDD-CO. While the control circuit 46 is in the LTE-FDD mode, the control circuit 46 controls the selective coupling of the MTSTS 12(1) such that the pole port 18(1) is selectively coupled to the throw port 16(1)-2 of the MTSTS 12(1). In addition, the control circuit 46 controls the selective coupling of the MTMEMS 14(3)(A) such that the pole port 24(3)(A) is selectively coupled to the throw port 22(3)(A)-7. As such, while the control circuit 46 is in the LTE-FDD mode, the RF receive signal RXFDD7 may be received, and the RF transmission signal TXFDD7 may be transmitted, simultaneously by the antenna ANT1 at the antenna port 20.

On the other hand, in another LTE-TDD mode corresponding to the RF receive signal RXTDD-CO, the control circuit 46 controls the selective coupling of the MTMEMS 14(3)(B) such that the pole port 24(3)(B) is selectively coupled to the throw port 22(3)(B)-CO. In addition, the control circuit 46 controls the selective coupling of the MTSTS 12(1) such that the pole port 18(1) is selectively coupled to the throw port 16(1)-3 of the MTSTS 12(1) during each of the time slots for the RF receive signal RXTDD-CO. Thus, the antenna ANT1, the antenna port 20, the pole port 18(1), and the throw port 22(3)(B)-CO are selectively coupled by the control circuit 46, and the RF receive signal RXTDD-CO may be received by the antenna ANT1 at the antenna port 20 during each of the time slots for reception of the RF receive signal RXTDD-CO. Also, outside of each of the time slots for reception of the RF receive signal RXTDD-CO, the control circuit 46 decouples the throw port 16(1)-3 form the pole port 18(1).

Referring now to FIGS. 6, 6A, and 6B, FIG. 6 illustrates exemplary RF front-end circuitry that includes another embodiment of antenna switching circuitry 70. The antenna switching circuitry 70 is RF front-end circuitry, which may be provided within an RF front-end module. As shown in FIG. 6A, the antenna switching circuitry 70 includes the MTMEMS 14(2)(A) and the MTMEMS 14(2)(B) formed on the substrate 42 shown in FIG. 4, but also includes an MTMEMS 14(1)(C), which is also formed on the substrate 42. In this embodiment, the antenna switching circuitry 70 includes front-end switching circuitry 72, which is illustrated in FIG. 6B. The front-end switching circuitry 72 includes the MTSTS 12(1) described above with respect to FIGS. 3-5, but also includes an MTSTS 12(2). The front-end switching circuitry is formed with the semiconductor substrate 40.

With regard to the front-end switching circuitry 72 shown in FIG. 6B, the front-end switching circuitry 72 is configured to selectively couple one or more RF transceiver ports to the antenna port 20 and one or more RF transceiver ports to an antenna port 20'. The MTSTS 12(1) of the front-end switching circuitry 72 is the same as described above with respect to FIGS. 3-5. Additionally, the MTSTS 12(2) of the front-end switching circuitry 72 is configured to selectively couple a pole port 18(2) to any one of a set of throw ports (referred to generically as elements 16(2), and specifically as elements 16(2)-1, 16(2)-2, 16(2)-3, 16(2)-N−1, 16(2)-N). The pole port 18(2) is coupled to the antenna port 20', and the antenna port 20' is coupled to an antenna ANT2.

In this embodiment, the RF ports are the throw ports 16(1) of the MTSTS 12(1) and the throw ports 16(2) of the MTSTS 12(2). In alternative embodiments, the throw ports 16(1) and the throw ports 16(2) may each be coupled to RF ports, rather than being the RF ports. Also, in alternative embodiments, the pole port 18(1) may be the antenna port 20, rather than being coupled to the antenna port 20. Similarly, in alternative embodiments, the pole port 18(2) may be the antenna port 20', rather than being coupled to the antenna port 20'.

As shown in FIG. 6B, the antenna port 20 in this embodiment may only be coupled to one set of RF ports (in this example, the throw ports 16(1)), while the antenna port 20' may only be coupled to a different set of RF ports (in this example, the throw ports 16(2)). The antenna switching circuitry 70 further includes the MTMEMS 14(2)(A) and the MTMEMS 14(2)(B) described above with respect to FIG. 4. Thus, like the antenna switching circuitry 66 shown in FIG. 4, the throw ports 22(2)(A)-1, 22(2)(A)-2, 22(2)(A)-3, 22(2)(A)-4, 22(2)(A)-5, 22(2)(A)-6 each receive the RF transmission signals TXTDD1, TXTDD2, TXTDD3, TXTDD4, TXTDD5, and TXTDD6, respectively. Also like the antenna switching circuitry 66 in FIG. 4, the throw ports 22(2)(B)-ADD, 22(2)(B)-1, 22(2)(B)-2, 22(2)(B)-3 of the MTMEMS 14(2)(B) transmit the RF receive signals RXFDD7, RXTDD1, RXTDD2, RXTDD3 to RF transceiver circuitry (not shown). The throw port 22(2)(B)-ADD also receives the RF transmission signal TXFDD7 from the RF transceiver circuitry, as discussed above.

The MTMEMS 14(1)(C) includes a set of throw ports (referred to generically as elements 22(1)(C), and specifically as elements 22(1)(C)-1, 22(1)(C)-2, 22(1)(C)-3, and 22(1)(C)-4) and a pole port 24(1)(C). The throw ports 22(1)(C)-1, 22(1)(C)-2, 22(1)(C)-3, 22(1)(C)-4 of the MTMEMS 14(1)(C) transmit RF receive signals RXMIMO1, RXMIMO2, RXMIMO3, RXMIMO4 to the RF transceiver circuitry (not shown). Each of the RF receive signals RXMIMO1, RXMIMO2, RXMIMO3, RXMIMO4 is a secondary receive MIMO signal, and each is each formatted in accordance with one or more RF MIMO specifications.

The front-end switching circuitry 72 is configured such that the antenna port 20' may only be selectively coupled to a proper subset of the RF transceiver ports. In this example, the proper subset of the RF transceiver ports is coupled to the throw ports 22(1)(C) of the MTMEMS 14(1)(C). In this embodiment, the throw port 16(2)-2 is coupled to the pole port 24(1)(C) of the MTMEMS 14(1)(C). Accordingly, the antenna port 20' and the antenna ANT2 are selectively coupled to the pole port 24(1)(C) of the MTMEMS 14(1)(C) when the pole port 18(2) is selectively coupled to the throw port 16(2)-2. The MTMEMS 14(1)(C) is configured to selectively couple any one of the throw ports 22(1)(C) to the pole port 24(1)(C). The MTMEMS 14(1)(C) is also configured to decouple the pole port 24(1)(C) from all of the throw ports 22(1)(C). In this embodiment, the pole port 18(2), the antenna port 20', and the antenna ANT2 are selectively coupled to the throw port 22(1)(C)-1 of the MTMEMS 14(1)(C) when the pole port 18(2) is selectively coupled to the throw port 16(2)-2 and when the pole port 24(1)(C) is selectively coupled to the throw port 22(1)(C)-1. In this case, the RF receive signal RXMIMO1 may be received by the antenna ANT2 at the antenna port 20' so as to be transmitted from the throw port 22(1)(C)-1 to a MIMO receiver chain in the RF transceiver circuitry.

Also, the pole port 18(2), the antenna port 20', and the antenna ANT2 are selectively coupled to the throw port 22(1)(C)-2 of the MTMEMS 14(1)(C) when the pole port 18(2) is selectively coupled to the throw port 16(2)-2 and when the pole port 24(1)(C) is selectively coupled to the throw port 22(1)(C)-2. In this case, the RF receive signal RXMIMO2 may be received by the antenna ANT2 at the antenna port 20' so as to be transmitted from the throw port 22(1)(C)-2 to a MIMO receiver chain in the RF transceiver circuitry. Additionally, the pole port 18(2), the antenna port 20', and the antenna ANT2 are selectively coupled to the throw port 22(1)(C)-3 of the MTMEMS 14(1)(C) when the pole port 18(2) is selectively coupled to the throw port 16(2)-2 and when the pole port 24(1)(C) is selectively coupled to the throw port 22(1)(C)-3. In this case, the RF receive signal RXMIMO3 may be received by the antenna ANT2 at the antenna port 20' so as to be transmitted from the throw port 22(1)(C)-3 to a MIMO receiver chain in the RF transceiver circuitry. Finally, the pole port 18(2), the antenna port 20', and the antenna ANT2 are selectively coupled to the throw port 22(1)(C)-4 of the MTMEMS 14(1)(C) when the pole port 18(2) is selectively coupled to the throw port 16(2)-2 and when the pole port 24(1)(C) is selectively coupled to the throw port 22(1)(C)-4. In this case, the RF receive signal RXMIMO4 may be received by the antenna ANT2 at the antenna port 20' so as to be transmitted from the throw port 22(1)(C)-4 to a MIMO receiver chain in the RF transceiver circuitry.

Referring again to FIGS. 6, 6A, and 6B, the antenna switching circuitry 70 also includes the control circuit 46, and is operable in the LTE-TDD mode and the LTE-RDD mode described above with respect to FIG. 4. As described above, the transistor switch subcontroller 56 generates the switch control output 48(1) in accordance with the transistor switch control mode output 62. In addition, the transistor switch subcontroller 56 also generates a switch control output 48(2) in accordance with the transistor switch control mode output 62. The MTSTS 12(2) is configured to selectively couple the pole port 18(2) to the throw ports 16(2) in accordance with the switch control output 48(2). The switch control output 48(2) is thus also analogous to the switch control output 48 described above with respect to FIG. 2.

The MEMS subcontroller 58 is configured to generate the switch control output 50(3) (described above with respect to FIG. 4), the switch control output 50(4) (described above with respect to FIG. 4), and a switch control output 50(MIMO) in response to the MEMS switch control mode output 64. The switch control output 50(MIMO) is analogous to the switch control output 50 described above with respect to FIG. 2, and operates to selectively couple the pole port 24(1)(C) of the MTMEMS 14(1)(C) to one of the throw ports 22(1)(C).

Like the MTMEMS 14(2)(A) shown in FIG. 4, the throw ports 22(2)(A)-1, 22(2)(A)-2, 22(2)(A)-3, 22(2)(A)-4, 22(2)(A)-5, and 22(2)(A)-6 each receive the RF transmission signals TXTDD1, TXTDD2, TXTDD3, TXTDD4, TXTDD5, and TXTDD6, respectively. Also, like the MTMEMS 14(2)(B) of FIG. 4, the throw ports 22(2)(B)-1, 22(2)(B)-2, 22(2)(B)-3 of the MTMEMS 14(1)(B) transmit the RF receive signals RXTDD1, RXTDD2, and RXTDD3. Furthermore, the throw port 22(2)(B)-ADD transmits the RF receive signal RXFDD7 and receives the RF transmission signal TXFDD7. As previously discussed, the control circuit 46 is operable in an LTE-TDD mode, which is implemented in the same manner as the LTE-TDD mode is implemented in the control circuit 46 described above with respect to FIG. 4. The control circuit 46 is also operable in an LTE-FDD mode, which is implemented in the same manner as the LTE-FDD mode is implemented in the control circuit 46 described above with respect to FIG. 4.

Additionally, the control circuit 46 is operable in an LTE-MIMO mode. While the control circuit 46 is in the LTE-MIMO mode, the control circuit 46 controls the selective coupling of the MTSTS 12(1) such that the pole port 18(1) is selectively coupled to the throw port 16(1)-2 of the MTSTS 12(1). In addition, the control circuit 46 controls the selective coupling of the MTSTS 12(2) such that the pole port 18(2) is selectively coupled to the throw port 16(2)-2 of the MTSTS 12(2). With regard to the MTMEMS 14(2)(A), the control circuit 46 decouples the pole port 24(2)(A) from all of the throw ports 22(2)(A) while the control circuit 46 is in the LTE-MIMO mode. In addition, the control circuit 46 controls the selective coupling of the MTMEMS 14(2)(B) such that the pole port 24(2)(B) is selectively coupled to the throw port 22(2)(B)-2 and controls the selective coupling of the MTMEMS 14(1)(C) such that the pole port 24(1)(C) is selectively coupled to the throw port 22(1)(C)-2. As such, while the control circuit 46 is in the LTE-MIMO mode, the RF receive signal RXTDD2 may be received by the antenna ANT1 and the RF receive signal RXMIMO2 may be received by the antenna ANT2 simultaneously.

FIG. 7 illustrates exemplary RF front-end circuitry that includes another embodiment of antenna switching circuitry 74, along with the antenna port 20, the antenna ANT1, the antenna port 20', and the antenna ANT2. The antenna switching circuitry 74 includes front-end switching circuitry 75, a first diplexer 76A, and a second diplexer 76B. The front-end switching circuitry 75 includes low band switching circuitry 78, high band switching circuitry 80, low band antenna selection circuitry 82, and high band antenna selection circuitry 84. FIG. 7A illustrates that the antenna switching circuitry 74 includes the MTMEMS 14(1)(A) and the MTMEMS 14(1)(B) described above with respect to FIG. 3.

Referring now to FIG. 7 and FIG. 7B, FIG. 7B illustrates embodiments of the low band switching circuitry 78 and the high band switching circuitry 80 shown in FIG. 7. The low band switching circuitry 78 is an MTSTS and includes a pole port 86 and a set of throw ports (referred to generically as elements 88, and specifically as elements 88-1, 88-2, 88-3, 88-4, 88-5). In this example, the low band switching circuitry 78 only has the pole port 86, and is therefore an SPMTSTS. The low band switching circuitry 78 is configured to selectively couple the pole port 86 to any one of the throw ports 88. With regard to the high band switching circuitry 80, the high band switching circuitry 80 is also an MTSTS and includes a pole port 90 and a set of throw ports (referred to generically as elements 92, and specifically as elements 92-1, 92-2, 92-3, 92-4, 92-5). In this example, the high band switching circuitry 80 only has the pole port 90, and is therefore also an SPMTSTS. The high band switching circuitry 80 is configured to selectively couple the pole port 90 to any one of the throw ports 92.

Referring now to FIG. 7 and FIG. 7C, FIG. 7C illustrates embodiments of the low band antenna selection circuitry 82 and the high band antenna selection circuitry 84 shown in FIG. 7. The low band switching circuitry 78 (shown in FIG. 7B) is coupled to the low band antenna selection circuitry 82. The low band antenna selection circuitry 82 is coupled to both the antenna port 20 (and thus the antenna ANT1) and the antenna port 20' (and thus the antenna ANT2). The low band antenna selection circuitry 82 is configured to selectively couple the low band switching circuitry 78 to any one of the antenna ports 20, 20', and thus also to any one of the antennas ANT1, ANT2. In this embodiment, the low band antenna selection circuitry 82 includes an MTSTS, which in this example is an MPMTSTS). More specifically, the MPMTSTS is a double pole (DP) MTSTS.

Accordingly, the low band antenna selection circuitry 82 has a pole port 94 and a pole port 96. The low band antenna selection circuitry 82 also includes a set of throw ports (referred to generically as elements 98, and specifically as elements 98-1, 98-2, 98-3, 98-4) and a set of throw ports (referred to generically as elements 100, and specifically as elements 100-1, 100-2, 100-3, 100-4). The low band antenna selection circuitry 82 is configured to selectively couple the pole port 94 to any one of the throw ports 98. The low band antenna selection circuitry 82 is also configured to selectively couple the pole port 96 to any one of the throw ports 100.

The first diplexer 76A is coupled between the antenna port 20 (and the antenna ANT1) and the front-end switching circuitry 75. More specifically, the first diplexer 76A includes a common port I1 coupled to the antenna port 20, a low band port 101LA coupled to the pole port 94, and a high band port 101HA coupled to the pole port 102. The second diplexer 76B is coupled between the antenna port 20' (and the antenna ANT2) and the front-end switching circuitry 75. More specifically, the second diplexer 76B includes a common port I2 coupled to the antenna port 20', a low band port 101LB coupled to the pole port 96, and a high band port 101HB coupled to the pole port 104.

With regard to the throw ports 98, 100, each of the throw ports 98 is directly connected to a different throw port 100 of the low band antenna selection circuitry 82. More specifically, the throw port 98-1 is directly connected to the throw port 100-1. The throw port 98-2 is directly connected to the throw port 100-2. The throw port 98-3 is directly connected to the throw port 100-3. The throw port 98-4 is directly connected to the throw port 100-4. The DPMTSTS is thus an intermediate DPMTSTS (IDPMTSTS). As shown in FIGS. 7B and 7C, the pole port 86 of the low band switching circuitry 78 is coupled to both the throw port 98-2 in the set of throw ports 98 of the IDPMTSTS in the low band antenna selection circuitry 82 and the throw port 100-2 of the set of throw ports 100 of the IDPMTSTS in the low band antenna selection circuitry 82. Accordingly, the pole port 86 of the low band switching circuitry 78 is selectively coupled to the low band port 101LA, the antenna ANT1, and the antenna port 20 when the pole port 94 is selectively coupled to the throw port 98-2. The throw port 88-1 is selectively coupled to the pole port 94, the low band port 101LA, the antenna ANT1, and the antenna port 20 when the pole port 86 is selectively coupled to the throw port 88-1 and the pole port 94 is selectively coupled to the throw port 98-2. The throw port 88-2 is selectively coupled to the pole port 94, the low band port 101LA, the antenna ANT1, and the antenna port 20 when the pole port 86 is selectively coupled to the throw port 88-2 and the pole port 94 is selectively coupled to the throw port 98-2. The throw port 88-3 is selectively coupled to the pole port 94, the low band port 101LA, the antenna ANT1, and the antenna port 20 when the pole port 86 is selectively coupled to the throw port 88-3 and the pole port 94 is selectively coupled to the throw port 98-2. The throw port 88-4 is selectively coupled to the pole port 94, the low band port 101LA, the antenna ANT1, and the antenna port 20 when the pole port 86 is selectively coupled to the throw port 88-4 and the pole port 94 is selectively coupled to the throw port 98-2.

Referring again to FIGS. 7B and 7C, the pole port 86 of the low band switching circuitry 78 is selectively coupled to the low band port 101LB, the antenna ANT2, and the antenna port 20' when the pole port 96 is selectively coupled to the throw port 100-2. The throw port 88-1 is selectively coupled to the pole port 96, the low band port 101LB, the antenna ANT2, and the antenna port 20' when the pole port 86 is selectively coupled to the throw port 88-1 and the pole port 96 is selectively coupled to the throw port 100-2. The throw port 88-2 is selectively coupled to the pole port 96, the low band port 101LB, the antenna ANT2, and the antenna port 20' when the pole port 86 is selectively coupled to the throw port 88-2 and the pole port 96 is selectively coupled to the throw port 100-2. The throw port 88-3 is selectively coupled to the pole port 96, the low band port 101LB, the antenna ANT2, and the antenna port 20' when the pole port 86 is selectively coupled to the throw port 88-3 and the pole port 96 is selectively coupled to the throw port 100-2. The throw port 88-4 is selectively coupled to the pole port 96, the low band port 101LB, the antenna ANT2, and the antenna port 20' when the pole port 86 is selectively coupled to the throw port 88-4 and the pole port 96 is selectively coupled to the throw port 100-2.

As a result, the throw ports 88 of the low band switching circuitry 78 may each be coupled to just the antenna port 20 (and thus the antenna ANT1), just the antenna port 20' (and thus the antenna ANT2), or both the antenna port 20 and the antenna port 20' simultaneously (and thus both the antenna ANT1 and the antenna ANT2 simultaneously). For instance, when one of the throw ports 88 is selectively coupled to the pole port 86 of the low band switching circuitry 78, the pole port 94 may be selectively coupled to the throw port 98-2 of the low band antenna selection circuitry 82 while the pole port 96 is decoupled from the throw port 100-2 of the low band antenna selection circuitry 82. In this case, the one of the throw ports 88 is selectively coupled to the antenna port 20, the low band port 101LA, and the antenna ANT1, but is decoupled from the low band port 101LB, antenna port 20', and the antenna ANT2. When one of the throw ports 88 is selectively coupled to the pole port 86 of the low band switching circuitry 78, the pole port 94 may be decoupled from the throw port 98-2 of the low band antenna selection circuitry 82 while the pole port 96 is selectively coupled to the throw port 100-2 of the low band antenna selection circuitry 82. In this case, the one of the throw ports 88 is selectively coupled to the antenna port 20', the low band port 101LB, and the antenna ANT2, but is decoupled from the antenna port 20, the low band port 101LA, and the antenna ANT1. When one of the throw ports 88 is selectively coupled to the pole port 86 of the low band switching circuitry 78, the pole port 94 may be selectively coupled to the throw port 98-2 of the low band antenna selection circuitry 82 and the pole port 96 may be selectively coupled to the throw port 100-2 of the low band antenna selection circuitry 82 simultaneously. In this case, the one of the throw ports 88 is selectively coupled simultaneously to the low band port 101LB, the antenna port 20', the antenna ANT2, the low band port 101LA, the antenna port 20, and the antenna ANT1.

Referring again to FIGS. 7, 7B, and 7C, the high band switching circuitry 80 is coupled to the high band antenna selection circuitry 84. The high band antenna selection circuitry 84 is coupled to both the antenna port 20 (and thus the antenna ANT1) and the antenna port 20' (and thus the antenna ANT2). The high band antenna selection circuitry 84 is configured to selectively couple the high band switching circuitry 80 to any one of the antenna ports 20, 20', and thus also to any one of the antennas ANT1, ANT2.

The high band antenna selection circuitry 84 includes an MTSTS, which in this example is an MPMTSTS. More specifically, the MPMTSTS is a DPMTSTS. Accordingly, the high band antenna selection circuitry 84 has a pole port 102 and a pole port 104. The high band antenna selection circuitry 84 also includes a set of throw ports (referred to generically as elements 106, and specifically as elements 106-1, 106-2, 106-3, 106-4) and a set of throw ports (referred to generically as elements 108, and specifically as elements 108-1, 108-2, 108-3, 108-4). The high band antenna selection circuitry 84 is configured to selectively couple the pole port 102 to any one of the throw ports 106. The high band antenna selection circuitry 84 is also configured to selectively couple the pole port 104 to any one of the throw ports 108. The pole port 102 of the high band antenna selection circuitry 84 is coupled to the high band port 101HA of the first diplexer 76A, while the pole port 104 of the high band antenna selection circuitry 84 is coupled to the high band port 101HB of the second diplexer 76B.

In this embodiment, each of the throw ports 106 is directly connected to a different one of the throw ports 108 of the high band antenna selection circuitry 84. More specifically, the throw port 106-1 is directly connected to the throw port 108-1. The throw port 106-2 is directly connected to the throw port 108-2. The throw port 106-3 is directly connected to the throw port 108-3. The throw port 106-4 is directly connected to the throw port 108-4. The DPMTSTS is thus an IDPMTSTS. The pole port 90 of the high band switching circuitry 80 (FIG. 7B) is coupled to both the throw port 106-2 in the set of throw ports 106 in the high band antenna selection circuitry 84 and the throw port 108-2 of the set of throw ports 108 of the high band antenna selection circuitry 84. Accordingly, the pole port 90 of the high band switching circuitry 80 is selectively coupled to the antenna ANT1 and the antenna port 20 when the pole port 102 is selectively coupled to the throw port 106-2. The throw port 92-1 is selectively coupled to the pole port 102, the high band port 101HA, the antenna ANT1, and the antenna port 20 when the pole port 90 is selectively coupled to the throw port 92-1 and the pole port 102 is selectively coupled to the throw port 106-2. The throw port 92-2 is selectively coupled to the pole port 102, the high band port 101HA, the antenna ANT1, and the antenna port 20 when the pole port 90 is selectively coupled to the throw port 92-2 and the pole port 102 is selectively coupled to the throw port 106-2. The throw port 92-3 is selectively coupled to the pole port 102, the high band port 101HA, the antenna ANT1, and the antenna port 20 when the pole port 90 is selectively coupled to the throw port 92-3 and the pole port 102 is selectively coupled to the throw port 106-2. The throw port 92-4 is selectively coupled to the pole port 102, the high band port 101HA, the antenna ANT1, and the antenna port 20 when the pole port 90 is selectively coupled to the throw port 92-4 and the pole port 102 is selectively coupled to the throw port 106-2.

Additionally, the pole port 90 of the high band switching circuitry 80 is selectively coupled to the antenna ANT2 and the antenna port 20' when the pole port 104 of the high band antenna selection circuitry 84 is selectively coupled to the throw port 108-2. The throw port 92-1 is selectively coupled to the pole port 104, the high band port 101HB, the antenna ANT2, and the antenna port 20' when the pole port 90 is selectively coupled to the throw port 92-1 and the pole port 104 is selectively coupled to the throw port 108-2. The throw port 92-2 is selectively coupled to the pole port 104, the high band port 101HB, the antenna ANT2, and the antenna port 20' when the pole port 90 is selectively coupled to the throw port 92-2 and the pole port 104 is selectively coupled to the throw port 108-2. The throw port 92-3 is selectively coupled to the pole port 104, the high band port 101HB, the antenna ANT2, and the antenna port 20' when the pole port 90 is selectively coupled to the throw port 92-3 and the pole port 104 is selectively coupled to the throw port 108-2. The throw port 92-4 is selectively coupled to the pole port 104, the high band port 101HB, the antenna ANT2, and the antenna port 20' when the pole port 90 is selectively coupled to the throw port 92-4 and the pole port 104 is selectively coupled to the throw port 108-2.

As a result, the throw ports 92 of the high band switching circuitry 80 may each be coupled to just the antenna port 20 (and thus the antenna ANT1), just the antenna port 20' (and thus the antenna ANT2), or both the antenna port 20 and the antenna port 20' simultaneously (and thus both the antenna ANT1 and the antenna ANT2 simultaneously). For instance, when one of the throw ports 92 is selectively coupled to the pole port 90 of the high band switching circuitry 80, the pole port 102 may be selectively coupled to the throw port 106-2 of the high band antenna selection circuitry 84 while the pole port 104 is decoupled from the throw port 108-2 of the high band antenna selection circuitry 84. In this case, the one of the throw ports 92 is selectively coupled to the high band port 101HA, the antenna port 20, and the antenna ANT1, but is decoupled from the high band port 101HB, the antenna port 20', and the antenna ANT2. When one of the throw ports 92 is selectively coupled to the pole port 90 of the high band switching circuitry 80, the pole port 102 may be decoupled from the throw port 106-2 of the high band antenna selection circuitry 84 while the pole port 104 is selectively coupled to the throw port 108-2 of the high band antenna selection circuitry 84. In this case, the one of the throw ports 92 is selectively coupled to the high band port 101HB, the antenna port 20', and the antenna ANT2, but is decoupled from the high band port 101HA, the antenna port 20, and the antenna ANT1. When one of the throw ports 92 is selectively coupled to the pole port 90 of the high band switching circuitry 80, the pole port 102 may be selectively coupled to the throw port 106-2 of the high band antenna selection circuitry 84 and the pole port 104 may be simultaneously selectively coupled to the throw port 108-2 of the high band antenna selection circuitry 84. In this case, the one of the throw ports 92 is selectively coupled to the high band port 101HB, the antenna port 20', the antenna ANT2, the high band port 101HA, the antenna port 20, and the antenna ANT1 simultaneously.

With regard to the other throw ports 98-1, 98-3, 98-4 in the set of throw ports 98 of the low band antenna selection circuitry 82 and the other throw ports 100-1, 100-3, 100-4 in the set of throw ports 100 of the low band antenna selection circuitry 82, the front-end switching circuitry 75 illustrated in FIGS. 7, 7A, 7B, and 7C has RF ports RFLB1, RFLB2, and RFLB3. More specifically, the RF port RFLB1 is coupled to the throw port 98-1 and to the throw port 100-1 of the low band antenna selection circuitry 82. As a result, the RF port RFLB1 may be coupled to just the antenna port 20 (and thus the antenna ANT1), just the antenna port 20' (and thus the antenna ANT2), or both the antenna port 20 and the antenna port 20' simultaneously (and thus both the antenna ANT1 and the antenna ANT2 simultaneously). For instance, the pole port 94 may be selectively coupled to the throw port 98-1 of the low band antenna selection circuitry 82 while the pole port 96 is decoupled from the throw port 100-1 of the low band antenna selection circuitry 82. In this case, the RF port RFLB1 is selectively coupled to the low band port 101LA, the antenna port 20, and the antenna ANT1, but is decoupled from the low band port 101LB, the antenna port 20', and the antenna ANT2. Also, the pole port 96 may be selectively coupled to the throw port 100-1 of the low band antenna selection circuitry 82 while the pole port 94 is decoupled from the throw port 98-1 of the low band antenna selection circuitry 82. In this case, the RF port RFLB1 is selectively coupled to the low band port 101LB, the antenna port 20', and the antenna ANT2, but is decoupled from the low band port 101LA, the antenna port 20, and the antenna ANT1. Further, the pole port 94 may be selectively coupled to the throw port 98-1 of the low band antenna selection circuitry 82 and the pole port 96 may be selectively coupled to the throw port 100-1 of the low band antenna selection circuitry 82 simultaneously. In this case, the RF port RFLB1 is selectively coupled simultaneously to the low band port 101LB, the antenna port 20', the antenna ANT2, the low band port 101LA, the antenna port 20, and the antenna ANT1. The RF port RFLB1 may be a terminal, a contact, a node, and/or the like.

The RF port RFLB2 is coupled to the throw port 98-3 and to the throw port 100-3 of the low band antenna selection circuitry 82. As a result, the RF port RFLB2 may be coupled to just the antenna port 20 (and thus the antenna ANT1), just the antenna port 20' (and thus the antenna ANT2), or both the antenna port 20 and the antenna port 20' simultaneously (and thus both the antenna ANT1 and the antenna ANT2 simultaneously). For instance, the pole port 94 may be selectively coupled to the throw port 98-3 of the low band antenna selection circuitry 82 while the pole port 96 is decoupled from the throw port 100-3 of the low band antenna selection circuitry 82. In this case, the RF port RFLB2 is selectively coupled to the low band port 101LA, the antenna port 20, and the antenna ANT1, but is decoupled from the low band port 101LB, the antenna port 20', and the antenna ANT2. Also, the pole port 96 may be selectively coupled to the throw port 100-3 of the low band antenna selection circuitry 82 while the pole port 94 is decoupled from the throw port 98-3 of the low band antenna selection circuitry 82. In this case, the RF port RFLB2 is selectively coupled to the low band port 101LB, the antenna port 20', and the antenna ANT2, but is decoupled from the low band port 101LA, the antenna port 20, and the antenna ANT1. Further, the pole port 94 may be selectively coupled to the throw port 98-3 of the low band antenna selection circuitry 82 and the pole port 96 may be selectively coupled to the throw port 100-3 of the low band antenna selection circuitry 82 simultaneously. In this case, the RF port RFLB2 is selectively coupled simultaneously to the low band port 101LA, the low band port 101LB, the antenna port 20', the antenna ANT2, the antenna port 20, and the antenna ANT1. The RF port RFLB2 may be a terminal, a contact, a node, and/or the like.

Additionally, the RF port RFLB3 is coupled to the throw port 98-4 and to the throw port 100-4 of the low band antenna selection circuitry 82. As a result, the RF port RFLB3 may be coupled to just the antenna port 20 (and thus the antenna ANT1), just the antenna port 20' (and thus the antenna ANT2), or both the antenna port 20 and the antenna port 20' simultaneously (and thus both the antenna ANT1 and the antenna ANT2 simultaneously). For instance, the pole port 94 may be selectively coupled to the throw port 98-4 of the low band antenna selection circuitry 82 while the pole port 96 is decoupled from the throw port 100-4 of the low band antenna selection circuitry 82. In this case, the RF port RFLB3 is selectively coupled to the low band port 101LA, the antenna port 20, and the antenna ANT1, but is decoupled from the low band port 101LB, the antenna port 20', and the antenna ANT2. Also, the pole port 96 may be selectively coupled to the throw port 100-4 of the low band antenna selection circuitry 82 while the pole port 94 is decoupled from the throw port 98-4 of the low band antenna selection circuitry 82. In this case, the RF port RFLB2 is selectively coupled to the low band port 101LB, the antenna port 20', and the antenna ANT2, but is decoupled from the low band port 101LA, the antenna port 20, and the antenna ANT1. Further, the pole port 94 may be selectively coupled to the throw port 98-4 of the low band antenna selection circuitry 82 and the pole port 96 may be selectively coupled to the throw port 100-4 of the low band antenna selection circuitry 82 simultaneously. In this case, the RF port RFLB3 is selectively coupled simultaneously to the low band port 101LB, the antenna port 20', the antenna ANT2, the low band port 101LA, the antenna port 20, and the antenna ANT1. The RF port RFLB3 may be a terminal, a contact, a node, and/or the like.

With regard to the other throw ports 106-1, 106-3, 106-4 in the set of throw ports 106 of the high band antenna selection circuitry 84, and the other throw ports 108-1, 108-3, 108-4 in the set of throw ports 106 of the high band antenna selection circuitry 84, the front-end switching circuitry 75 illustrated in FIGS. 7, 7B, and 7C has RF ports RFHB1, RFHB2, and RFHB3. More specifically, the RF port RFHB1 is coupled to the throw port 106-1 and to the throw port 108-1 of the high band antenna selection circuitry 84. As a result, the RF port RFHB1 may be coupled to just the antenna port 20 (and thus the antenna ANT1), just the antenna port 20' (and thus the antenna ANT2), or both the antenna port 20 and the antenna port 20' simultaneously (and thus both the antenna ANT1 and the antenna ANT2 simultaneously). For instance, the pole port 102 may be selectively coupled to the throw port 106-1 of the high band antenna selection circuitry 84 while the pole port 104 is decoupled from the throw port 108-1 of the high band antenna selection circuitry 84. In this case, the RF port RFHB1 is selectively coupled to the high band port 101HA, the antenna port 20, and the antenna ANT1, but is decoupled from the high band port 101HB, the antenna port 20', and the antenna ANT2. Also, the pole port 104 may be selectively coupled to the throw port 108-1 of the high band antenna selection circuitry 84 while the pole port 102 is decoupled from the throw port 106-1 of the high band antenna selection circuitry 84. In this case, the RF port RFHB1 is selectively coupled to the high band port 101HB, the antenna port 20', and the antenna ANT2, but is decoupled from the high band port 101HA, the antenna port 20, and the antenna ANT1. Further, the pole port 102 may be selectively coupled to the throw port 106-1 of the high band antenna selection circuitry 84 and the pole port 104 may be selectively coupled to the throw port 108-1 of the high band antenna selection circuitry 84 simultaneously. In this case, the RF port RFHB1 is selectively coupled simultaneously to the high band port 101HB, the antenna port 20', the antenna ANT2, the high band port 101HA, the antenna port 20, and the antenna ANT1. The RF port RFHB1 may be a terminal, a contact, a node, and/or the like.

The RF port RFHB2 is coupled to the throw port 106-3 and to the throw port 108-3 of the high band antenna selection circuitry 84. As a result, the RF port RFHB2 may be coupled to just the antenna port 20 (and thus the antenna ANT1), just the antenna port 20' (and thus the antenna ANT2), or both the antenna port 20 and the antenna port 20' simultaneously (and thus both the antenna ANT1 and the antenna ANT2 simultaneously). For instance, the pole port 102 may be selectively coupled to the throw port 106-3 of the high band antenna selection circuitry 84 while the pole port 104 is decoupled from the throw port 108-3 of the high band antenna selection circuitry 84. In this case, the RF port RFHB2 is selectively coupled to the high band port 101HA, the antenna port 20, and the antenna ANT1, but is decoupled from the high band port 101HB, the antenna port 20', and the antenna ANT2. Also, the pole port 104 may be selectively coupled to the throw port 108-3 of the high band antenna selection circuitry 84 while the pole port 102 is decoupled from the throw port 106-3 of the high band antenna selection circuitry 84. In this case, the RF port RFHB2 is selectively coupled to the high band port 101HB, the antenna port 20', and the antenna ANT2, but is decoupled from the high band port 101HA, the antenna port 20, and the antenna ANT1. Further, the pole port 102 may be selectively coupled to the throw port 106-3 of the high band antenna selection circuitry 84 and the pole port 104 may be selectively coupled to the throw port 108-3 of the high band antenna selection circuitry 84 simultaneously. In this case, the RF port RFHB2 is selectively coupled simultaneously to the high band port 101HB, the antenna port 20', the antenna ANT2, the high band port 101HA, the antenna port 20, and the antenna ANT1. The RF port RFHB2 may be a terminal, a contact, a node, and/or the like.

Additionally, the RF port RFHB3 is coupled to the throw port 106-4 and to the throw port 108-4 of the high band antenna selection circuitry 84. As a result, the RF port RFHB3 may be coupled to just the antenna port 20 (and thus the antenna ANT1), just the antenna port 20' (and thus the antenna ANT2), or both the antenna port 20 and the antenna port 20' simultaneously (and thus both the antenna ANT1 and the antenna ANT2 simultaneously). For instance, the pole port 102 may be selectively coupled to the throw port 106-4 of the high band antenna selection circuitry 84 while the pole port 104 is decoupled from the throw port 108-4 of the high band antenna selection circuitry 84. In this case, the RF port RFHB3 is selectively coupled to the high band port 101HA, the antenna port 20, and the antenna ANT1, but is decoupled from the high band port 101HB, the antenna port 20', and the antenna ANT2. Also, the pole port 104 may be selectively coupled to the throw port 108-4 of the high band antenna selection circuitry 84 while the pole port 102 is decoupled from the throw port 106-4 of the high band antenna selection circuitry 84. In this case, the RF port RFHB3 is selectively coupled to the high band port 101HB, the antenna port 20', and the antenna ANT2, but is decoupled from the high band port 101HA, the antenna port 20, and the antenna ANT1. Further, the pole port 102 may be selectively coupled to the throw port 106-4 of the high band antenna selection circuitry 84 and the pole port 104 may be selectively coupled to the throw port 108-4 of the high band antenna selection circuitry 84 simultaneously. In this case, the RF port RFHB3 is selectively coupled simultaneously to the high band port 101HB, the antenna port 20', the antenna ANT2, the high band port 101HA, the antenna port 20, and the antenna ANT1. The RF port RFHB3 may be a terminal, a contact, a node, and/or the like.

As shown in FIG. 7 and FIG. 7C, the antenna switching circuitry 74 may further include a plurality of directional couplers (referred to generically as elements 110, and specifically as elements 110LA, 110HA, 110LB, 110HB) that are configured to direct a signal flow of RF signals from the antenna ports 20, 20' (and thus the antennas ANT1, ANT2). The plurality of directional couplers 110 may be coupled between each of the ports 101LA, 101HA of the first diplexer 76A and the front-end switching circuitry 75, and between each of the ports 101LB, 101HB of the second diplexer 76B and the front-end switching circuitry 75. More specifically, the directional coupler 110LA is coupled between the pole port 94 of the low band antenna selection circuitry 82 and the low band port 101LA of the first diplexer 76A. A throw switch network TSN is operable to switch the signal flow of the directional coupler 110LA from a receive signal flow to a transmission signal flow and from the transmission signal flow to the receive signal flow. To receive from the antenna port 20 and the antenna ANT1, the throw switch network TSN operates the directional coupler 110LA so that the signal flow is set to the receive signal flow, thereby allowing signals to pass from the low band port 101LA and the antenna port 20 to the pole port 94. To transmit from the antenna port 20 and the antenna ANT, the throw switch network TSN operates the directional coupler 110LA so that the signal flow is set to the transmission signal flow, thereby allowing signals to pass from the pole port 94 to the low band port 101LA and the antenna port 20.

The directional coupler 110HA is coupled between the pole port 102 of the high band antenna selection circuitry 84 and the high band port 101HA of the first diplexer 76A. The throw switch network TSN is operable to switch the signal flow of the directional coupler 110HA from a receive signal flow to a transmission signal flow and from the transmission signal flow to the receive signal flow. To receive from the antenna port 20 and the antenna ANT1, the throw switch network TSN operates the directional coupler 110HA so that the signal flow is set to the receive signal flow, thereby allowing signals to pass from the high band port 101HA and the antenna port 20 to the pole port 102. To transmit from the antenna port 20 and the antenna ANT1, the throw switch network TSN operates the directional coupler 110HA so that the signal flow is set to the transmission signal flow, thereby allowing signals to pass from the pole port 102 to the high band port 101HA and the antenna port 20.

The directional coupler 110LB is coupled between the pole port 96 of the low band antenna selection circuitry 82 and the low band port 101LB of the second diplexer 76B. The throw switch network TSN is operable to switch the signal flow of the directional coupler 110LB from a receive signal flow to a transmission signal flow and from the transmission signal flow to the receive signal flow. To receive from the antenna port 20' and the antenna ANT2, the throw switch network TSN operates the directional coupler 110LB so that the signal flow is set to the receive signal flow, thereby allowing signals to pass from the low band port 101LB and the antenna port 20' to the pole port 96. To transmit from the antenna port 20' and the antenna ANT2, the throw switch network TSN operates the directional coupler 110LB so that the signal flow is set to the transmission signal flow, thereby allowing signals to pass from the pole port 96 to the low band port 101LB and the antenna port 20'.

The directional coupler 110HB is coupled between the pole port 104 of the high band antenna selection circuitry 84 and the high band port 101HB of the second diplexer 76B. The throw switch network TSN is operable to switch the signal flow of the directional coupler 110HB from a receive signal flow to a transmission signal flow and from the transmission signal flow to the receive signal flow. To receive from the antenna port 20' and the antenna ANT2, the throw switch network TSN operates the directional coupler 110HB so that the signal flow is set to the receive signal flow, thereby allowing signals to pass from the high band port 101HB and the antenna port 20' to the pole port 104. To transmit from the antenna port 20' and the antenna ANT2, the throw switch network TSN operates the directional coupler 110HB so that the signal flow is set to the transmission signal flow, thereby allowing signals to pass from the pole port 102 to the high band port 101HB and the antenna port 20'.

In this embodiment, the directional coupler 110LA is coupled between the low band port 101LA of the first diplexer 76A and the pole port 94. Whenever the pole port 94 is selectively coupled to a selected one of the throw ports 98, the selected one of the throw ports 98 is selectively coupled to the directional coupler 110LA, the low band port 101LA of the first diplexer 76A, the antenna port 20, and the antenna ANT1. The first diplexer 76A has a frequency response that defines a pass band within a low frequency range at the low band port 101LA. The first diplexer 76A may be tunable so as to provide the pass band at the low band port 101LA within different RF communication bands of the low frequency range. An exemplary low frequency range may include frequencies of less than 1 GHz.

Also, the directional coupler 110HA is coupled between the high band port 101HA of the first diplexer 76A and the pole port 102. Whenever the pole port 102 is selectively coupled to a selected one of the throw ports 106, the selected one of the throw ports 106 is selectively coupled to the directional coupler 110HA, the high band port 101HA of the first diplexer 76A, the antenna port 20, and the antenna ANT1. The first diplexer 76A has a frequency response that defines a pass band within a high frequency range at the high band port 101HA. The first diplexer 76A may be tunable so as to provide the pass band at the high band port 101HA within different RF communication bands of the high frequency range. An exemplary high frequency range may include frequencies of 1 GHz or greater.

Additionally, the directional coupler 110LB is coupled between the low band port 101LB of the second diplexer 76B and the pole port 96. Whenever the pole port 96 is selectively coupled to a selected one of the throw ports 100, the selected one of the throw ports 100 is selectively coupled to the directional coupler 110LB, the low band port 101LB of the second diplexer 76B, the antenna port 20', and the antenna ANT2. The second diplexer 76B also has a frequency response that defines a pass band within the low frequency range at the low band port 101LB. The second diplexer 76B may be tunable so as to provide the pass band at the low band port 101LB within different RF communication bands of the low frequency range.

The directional coupler 110HB is coupled between the high band port 101HB of the second diplexer 76B and the pole port 104. Whenever the pole port 104 is selectively coupled to a selected one of the throw ports 108, the selected one of the throw ports 108 is selectively coupled to the directional coupler 110HB, the high band port 101HB of the second diplexer 76B, the antenna port 20', and the antenna ANT2. The second diplexer 76B also has a frequency response that defines a pass band within a high frequency range at the high band port 101HB. The second diplexer 76B may be tunable so as to provide the pass band at the high band port 101HB within different RF communication bands of the high band frequency range.

Note that the pole port 94, the directional coupler 110LA, the low band port 101LA of the first diplexer 76A, the common port I1, the antenna port 20, and the antenna ANT1 define a first set of coupled elements. Thus, whenever one of the coupled elements in the first set of coupled elements is selectively coupled to a component, the other members in the first set of coupled elements are also selectively coupled to the component. For example, if the pole port 94 is selectively coupled to the throw port 98-1, the directional coupler 110LA, the low band port 101LA of the first diplexer 76A, the common port I1, the antenna port 20, and the antenna ANT1 are also selectively coupled to the throw port 98-1. Similarly, the pole port 96, the directional coupler 110LB, the low band port 101LB of the second diplexer 76B, the common port I2, the antenna port 20', and the antenna ANT2 define a second set of coupled elements. The pole port 102, the directional coupler 110HA, the high band port 101HA of the first diplexer 76A, the common port I1, the antenna port 20, and the antenna ANT1 define a third set of coupled elements. Finally, the pole port 104, the directional coupler 110HB, the high band port 101HB of the second diplexer 76B, the common port I2, the antenna port 20', and the antenna ANT2 define a fourth set of coupled elements. Thus, throughout this disclosure, whenever a member of one of the sets of coupled elements is mentioned as being selectively coupled to a component, the other members in the same set of coupled elements are also selectively coupled to the component even if the selective coupling of the other members in the set is not explicitly stated herein. However, it should be noted that the first set, the second set, the third set, and the fourth set of coupled elements should be analyzed exclusively to determine selective coupling. In other words, when a coupled element (such as the antenna ports 20, 20' and the antennas ANT1, ANT2) is common to more than one of the sets of coupled elements, then which of the sets is being discussed should be considered to determine selective coupling. Accordingly, the members of the set with the common coupled element that is being considered may be presumed to be selectively coupled to the component. However, the exclusive disjunction of uncommon members from other sets not being considered but also having the common coupled element should not be considered as selectively coupled to the component or to uncommon members of the set being considered unless explicitly stated herein. Put more simply, when sets with high band coupled elements (elements with the high band antenna selection circuitry 84, the high band switching circuitry 80, etc.) and a common coupled element (e.g., the antenna ports 20, 20' and the antennas ANT1, ANT2) are being considered, low band coupled elements (elements with the low band antenna selection circuitry 82, the low band switching circuitry 78, etc.) in another set that also has the common coupled element (e.g., the antenna ports 20, 20' and the antennas ANT1, ANT2) should not be presumed to be selectively coupled to the component or to the high band coupled elements unless expressly stated herein. The same applies vice versa with respect to sets with high band coupled elements and a common coupled element when sets with low band coupled elements and the common coupled element are being considered.

As shown in FIG. 7 and FIG. 7A, the front-end switching circuitry 75 includes the MTMEMS 14(1)(A) and the MTMEMS 14(1)(B) illustrated in FIG. 3. In this embodiment, the control circuit 46 is configured to switch the front-end switching circuitry 75, the MTMEMS 14(1)(A), and the MTMEMS 14(1)(B) so as to route RF signals to and from RF transceiver circuitry (not shown) and to and from a plurality of antenna ports (in this example, the antenna ports 20, 20') and/or a plurality of antennas (in this example, the antennas ANT1 and ANT2). The control circuit 46 is configured to switch the front-end switching circuitry 75, the MTMEMS 14(1)(A), and the MTMEMS 14(1)(B) in accordance with any one of a set of RF communication specifications for the RF signals. Thus, for each RF communication specification in the set of RF communication specifications, the control circuit 46 is operable in a mode wherein the front-end switching circuitry 75, the MTMEMS 14(1)(A), and the MTMEMS 14(1)(B) are switched by the control circuit 46 in accordance with the RF communication specification. Since the control circuit 46 is configured to switch the front-end switching circuitry 75, the MTMEMS 14(1)(A), and the MTMEMS 14(1)(B), the control circuit 46 is operable in any one of a set of modes, wherein the set of modes may correspond injectively, surjectively, or bijectively to the set of RF communication specifications. In this embodiment, the control mode input 60 to the master subcontroller 54 may be provided in different control mode permutations, wherein each of the control mode permutations is indicative of a mode in the set of modes.

The MEMS subcontroller 58 is described above with respect to FIG. 3 and generates the switch control output 50(1) and the switch control output 50(2) as described above with respect to FIG. 3 in order to control the selective coupling of the MTMEMS 14(1)(A) and the MTMEMS 14(1)(B). The MEMS subcontroller 58 is thus configured to generate the switch control output 50(1) to control the selective coupling of the pole port 24(1)(A) to any one of the throw ports 22(1)(A). Similarly, the MEMS subcontroller 58 is configured to generate the switch control output 50(2) to control the selective coupling of the pole port 24(1)(B) to one of the throw ports 22(1)(B).

As shown in FIGS. 7B and 7C, the transistor switch subcontroller 56 is configured to generate a switch control output 50(SLB), a switch control output 50(ALB), a switch control output 50(SHB), a switch control output 50(AHB), and a switch control output 50(TSN) in accordance with the transistor switch control mode output 62. The low band switching circuitry 78 is operable to receive the switch control output 50(SLB) from the transistor switch subcontroller 56. The low band switching circuitry 78 is configured to selectively couple the pole port 86 to one of the throw ports 88 in accordance with the switch control output 50(SLB). In this manner, the transistor switch subcontroller 56 is configured to control the selective coupling of the pole port 86 to one of the throw ports 88.

The high band switching circuitry 80 is operable to receive the switch control output 50(SHB) from the transistor switch subcontroller 56. The high band switching circuitry 80 is configured to selectively couple the pole port 90 to one of the throw ports 92 in accordance with the switch control output 50(SHB). In this manner, the transistor switch subcontroller 56 is configured to control the selective coupling of the pole port 90 to one of the throw ports 88.

Additionally, the low band antenna selection circuitry 82 is operable to receive the switch control output 50(ALB) from the transistor switch subcontroller 56. The low band antenna selection circuitry 82 is configured to selectively couple the pole port 94 to one of the throw ports 98 in accordance with the switch control output 50(ALB). Furthermore, the low band antenna selection circuitry 82 is configured to selectively couple the pole port 96 to one of the throw ports 100 in accordance with the switch control output 50(ALB). In this manner, the transistor switch subcontroller 56 is configured to control the selective coupling of the pole port 94 to one of the throw ports 98 and to control the selective coupling of the pole port 96 to one of the throw ports 100.

Also, the high band antenna selection circuitry 84 is operable to receive the switch control output 50(AHB) from the transistor switch subcontroller 56. The high band antenna selection circuitry 84 is configured to selectively couple the pole port 102 to one of the throw ports 106 in accordance with the switch control output 50(AHB). Furthermore, the high band antenna selection circuitry 84 is configured to selectively couple the pole port 104 to one of the throw ports 108 in accordance with the switch control output 50(AHB). In this manner, the transistor switch subcontroller 56 is configured to control the selective coupling of the pole port 102 to one of the throw ports 106 and to control the selective coupling of the pole port 104 to one of the throw ports 108.

Finally, the throw switch network TSN is operable to receive the switch control output 50(TSN) from the transistor switch subcontroller 56. The throw switch network TSN is configured to switch the signal flow of the directional coupler 110LA in accordance with the switch control output 50(TSN). Furthermore, the throw switch network TSN is configured to switch the signal flow of the directional coupler 110HA in accordance with the switch control output 50(TSN). Additionally, the throw switch network TSN is configured to switch the signal flow of the directional coupler 110LB in accordance with the switch control output 50(TSN). Also, the throw switch network TSN is configured to switch the signal flow of the directional coupler 110HB in accordance with the switch control output 50(TSN). In this manner, the transistor switch subcontroller 56 is configured to control the signal flow of the directional coupler 110LA through the throw switch network TSN, to control the signal flow of the directional coupler 110HA through the throw switch network TSN, to control the signal flow of the directional coupler 110LB through the throw switch network TSN, and to control the signal flow of the directional coupler 110LB through the throw switch network TSN.

The control circuit 46 may operate so as to provide different types of carrier aggregation modes to comply with the carrier aggregation requirements of the different LTE specifications, such as LTE diversity specifications and LTE MIMO specifications. For example, the control circuit 46 may be configured in various LTE diversity and LTE MIMO modes that require different types of carrier aggregation, duplexing, and routing to the antenna ports 20 and 20'.

The antenna switching circuitry 74 is configured to route RF signals to any of the antennas ANT1, ANT2. With regard to the following explanations regarding LTE MIMO modes and LTE diversity modes, it should be presumed that the throw ports 22(1)(A), 22(1)(B), 88, 92, 98, 100, 106, 108 are decoupled from their respective pole ports 24(1)(A), 24(1)(B), 86, 90, 94, 96, 102, 104 by the control circuit 46 unless specifically stated otherwise. The same should be presumed for the other embodiments described below.

Referring now to FIGS. 7 and 7A-7C, the control circuit 46 is operable in a first LTE MIMO mode. While the control circuit 46 is in the first LTE MIMO mode, the control circuit 46 may generate the switch control output 50(1) with a switch control output permutation that results in the pole port 24(1) (A) being selectively coupled to the throw port 22(1)(A)-2 and, simultaneously generate the switch control output 50(2) that results in the pole port 24(1)(B) being selectively coupled to the throw port 22(1)(B)-2. In this embodiment, the RF transmission signal TXTDD2 is a primary transmission MIMO signal and the RF receive signal RXTDD2 is a primary receive MIMO signal. The control circuit 46 sets the signal flow of the directional coupler 110HA to the transmission signal flow and the signal flow of the directional coupler 110HB to the transmission signal flow while the control circuit 46 is in the first LTE MIMO mode during the time slot for transmission of the RF transmission signal TXTDD2. Accordingly, to transmit the RF transmission signal TXTDD2 from the antenna ANT1 during the time slot for transmission of the RF transmission signal TXTDD2, the control circuit 46 controls the selective coupling of the high band antenna selection circuitry 84 such that the pole port 102 (and thus also the antenna port 20) is selectively coupled to the throw port 106-1. In contrast, to transmit the RF transmission signal TXTDD2 from the antenna ANT2 during the time slot for transmission of the RF transmission signal TXTDD2, the control circuit 46 controls the selective coupling of the high band antenna selection circuitry 84 such that the pole port 104 (and thus also the antenna port 20') is selectively coupled to the throw port 108-1. The control circuit 46 is configured to select from which antenna to transmit the RF transmission signal TXTDD2 (the primary transmission MIMO signal) during the first LTE MIMO mode and the time slot for transmission of the RF transmission signal TXTDD2.

With regard to transmission, a secondary RF transmission signal TXMIMO1 is received at the RF port RFHB3 and is also a high band RF signal. The RF transmission signal TXMIMO1 is received simultaneously with the RF transmission signal TXTDD2 while the control circuit 46 is in the first LTE MIMO mode during the time slot for transmission of the RF transmission signal TXTDD2. When the RF transmission signal TXTDD2 is transmitted by the antenna ANT1 (and thus at the antenna port 20) during the time slot for transmission of the RF transmission signal TXTDD2, the control circuit 46 controls the selective coupling of the high band antenna selection circuitry 84 such that the pole port 104 (and thus the antenna port 20' and the antenna ANT2) is selectively coupled to the throw port 108-4. When the RF transmission signal TXTDD2 is transmitted by the antenna ANT2 (and thus at the antenna port 20') during the time slot for transmission of the RF transmission signal TXTDD2, the control circuit 46 controls the selective coupling of the high band antenna selection circuitry 84 such that the pole port 102 (and thus the antenna port 20 and the antenna ANT1) is selectively coupled to the throw port 106-4. Accordingly, the control circuit 46 is configured to select from which antenna ANT1, ANT2 to transmit the secondary RF transmission signal TXMIMO1 during the first LTE MIMO mode and during the time slot for transmission of the RF transmission signal TXTDD2. The RF transmission signal TXTDD2 and the RF transmission signal TXMIMO1 are transmitted simultaneously during the first LTE MIMO mode and during the time slot for transmission of the RF transmission signal TXTDD2.

In this embodiment, the control circuit 46 controls the selective coupling of the high band switching circuitry 80 such that the pole port 90 is coupled to the throw port 92-5 (the grounded throw port) for as long as the control circuit 46 is in the first LTE MIMO mode. Alternatively, the control circuit 46 may control the selective coupling of the high band switching circuitry 80 such that the pole port 90 is decoupled from all of the throw ports 92 for as long as the control circuit 46 is in the first LTE MIMO mode. Also, in this embodiment, the control circuit 46 controls the selective coupling of the low band switching circuitry 78 such that the pole port 86 is coupled to the throw port 88-5 (the grounded throw port) for as long as the control circuit 46 is in the first LTE MIMO mode. Alternatively, the control circuit 46 may control the selective coupling of the low band switching circuitry 78 such that the pole port 86 is decoupled from all of the throw ports 88 for as long as the control circuit 46 is in the first LTE MIMO mode.

The control circuit 46 sets the signal flow of the directional coupler 110HA to the receive signal flow and the signal flow of the directional coupler 110HB to the receive signal flow while the control circuit 46 is in the first LTE MIMO mode during the time slot for reception of the RF receive signal RXTDD2. To receive the RF receive signal RXTDD2 at the antenna ANT1 during the time slot for reception of the RF receive signal RXTDD2, the control circuit 46 controls the selective coupling of the high band antenna selection circuitry 84 such that the pole port 102 is selectively coupled to the throw port 106-3. To receive the RF receive signal RXTDD2 at the antenna ANT2 during the time slot for reception of the RF receive signal RXTDD2, the control circuit 46 controls the selective coupling of the high band antenna selection circuitry 84 such that the pole port 104 is selectively coupled to the throw port 108-3 (and thus also to the antenna port 20'). Accordingly, the control circuit 46 is configured to select from which antenna ANT1, ANT2 to receive the RF receive signal RXTDD2 (the primary receive MIMO signal) during the first LTE MIMO mode and the time slot for reception of the RF receive signal RXTDD2.

In the first LTE MIMO mode during the time slot for reception of the RF receive signal RXTDD2, a secondary receive MIMO signal RXMIMO1 is received at the RF port RFHB3 and is also a high band RF signal. The RF receive signal RXMIMO1 is received simultaneously with the RF receive signal RXTDD2 while the control circuit 46 is in the first LTE MIMO mode during the time slot for reception of the RF receive signal RXTDD2. When the RF receive signal RXTDD2 is received by the antenna ANT1 (and thus at the antenna port 20) during the time slot for reception of the RF receive signal RXTDD2, the control circuit 46 controls the selective coupling of the high band antenna selection circuitry 84 such that the pole port 104 (and thus the antenna port 20' and the antenna ANT2) is selectively coupled to the throw port 108-4. When the RF receive signal RXTDD2 is received by the antenna ANT2 (and thus at the antenna port 20') during the time slot for reception of the RF receive signal RXTDD2, the control circuit 46 controls the selective coupling of the high band antenna selection circuitry 84 such that the pole port 102 (and thus the antenna port 20 and the antenna ANT1) is selectively coupled to the throw port 106-4. Accordingly, the control circuit 46 is configured to select from which antenna ANT1, ANT2 to receive the secondary RF receive signal RXMIMO1 during the first LTE MIMO mode and during the time slot for reception of the RF receive signal RXTDD2. The RF receive signal RXTDD2 and the RF receive signal RXMIMO1 are received simultaneously during the first LTE MIMO mode and during the time slot for reception of the RF receive signal RXTDD2.

The control circuit 46 is also operable in a second LTE MIMO mode. While the control circuit 46 is in the second LTE MIMO mode, the control circuit 46 may generate the switch control output 50(SLB) with a switch control output permutation that results in the pole port 86 being selectively coupled to the throw port 88-1. In this embodiment, the throw port 88-1 is operable to receive an RF transmission signal TXL1 from the RF transceiver circuitry (not shown) at the throw port 88-1. The RF transmission signal TXL1 operates within the low band. In this embodiment, the RF transmission signal TXL1 is a primary transmission MIMO signal. During a time slot for transmission of the RF transmission signal TXL1, the front-end switching circuitry 75 may receive an RF transmission signal TXMIMO2 from the RF transceiver circuitry at the RF port RFLB3. The RF transmission signal TXMIMO2 is a secondary transmission MIMO signal and is in a low band.

While the control circuit 46 is in the second LTE MIMO mode, the front-end switching circuitry 75 is operable to transmit an RF receive signal RXL1 to the RF transceiver circuitry at the RF port RFLB1. The RF receive signal RXL1 is a primary receive MIMO signal and is in a low band. During a time slot for reception of the RF receive signal RXL1, an RF receive signal RXMIMO2 is transmitted to the RF transceiver circuitry at the RF port RFLB3. The RF receive signal RXMIMO2 operates in the low band and is a secondary receive MIMO signal.

The control circuit 46 sets the signal flow of the directional coupler 110LA to the transmission signal flow and the signal flow of the directional coupler 110LB to the transmission signal flow while the control circuit 46 is in the second LTE MIMO mode during the time slot for transmission of the RF transmission signal TXL1. To transmit the RF transmission signal TXL1 from the antenna ANT1 during the time slot for transmission of the RF transmission signal TXL1, the control circuit 46 controls the selective coupling of the low band antenna selection circuitry 82 such that the pole port 94 (and thus also the antenna port 20 and the antenna ANT1) is selectively coupled to the throw port 98-2. To transmit the RF transmission signal TXL1 from the antenna ANT2 during the time slot for transmission of the RF transmission signal TXL1, the control circuit 46 controls the selective coupling of the low band antenna selection circuitry 82 such that the pole port 96 (and thus also the antenna port 20') is selectively coupled to the throw port 100-2. Accordingly, the control circuit 46 is configured to select from which antenna ANT1, ANT2 (and thus also from which of the antenna ports 20, 20') to transmit the RF transmission signal TXL1 (the primary transmission MIMO signal) during the second LTE MIMO mode and during the time slot for transmission of the RF transmission signal TXL1. The control circuit 46 may be configured to select from which antenna ANT1, ANT2 (and thus also from which of the antenna ports 20, 20') to transmit the RF transmission signal TXL1 based on Total Radiated Power (TRP) data and/or Total Isotropic Sensitivity (TIS) data.

The RF transmission signal TXMIMO2 is received simultaneously with the RF transmission signal TXL1 from the RF transceiver circuitry, while the control circuit 46 is in the second LTE MIMO mode during the time slot for transmission of the RF transmission signal TXL1. When the RF transmission signal TXL1 is transmitted by the antenna ANT1 (and thus provided to the antenna port 20) during the time slot for transmission of the RF transmission signal TXL1, the control circuit 46 controls the selective coupling of the low band antenna selection circuitry 82 such that the pole port 96 (and thus the antenna port 20' and the antenna ANT2) is selectively coupled to the throw port 100-3. When the RF transmission signal TXL1 is transmitted by the antenna ANT2 (and thus provided to the antenna port 20') during the time slot for transmission of the RF transmission signal TXL1, the control circuit 46 controls the selective coupling of the low band antenna selection circuitry 82 such that the pole port 94 (and thus the antenna port 20 and the antenna ANT1) is selectively coupled to the throw port 98-3. Accordingly, the control circuit 46 is configured to select from which antenna ANT1, ANT2 to transmit the secondary RF transmission signal TXMIMO2 during the second LTE MIMO mode and during the time slot for transmission of the RF transmission signal TXL1. The RF transmission signal TXL1 and the RF transmission signal TXMIMO2 are thus transmitted simultaneously during the second LTE MIMO mode and during the time slot for transmission of the RF transmission signal TXL1.

In this embodiment, the control circuit 46 controls the selective coupling of the high band switching circuitry 80 such that the pole port 90 is coupled to the throw port 92-5 (the grounded throw port) for as long as the control circuit 46 is in the second LTE MIMO mode. Alternatively, the control circuit 46 may control the selective coupling of the high band switching circuitry 80 such that the pole port 90 is decoupled from all of the throw ports 92 for as long as the control circuit 46 is in the second LTE MIMO mode. Also, in this embodiment, the control circuit 46 controls the selective coupling of the MTMEMS 14(1)(A) such that the pole port 24(1)(A) is decoupled from all of the throw ports 22(1)(A) and controls the selective coupling of the MTMEMS 14(1)(B) such that the pole port 24(1)(B) is decoupled from all of the throw ports 22(1)(B). Alternatively, the control circuit 46 controls the selective coupling of the MTMEMS 14(1)(A) such that the pole port 24(1)(A) is selectively coupled to a grounded throw port (not shown) and controls the selective coupling of the MTMEMS 14(1)(B) such that the pole port 24(1)(B) is selectively coupled to a grounded throw port (not shown) in the second LTE MIMO mode.

The control circuit 46 sets the signal flow of the directional coupler 110LA to the receive signal flow and the signal flow of the directional coupler 110LB to the receive signal flow while the control circuit 46 is in the second LTE MIMO mode during the time slot for reception of the RF receive signal RXL1. To receive the RF receive signal RXL1 from the antenna ANT1 during the time slot for reception of the RF receive signal RXL1, the control circuit 46 controls the selective coupling of the low band antenna selection circuitry 82 such that the pole port 94 is selectively coupled to the throw port 98-1. In contrast, to receive the RF receive signal RXL1 from the antenna ANT2 during the time slot for reception of the RF receive signal RXL1, the control circuit 46 controls the selective coupling of the low band antenna selection circuitry 82 such that the pole port 96 (and thus also the antenna port 20') is selectively coupled to the throw port 100-1. Accordingly, the control circuit 46 is configured to select from which antenna ANT1, ANT2 to receive the RF receive signal RXL1 (the primary receive MIMO signal) during the second LTE MIMO mode and the time slot for reception of the RF receive signal RXL1. The control circuit 46 may be configured to select from which antenna ANT1, ANT2 (and thus also from which of the antenna ports 20, 20') to receive the RF receive signal RXL1 based on TRP data and/or TIS data.

The RF receive signal RXMIMO2 is received simultaneously with the RF receive signal RXL1 while the control circuit 46 is in the second LTE MIMO mode during the time slot for reception of the RF receive signal RXL1. When the RF receive signal RXL1 is received by the antenna ANT1 (and thus by the antenna port 20) during the time slot for reception of the RF receive signal RXL1, the control circuit 46 controls the selective coupling of the low band antenna selection circuitry 82 such that the pole port 96 (and thus the antenna port 20' and the antenna ANT2) is selectively coupled to the throw port 100-3. When the RF receive signal RXTDD2 is received by the antenna ANT2 (and thus by the antenna port 20') during the time slot for reception of the RF receive signal RXL1, the control circuit 46 controls the selective coupling of the low band antenna selection circuitry 82 such that the pole port 94 (and thus the antenna port 20 and the antenna ANT1) is selectively coupled to the throw port 98-3. Accordingly, the control circuit 46 is configured to select from which antenna ANT1, ANT2 to receive the secondary RF receive signal RXMIMO2 during the second LTE MIMO mode and during the time slot for reception of the RF receive signal RXL1.

The control circuit 46 is also operable in a third LTE MIMO mode. While the control circuit 46 is in the third LTE MIMO mode, the control circuit 46 may generate the switch control output 50(SLB) with a switch control output permutation that results in the pole port 86 being selectively coupled to the throw port 88-4. In this embodiment, the throw port 88-4 is operable to transmit an RF receive signal RXL2 to the RF transceiver circuitry (not shown) from the throw port 88-4. The RF receive signal RXL2 operates within the low band. In this embodiment, the RF receive signal RXL2 is a primary receive MIMO signal. During a time slot for reception of the RF receive signal RXL2, the front-end switching circuitry 75 may transmit an RF receive signal RXMIMO3 from the RF port RFLB3 to the RF transceiver circuitry. The RF receive signal RXMIMO3 is a secondary receive MIMO signal.

With regard to transmission, while the control circuit 46 is in the third LTE MIMO mode, the front-end switching circuitry 75 is operable to receive an RF transmission signal TXL2 from the RF transceiver circuitry at the RF port RFLB1. The RF transmission signal TXL2 is a primary transmission MIMO signal. During a time slot for transmission of the RF transmission signal TXL2, an RF transmission signal TXMIMO3 is received at the RF port RFLB3. The RF transmission signal TXMIMO3 operates in the low band and is a secondary transmission MIMO signal.

The control circuit 46 sets the signal flow of the directional coupler 110LA to the receive signal flow and the signal flow of the directional coupler 110LB to the receive flow while the control circuit 46 is in the third LTE MIMO mode during the time slot for reception of the RF receive signal RXL2. To receive the RF receive signal RXL2 from the antenna ANT1 during the time slot for reception of the RF receive signal RXL2, the control circuit 46 controls the selective coupling of the low band antenna selection circuitry 82 such that the pole port 94 (and thus also the antenna port 20) is selectively coupled to the throw port 98-2. To receive the RF receive signal RXL2 from the antenna ANT2 during the time slot for reception of the RF receive signal RXL2, the control circuit 46 controls the selective coupling of the low band antenna selection circuitry 82 such that the pole port 96 (and thus also the antenna port 20') is selectively coupled to the throw port 100-2. Accordingly, the control circuit 46 is configured to select from which antenna ANT1, ANT2 (and thus also from which of the antenna ports 20, 20') to receive the RF receive signal RXL2 (the primary receive MIMO signal) during the third LTE MIMO mode and during the time slot for reception of the RF receive signal RXL2. The control circuit 46 may be configured to select from which antenna ANT1, ANT2 (and thus also from which of the antenna ports 20, 20') to receive the RF receive signal RXL2 (the primary receive MIMO signal) based on TRP data and/or TIS data.

The RF receive signal RXMIMO3 is received simultaneously with the RF receive signal RXL2 while the control circuit 46 is in the third LTE MIMO mode during the time slot for reception of the RF receive signal RXL2. When the RF receive signal RXL2 is received by the antenna ANT1 (and thus at the antenna port 20) during the time slot for reception of the RF receive signal RXL2, the control circuit 46 controls the selective coupling of the low band antenna selection circuitry 82 such that the pole port 96 (and thus the antenna port 20' and the antenna ANT2) is selectively coupled to the throw port 100-3. When the RF receive signal RXL2 is received by the antenna ANT2 (and thus at the antenna port 20') during the time slot for reception of the RF receive signal RXL2, the control circuit 46 controls the selective coupling of the low band antenna selection circuitry 82 such that the pole port 94 (and thus the antenna port 20 and the antenna ANT1) is selectively coupled to the throw port 98-4. Accordingly, the control circuit 46 is configured to select from which antenna ANT1, ANT2 to receive the secondary RF receive signal RXMIMO3 during the third LTE MIMO mode and during the time slot for reception of the RF receive signal RXL2. The RF receive signal RXL2 and the RF receive signal RXMIMO3 are received simultaneously during the third LTE MIMO mode and during the time slot for reception of the RF receive signal RXL2.

In this embodiment, the control circuit 46 controls the selective coupling of the high band switching circuitry 80 such that the pole port 90 is coupled to the throw port 92-5 (the grounded throw port) for as long as the control circuit 46 is in the third LTE MIMO mode. Alternatively, the control circuit 46 may control the selective coupling of the high band switching circuitry 80 such that the pole port 90 is decoupled from all of the throw ports 92 for as long as the control circuit 46 is in the third LTE MIMO mode. Also, in this embodiment, the control circuit 46 controls the selective coupling of the MTMEMS 14(1)(A) such that the pole port 24(1)(A) is decoupled from all of the throw ports 22(1)(A) and controls the selective coupling of the MTMEMS 14(1)(B) such that the pole port 24(1)(B) is decoupled from all of the throw ports 22(1)(B). Alternatively, the control circuit 46 controls the selective coupling of the MTMEMS 14(1)(A) such that the pole port 24(1)(A) is selectively coupled to a grounded throw port (not shown) and controls the selective coupling of the MTMEMS 14(1)(B) such that the pole port 24(1)(B) is selectively coupled to a grounded throw port (not shown) in the third LTE MIMO mode.

With regard to transmission, the control circuit 46 sets the signal flow of the directional coupler 110LA to the transmission signal flow and the signal flow of the directional coupler 110LB to the transmission signal flow while the control circuit 46 is in the third LTE MIMO mode during the time slot for transmission of the RF transmission signal TXL2. To transmit the RF transmission signal TXL2 from the antenna ANT1 during the time slot for transmission of the RF transmission signal TXL2, the control circuit 46 controls the selective coupling of the low band antenna selection circuitry 82 such that the pole port 94 is selectively coupled to the throw port 98-1. To transmit the RF transmission signal TXL2 from the antenna ANT2 during the time slot for transmission of the RF transmission signal TXL2, the control circuit 46 controls the selective coupling of the low band antenna selection circuitry 82 such that the pole port 96 (and thus also the antenna port 20') is selectively coupled to the throw port 100-1. Accordingly, the control circuit 46 is configured to select from which antenna ANT1, ANT2 to transmit the RF transmission signal TXL2 (the primary transmission MIMO signal) during the third LTE MIMO mode during the time slot for transmission of the RF transmission signal TXL2. The control circuit 46 may be configured to select from which antenna ANT1, ANT2 (and thus also from which of the antenna ports 20, 20') to transmit the RF transmission signal TXL2 based on TRP data and/or TIS data.

The RF transmission signal TXMIMO3 is transmitted simultaneously with the RF transmission signal TXL2 while the control circuit 46 is in the third LTE MIMO mode during the time slot for transmission of the RF transmission signal TXL2. When the RF transmission signal TXL2 is transmitted by the antenna ANT1 (and thus by the antenna port 20) during the time slot for transmission of the RF transmission signal TXL2, the control circuit 46 controls the selective coupling of the low band antenna selection circuitry 82 such that the pole port 96 (and thus the antenna port 20' and the antenna ANT2) is selectively coupled to the throw port 100-4. When the RF transmission signal TXL2 is received by the antenna ANT2 (and thus at the antenna port 20') during the time slot for transmission of the RF transmission signal TXL2, the control circuit 46 controls the selective coupling of the low band antenna selection circuitry 82 such that the pole port 94 (and thus the antenna port 20 and the antenna ANT1) is selectively coupled to the throw port 98-4. Accordingly, the control circuit 46 is configured to select from which antenna ANT1, ANT2 to transmit the secondary RF transmission signal TXMIMO3 during the third LTE MIMO mode and during the time slot for transmission of the RF transmission signal TXL2.

The control circuit 46 is also operable in a fourth LTE MIMO mode. The control circuit 46 sets the signal flow of the directional coupler 110LA to the transmission signal flow, the signal flow of the directional coupler 110HA to the receive signal flow, the signal flow of the directional coupler 110LB to the transmission signal flow, and the signal flow of the directional coupler 110HB to the receive signal flow while the control circuit 46 is in the fourth LTE MIMO mode. While the control circuit 46 is in the fourth LTE MIMO mode, the control circuit 46 may generate the switch control output 50(1) with a switch control output permutation that results in the pole port 24(1)(A) being decoupled from all of the throw ports 22(1)(A), or alternatively, coupled to a grounded throw port (not shown). In addition, the control circuit 46 may generate the switch control output 50(2) with a switch control output permutation that results in the pole port 24(1)(B) being selectively coupled to the throw port 22(1)(A)-3. In this embodiment, the RF receive signal RXTDD3 is a primary receive MIMO signal and is in a high band. Furthermore, the control circuit 46 may generate the switch control output 50(SHB) with a switch control output permutation that results in the pole port 90 being selectively coupled to the throw port 92-1. The throw port 92-1 is operable to transmit an RF receive signal RXMIMO4 to the RF transceiver circuitry (not shown). The RF receive signal RXMIMO4 is in a high band and is a secondary receive MIMO signal. As in the third LTE MIMO mode, the RF transmission signal TXL2 is the primary MIMO transmission signal and the RF transmission signal TXMIMO3 is the secondary MIMO transmission signal.

To receive the RF receive signal RXTDD3 from the antenna ANT1 and to receive the RF receive signal RXMIMO4 from the antenna ANT2 during the fourth LTE MIMO mode, the control circuit 46 controls the selective coupling of the high band antenna selection circuitry 84 such that the pole port 102 (and thus also the antenna port 20) is selectively coupled to the throw port 106-3 and controls the selective coupling of the high band antenna selection circuitry 84 such that the pole port 104 (and thus also the antenna port 20') is selectively coupled to the throw port 108-2. To receive the RF receive signal RXTDD3 from the antenna ANT2 and to receive the RF receive signal RXMIMO4 from the antenna ANT1 during the fourth LTE MIMO mode, the control circuit 46 controls the selective coupling of the high band antenna selection circuitry 84 such that the pole port 104 (and thus also the antenna port 20') is selectively coupled to the throw port 108-3 and controls the selective coupling of the high band antenna selection circuitry 84 such that the pole port 102 (and thus also the antenna port 20) is selectively coupled to the throw port 106-2. Accordingly, the control circuit 46 is configured to select from which antenna ANT1, ANT2 to receive the RF receive signal RXTDD3 (the primary transmission MIMO signal) and the RF receive signal RXMIMO4 during the fourth LTE MIMO mode.

With regard to transmission, while the control circuit 46 is in the fourth LTE MIMO mode, the RF transmission signal TXL2 is the primary transmission MIMO signal and the RF MIMO signal TXMIMO3 is the secondary transmission MIMO signal. To transmit the RF transmission signal TXL2 from the antenna ANT1 and to transmit the RF transmission signal TXMIMO3 from the antenna ANT2 during the fourth LTE MIMO mode, the control circuit 46 controls the selective coupling of the low band antenna selection circuitry 82 such that the pole port 94 (and thus also the antenna port 20) is selectively coupled to the throw port 98-1 and controls the selective coupling of the low band antenna selection circuitry 82 such that the pole port 96 (and thus also the antenna port 20') is selectively coupled to the throw port 100-4. To transmit the RF transmission signal TXL2 from the antenna ANT2 and to transmit the RF transmission signal TXMIMO3 from the antenna ANT2 during the fourth LTE MIMO mode, the control circuit 46 controls the selective coupling of the low band antenna selection circuitry 82 such that the pole port 94 (and thus also the antenna port 20) is selectively coupled to the throw port 98-4 and controls the selective coupling of the low band antenna selection circuitry 82 such that the pole port 96 (and thus also the antenna port 20') is selectively coupled to the throw port 100-1. Accordingly, the control circuit 46 is configured to select from which antenna ANT1, ANT2 to transmit the RF transmission signal TXL2 (the primary transmission MIMO signal) and the RF transmission signal TXMIMO3 during the fourth LTE MIMO mode. The RF receive signal RXTDD3 and the RF receive signal RXMIMO4 are received, and the RF transmission signal TXL2 and the RF transmission signal TXMIMO3 are transmitted simultaneously while the control circuit 46 is in the fourth LTE MIMO mode. Accordingly, the fourth LTE MIMO mode may be synchronous and timed in accordance with time slots or, alternatively, the fourth LTE MIMO mode may also be asynchronous (or at least partially asynchronous) and not timed in accordance with the time slots.

The control circuit 46 is also operable in a fifth LTE MIMO mode. The control circuit 46 sets the signal flow of the directional coupler 110LA to the receive signal flow, the signal flow of the directional coupler 110HA to the transmission signal flow, the signal flow of the directional coupler 110LB to the receive signal flow, and the signal flow of the directional coupler 110HB to the transmission signal flow while the control circuit 46 is in the fifth LTE MIMO mode. While the control circuit 46 is in the fifth LTE MIMO mode, the control circuit 46 may generate the switch control output 50(2) with a switch control output permutation that results in the pole port 24(1)(B) being decoupled from all of the throw ports 22(1)(B), or alternatively, coupled to a grounded throw port (not shown). In addition, the control circuit 46 may generate the switch control output 50(1) with a switch control output permutation that results in the pole port 24(1)(A) being selectively coupled to the throw port 22(1)(A)-3. In this embodiment, the RF transmission signal TXTDD3 is a primary transmission MIMO signal and is in a high band. Furthermore, the control circuit 46 may generate the switch control output 50(SHB) with a switch control output permutation that results in the pole port 90 being selectively coupled to the throw port 92-2. The throw port 92-2 is operable to receive an RF transmission signal TXMIMO4 at the throw port 92-2 from the RF transceiver circuitry. The RF transmission signal TXMIMO4 is in the high band and is a secondary transmission MIMO signal.

To transmit the RF transmission signal TXTDD3 from the antenna ANT1 and to transmit the RF transmission signal TXMIMO4 from the antenna ANT2 during the fifth LTE MIMO mode, the control circuit 46 controls the selective coupling of the high band antenna selection circuitry 84 such that the pole port 102 (and thus also the antenna port 20) is selectively coupled to the throw port 106-1 and controls the selective coupling of the high band antenna selection circuitry 84 such that the pole port 104 (and thus also the antenna port 20') is selectively coupled to the throw port 108-2. To transmit the RF transmission signal TXTDD3 from the antenna ANT2 and to transmit the RF transmission signal TXMIMO4 from the antenna ANT1 during the fifth LTE MIMO mode, the control circuit 46 controls the selective coupling of the high band antenna selection circuitry 84 such that the pole port 104 (and thus also the antenna port 20') is selectively coupled to the throw port 108-1 and controls the selective coupling of the high band antenna selection circuitry 84 such that the pole port 102 (and thus also the antenna port 20) is selectively coupled to the throw port 106-2. Accordingly, the control circuit 46 is configured to select from which antenna ANT1, ANT2 to transmit the RF transmission signal TXTDD3 (the primary transmission MIMO signal) and the RF transmission signal TXMIMO4 during the fifth LTE MIMO mode.

As in the second LTE MIMO mode, the RF receive signal RXL1 is the primary RF receive MIMO signal and the RF MIMO signal RXMIMO2 is the secondary RF receive MIMO signal. To receive the RF receive signal RXL1 from the antenna ANT1 during the fifth LTE MIMO mode and to receive the RF receive signal RXMIMO2 from the antenna ANT2 during the fifth LTE MIMO mode, the control circuit 46 controls the selective coupling of the low band antenna selection circuitry 82 such that the pole port 94 (and thus also the antenna port 20) is selectively coupled to the throw port 98-1 and controls the selective coupling of the low band antenna selection circuitry 82 such that the pole port 96 (and thus also the antenna port 20') is selectively coupled to the throw port 100-4. To receive the RF receive signal RXL1 from the antenna ANT2 during the fifth LTE MIMO mode and to receive the RF receive signal RXMIMO2 from the antenna ANT1 during the fifth LTE MIMO mode, the control circuit 46 controls the selective coupling of the low band antenna selection circuitry 82 such that the pole port 96 (and thus also the antenna port 20') is selectively coupled to the throw port 100-1 and controls the selective coupling of the low band antenna selection circuitry 82 such that the pole port 94 (and thus also the antenna port 20) is selectively coupled to the throw port 98-4. Accordingly, the control circuit 46 is configured to select from which antenna ANT1, ANT2 to receive the RF receive signal RXL1 (the primary receive MIMO signal) and the RF receive signal RXMIMO2 during the fifth LTE MIMO mode. The RF transmission signal TXTDD3 and the RF transmission signal TXMIMO4 are transmitted and the RF receive signal RXL1 and the RF receive signal RXMIMO2 are received simultaneously while the control circuit 46 is in the fifth LTE MIMO mode. Accordingly, the fifth LTE MIMO mode may be synchronous and timed in accordance with time slots or, alternatively, the fifth LTE MIMO mode may be asynchronous (or at least partially asynchronous) and not timed in accordance with the time slots.

The control circuit 46 is also operable in a first LTE diversity mode. The control circuit 46 sets the signal flow of the directional coupler 110LA to the transmission signal flow, the signal flow of the directional coupler 110HA to the receive signal flow, the signal flow of the directional coupler 110LB to the transmission signal flow, and the signal flow of the directional coupler 110HB to the receive signal flow while the control circuit 46 is in the first LTE diversity mode. While the control circuit 46 is in the LTE diversity mode, the control circuit 46 may generate the switch control output 50(2) with a switch control output permutation that results in the pole port 24(1)(B) being decoupled from all of the throw ports 22(1)(B), or alternatively, coupled to a grounded throw port (not shown). In addition, the control circuit 46 may generate the switch control output 50(1) with a switch control output permutation that results in the pole port 24(1)(A) being selectively coupled to the throw port 22(1)(A)-7. Furthermore, the control circuit 46 may generate the switch control output 50(SLB) with a switch control output permutation that results in the pole port 86 being selectively coupled to the throw port 88-3. The throw port 88-3 is operable to receive an RF transmission signal TXL3 and to transmit the RF receive signal RXL3. The RF transmission signal TXFDD7 and the RF transmission signal TXL3 are both transmit diversity signals and may have the same data. The RF receive signal RXFDD7 and the RF receive signal RXL3 are both receive diversity signals and may also have the same data. While the control circuit 46 is in the LTE diversity mode, the control circuit 46 may generate the switch control output 50(SHB) with a switch control output permutation that results in the pole port 90 being selectively coupled to the throw port 92-5 (the grounded throw port), or alternatively, such that the pole port 90 is decoupled from all of the throw ports 92.

The control circuit 46 controls the selective coupling of the high band antenna selection circuitry 84 such that the pole port 104 (and thus the antenna port 20' and the antenna ANT2) is selectively coupled to the throw port 108-1 and such that the pole port 102 (and thus the antenna port 20 and the antenna ANT1) is selectively coupled to the throw port 106-1. As such, the RF transmission signal TXFDD7 is transmitted from the antenna ANT2 and the RF receive signal RXFDD7 is received at the antenna ANT1 while the control circuit 46 is in the first LTE diversity mode.

The control circuit 46 controls the selective coupling of the low band antenna selection circuitry 82 such that the pole port 94 (and thus the antenna port 20 and the antenna ANT1) is selectively coupled to the throw port 98-2 and such that the pole port 96 (and thus the antenna port 20' and the antenna ANT2) is selectively coupled to the throw port 100-2. As such, the RF transmission signal TXL3 is transmitted from the antenna ANT1 and the RF receive signal RXL3 is received at the antenna ANT2 while the control circuit 46 is in the first LTE diversity mode. The RF transmission signal TXL3 may be transmitted from the antenna ANT1, the RF transmission signal TXFDD7 may be transmitted from the antenna ANT2, the RF receive signal RXFDD7 may be received from the antenna ANT1, and the RF receive signal RXL3 may be received from the antenna ANT2 simultaneously during the first LTE diversity mode. Thus, the first LTE diversity mode may be synchronous and timed in accordance with time slots or, alternatively, the first LTE diversity mode may be asynchronous (or at least partially asynchronous) and not timed in accordance with the time slots.

While various LTE modes of operation have been described with regard to the antenna switching circuitry 74 shown in FIG. 7, these LTE modes are not exhaustive of the LTE specifications that may be implemented with the control circuit 46. An almost limitless variety of different RF communication specifications may be implemented with the antenna switching circuitry 74 in FIG. 7 and the other embodiments described in this disclosure. These different RF communication specifications would be apparent to one of ordinary skill in the art in light of this disclosure and are considered to be within the scope of this disclosure.

For example, FIGS. 8 and 8A-8C illustrate exemplary RF front-end circuitry that includes another embodiment of antenna switching circuitry 112. The antenna switching circuitry 112 is the same as the antenna switching circuitry 74 shown in FIGS. 7 and 7A-7C, except in this embodiment, the MTMEMS 14(2)(A) of FIG. 4 (rather than the MTMEMS 14(1)(A) in FIG. 7) may be coupled to the RF port RFHB1, and the MTMEMS 14(2)(B) of FIG. 4 (rather than the MTMEMS 14(1)(B) in FIG. 7) may be coupled to the RF port RFHB2. The antenna switching circuitry 112 includes the control circuit 46 described above. In this embodiment, the MEMS subcontroller 58 generates the switch control output 50(3) and the switch control output 50(4), as explained above with respect to FIG. 4, rather than the switch control outputs 50(1) and 50(2). The control circuit 46 is operable in the first LTE MIMO mode, the second LTE MIMO mode, the third LTE MIMO mode, the fourth LTE MIMO mode, and the fifth LTE MIMO mode as described above with respect to FIG. 7. However, with regard to the first LTE MIMO mode, the second LTE MIMO mode, the third LTE MIMO mode, the fourth LTE MIMO mode, and the fifth LTE MIMO mode, the pole port 24(1)(A) of the MTMEMS 14(1)(A) of FIG. 7 corresponds to the pole port 24(2)(A) of the MTMEMS 14(2)(A) in FIG. 8A, and the throw ports 22(1)(A)-1, 22(1)(A)-2, 22(1)(A)-3, 22(1)(A)-4, 22(1)(A)-5, 22(1)(A)-6 correspond to the throw ports 22(2)(A)-1, 22(2)(A)-2, 22(2)(A)-3, 22(2)(A)-4, 22(2)(A)-5, 22(2)(A)-6 in FIG. 8A. Furthermore, the pole port 24(1)(B) of the MTMEMS 14(1)(B) of FIG. 7 corresponds to the pole port 24(2)(B) of the MTMEMS 14(2)(B) in FIG. 8A, and the throw ports 22(1)(B)-1, 22(1)(B)-2, 22(1)(B)-3 correspond to the throw ports 22(2)(B)-1, 22(2)(B)-2, 22(2)(B)-3 in FIG. 8A.

In this embodiment, the control circuit 46 is operable in a second LTE diversity mode, rather than the first LTE diversity mode, because the RF receive signal RXFDD7 and the RF transmission signal TXFDD7 are provided at the MTMEMS 14(2)(B) for the RF receive signals RXTDD1, RXTDD2, RXTDD3 rather than the MTMEMS 14(1)(A) for the RF transmission signal TXTDD1, TXTDD2, TXTDD3, TXTDD4, TXTDD5, TXTDD6 as in FIGS. 7, 7A. The control circuit 46 sets the signal flow of the directional coupler 110LA to the transmission signal flow, the signal flow of the directional coupler 110HA to the receive signal flow, the signal flow of the directional coupler 110LB to the receive signal flow, and the signal flow of the directional coupler 110HB to the transmission signal flow while the control circuit 46 is in the second LTE diversity mode. Again, the RF transmission signal TXFDD7 and the RF receive signal RXFDD7 are provided at the throw port 22(2)(B)-ADD, not at the throw port 22(1)(A)-7 as in FIGS. 7 and 7A. The RF receive signal RXL3 and the RF transmission signal TXL3 are also used in the second LTE diversity mode, as in the first LTE diversity mode.

While the control circuit 46 is in the second LTE diversity mode, the control circuit 46 may generate the switch control output 50(3) with a switch control output permutation that results in the pole port 24(2)(A) being decoupled from all of the throw ports 22(2)(A), or alternatively, coupled to a grounded throw port (not shown). In addition, the control circuit 46 may generate the switch control output 50(4) with a switch control output permutation that results in the pole port 24(2)(B) being selectively coupled to the throw port 22(2)(B)-ADD. Furthermore, as in the previous embodiment, the control circuit 46 may generate the switch control output 50(SLB) with a switch control output permutation that results in the pole port 86 being selectively coupled to the throw port 88-3. The throw port 88-3 is operable to provide the RF transmission signal TXL3 and the RF receive signal RXL3.

While the control circuit 46 is in the second LTE diversity mode, the control circuit 46 may generate the switch control output 50(SHB) with a switch control output permutation that results in the pole port 90 being selectively coupled to the throw port 92-5 (the grounded throw port), or alternatively such that the pole port 90 is decoupled from all of the throw ports 92.

The control circuit 46 controls the selective coupling of the high band antenna selection circuitry 84 such that the pole port 104 (and thus the antenna port 20' and the antenna ANT2) is selectively coupled to the throw port 108-3 and such that the pole port 102 (and thus the antenna port 20 and the antenna ANT1) is selectively coupled to the throw port 106-3. As such, the RF transmission signal TXFDD7 is transmitted from the antenna ANT2 and the RF receive signal RXFDD7 is received from the antenna ANT1 while the control circuit 46 is in the second LTE diversity mode.

Also, the control circuit 46 controls the selective coupling of the low band antenna selection circuitry 82 such that the pole port 94 (and thus the antenna port 20 and the antenna ANT1) is selectively coupled to the throw port 98-2 and such that the pole port 96 (and thus the antenna port 20' and the antenna ANT2) is selectively coupled to the throw port 100-2. As such, the RF transmission signal TXL3 is transmitted from the antenna ANT1 and the RF receive signal RXL3 is received from the antenna ANT2 while the control circuit 46 is in the second LTE diversity mode. The RF transmission signal TXL3 may be transmitted from the antenna ANT1, the RF transmission signal TXFDD7 may be transmitted from the antenna ANT2, the RF receive signal RXTDD7 may be received from the antenna ANT1, and the RF receive signal RXL3 may be received from the antenna ANT2 simultaneously during the second LTE diversity mode. Thus, the second LTE diversity mode may be synchronous and timed in accordance with time slots or, alternatively, the second LTE diversity mode may be asynchronous (or at least partially asynchronous) and not timed in accordance with the time slots.

FIGS. 9 and 9A-9C illustrate exemplary RF front-end circuitry that includes another embodiment of antenna switching circuitry 114. The antenna switching circuitry 114 is the same as the antenna switching circuitry 74 shown in FIGS. 7A-7C, except in this embodiment, the MTMEMS 14(3)(A) of FIG. 5 (rather than the MTMEMS 14(1)(A) of FIG. 7) may be coupled to the RF port RFHB1 and the MTMEMS 14(3)(B) of FIG. 4 (rather than the MTMEMS 14(1)(B) of FIG. 7) may be coupled to the RF port RFHB2. The antenna switching circuitry 114 includes the control circuit 46 described above. However, the MEMS subcontroller 58 generates the switch control output 50(5) and the switch control output 50(6), as explained above with respect to FIG. 5, rather than the switch control outputs 50(1) and 50(2).

The control circuit 46 in FIGS. 9 and 9A-9C is operable in the first LTE MIMO mode, the second LTE MIMO mode, the third LTE MIMO mode, the fourth LTE MIMO mode, the fifth LTE MIMO mode, and the first LTE diversity mode described above with respect to FIG. 7. However, with regard to the first LTE MIMO mode, the second LTE MIMO mode, the third LTE MIMO mode, the fourth LTE MIMO mode, the fifth LTE MIMO mode, and the first LTE diversity mode, the pole port 24(1)(A) of the MTMEMS 14(1)(A) of FIG. 7 corresponds to the pole port 24(3)(A) of the MTMEMS 14(3)(A) in FIG. 9A, and the throw ports 22(1)(A)-1, 22(1)(A)-2, 22(1)(A)-3, 22(1)(A)-4, 22(1)(A)-5, 22(1)(A)-6, 22(1)(A)-7, correspond to the throw ports 22(3)(A)-1, 22(3)(A)-2, 22(3)(A)-3, 22(3)(A)-4, 22(3)(A)-5, 22(3)(A)-6, 22(3)(A)-7 in FIG. 9A. Furthermore, the pole port 24(1)(B) of the MTMEMS 14(1)(B) of FIG. 7 corresponds to the pole port 24(3)(B) of the MTMEMS 14(3)(B) in FIG. 9A, and the throw ports 22(1)(B)-1, 22(1)(B)-2, 22(1)(B)-3, correspond to the throw ports 22(3)(B)-1, 22(3)(B)-2, 22(3)(B)-3 in FIG. 9A.

The control circuit 46 is also operable in a third LTE diversity mode. While the control circuit 46 is in the third LTE diversity mode, the control circuit 46 may generate the switch control output 50(SLB) with a switch control output permutation that results in the pole port 86 being selectively coupled to the throw port 88-1. Also, while the control circuit 46 is in the third LTE diversity mode, the control circuit 46 may generate the switch control output 50(5) with a switch control output permutation that results in the pole port 24(3)(A) being selectively coupled to the throw port 22(3)(A)-5 and the switch control output 50(6) with a switch control output permutation that results in the pole port 24(3)(B) being selectively coupled to the throw port 22(3)(B)-CO. Furthermore, the throw port 88-1 is operable to receive an RF transmission signal TXL4 from the RF transceiver circuitry (not shown) and to transmit an RF receive signal RXL4 to the transceiver circuitry at the RF port RFLB2. The control circuit 46 thus selectively couples the pole port 86 of the low band switching circuitry 78 to the throw port 88-1 while the control circuit 46 is in the third LTE diversity mode. Furthermore, the control circuit 46 sets the signal flow of the directional coupler 110LA to the transmission signal flow, the signal flow of the directional coupler 110LB to the receive signal flow, the signal flow of the directional coupler 110HA to the receive signal flow, and the signal flow of the directional coupler 110HB to the transmission signal flow while the control circuit 46 is in the third LTE diversity mode.

In the third LTE diversity mode, the RF receive signal RXTDD-CO is in the high band and the RF receive signal RXL4 is in a low band. Both the RF receive signal RXL4 and the RF receive signal RXTDD-CO are diversity receive signals and may include the same data. Additionally, the RF transmission signal TXTDD5 is in the high band and the RF transmission signal TXL4 is in a low band. Both the RF transmission signal TXTDD5 and the RF transmission signal TXL4 are diversity transmission signals and may include the same data. The RF transmission signals TXTDD5, TXL4 and the RF receive signals RXTDD-CO, RXL4 are all formatted in accordance with an LTE diversity specification in the third LTE diversity mode.

To transmit the RF transmission signal TXL4 from the antenna ANT1 during the time slot for transmission of both the RF transmission signal TXL4 and the RF transmission signal TXTDD5, the control circuit 46 controls the selective coupling of the low band antenna selection circuitry 82 such that the pole port 94 (and thus also the antenna port 20) is selectively coupled to the throw port 98-3. To transmit the RF transmission signal TXTDD5 from the antenna ANT2 during the time slot for transmission of the RF transmission signal TXL4 and the RF transmission signal TXTDD5, the control circuit 46 controls the selective coupling of the high band antenna selection circuitry 84 such that the pole port 104 is selectively coupled to the throw port 108-1 (and thus also to the antenna port 20'). The RF transmission signal TXTDD5 and the RF transmission signal TXL4 are thus transmitted simultaneously during the time slot for transmission of the RF transmission signal TXL4 and the RF transmission signal TXTDD5.

To receive the RF receive signal RXL4 from the antenna ANT2 during the time slot for reception of both the RF receive signal RXL4 and the RF receive signal RXTDD-CO, the control circuit 46 controls the selective coupling of the low band antenna selection circuitry 82 such that the pole port 96 (and thus also the antenna port 20') is selectively coupled to the throw port 100-3. To receive the RF receive signal RXTDD-CO from the antenna ANT1 during the time slot for reception of both the RF receive signal RXL4 and the RF receive signal RXTDD-CO, the control circuit 46 controls the selective coupling of the high band antenna selection circuitry 84 such that the pole port 102 (and thus also the antenna port 20) is selectively coupled to the throw port 106-3. The RF receive signal RXTDD-CO and the RF receive signal RXL4 are thus both received simultaneously during the time slot for reception of the RF receive signal RXL4 and the RF receive signal RXTDD-CO. Furthermore, the control circuit 46 is configured to decouple the pole port 86 from all of the throw ports 88 (or alternatively, to selectively couple the pole port 86 to the grounded throw port 88-5), and the pole port 90 from all of the throw ports 92 (or alternatively, to selectively couple the pole port 90 to the grounded throw port 92-5) while the control circuit 46 is in the third LTE diversity mode.

Referring now to FIGS. 10, 10A, and 10B, FIG. 10 illustrates exemplary RF front-end circuitry that includes another embodiment of antenna switching circuitry 118 operably associated with RF transceiver circuitry 120. The antenna switching circuitry 118 shown in FIG. 10 is designed to provide antenna switching functionality for a front-end transceiver module of a Worldphone or World tablet. Some high band receive diversity and receive LTE MIMO specifications for Worldphones and World tablets require operation with three antennas, where two of the three antennas are used to provide carrier aggregation for specified band combinations. In this embodiment, the antenna switching circuitry 118 is operable to provide switching functionality between the antenna ANT1 at the antenna port 20, the antenna ANT2 at the antenna port 20', and an antenna ANT3 at an antenna port 20''. The RF transceiver circuitry 120 includes a plurality of RF transceiver ports (referred to generically as elements TR, and specifically as elements TR1-TR29). Each of the RF transceiver ports TR may be coupled to one or more transmit chains and/or one or more receiver chains for processing RF signals. In this embodiment, the RF transceiver circuitry 120 has a plurality of transmit chains and a plurality of receiver chains. Each of these transmit chains may be configured to process RF transmission signals in one or more RF communication bands, and in accordance with one or more RF communication specifications. Similarly, each of the receiver chains may be configured to process one or more RF receive signals in one or more RF communication bands and/or in accordance with one or more RF communication specifications.

The antenna switching circuitry 118 is configured to selectively couple the RF transceiver ports TR to one or more of the antenna ANT1 at the antenna port 20, the antenna ANT2 at the antenna port 20', and the antenna ANT3 at the antenna port 20'', as described in further detail below. In FIG. 10, the antenna switching circuitry 118 includes the front-end switching circuitry 75 described above with respect to FIG. 7. The front-end switching circuitry 75 is coupled to the antenna port 20 and the antenna port 20' as described above. The antenna switching circuitry 118 also includes an MTMEMS 14(2)(B)' and a DPMTMEMS 122. Alternative embodiments may provide other types of MT switches instead of the MTMEMS 14(2)(B)' and the DPMTMEMS, such as an MTSTS rather than the MTMEMS 14(2)(B)' and a double pole MTSTS (DPMTSTS) rather than the DPMTMEMS. The antenna switching circuitry 118 also includes the MTMEMS 14(2)(A) coupled to the RF port RFHB1 as described above with regard to FIG. 4 and FIGS. 8 and 8A. However, the MTMEMS 14(2)(A) is not shown in FIG. 10 for the sake of clarity.

Referring again to FIGS. 10, 10A, and 10B, FIG. 10A illustrates a more detailed view of one embodiment of the MTMEMS 14(2)(B)'. The MTMEMS 14(2)(B)' includes the pole port 24(2)(B) as described above with respect to the MTMEMS 14(2)(B) in FIG. 4 and FIGS. 8 and 8A. The pole port 24(2)(B) is thus coupled to the RF port RFHB2 of the front-end switching circuitry 75. Like the MTMEMS 14(2)(B), the MTMEMS 14(2)(B)' includes the throw ports 22(2)(B)-ADD, 22(2)(B)-1, 22(2)(B)-2, 22(2)(B)-3, but in addition, the MTMEMS 14(2)(B)' includes the throw port 22(3)(B)-CO (of the MTMEMS 14(3)(B) described above with regard to FIGS. 5, 9, and 9A), and throw ports 126, 128, 130. The throw ports 22(2)(B)-ADD, 22(2)(B)-1, 22(2)(B)-2, 22(2)(B)-3, 22(3)(B)-CO, 126, 128, 130 of the MTMEMS 14(2)(B)' are referred to generically as throw ports RXT. The MTMEMS 14(2)(B)' is configured to selectively couple the throw port 24(2)(B) to any one of the throw ports RXT. The MEMS subcontroller 58 generates a switch control output 50(RXT) in accordance with the MEMS switch control mode output 64.

The antenna switching circuitry 118 includes the control circuit 46 described above. The master subcontroller 54 is included in the RF transceiver circuitry 120. Furthermore, the control circuit 46 further includes a MEMS subcontroller 58(T1) operably associated with the master subcontroller 54, which also receives the MEMS switch control mode output 64. The MEMS subcontroller 58(T1) generates a switch control output 50(T1) in accordance with the MEMS switch control mode output 64. Different switch control permutations of the switch control output 50(T1) may be provided to operate the DPMTMEMS 122 as described below.

The control circuit 46 operates in the same manner as the control circuit 46 described above with respect to FIGS. 8 and 8A-8C with respect to the throw ports 22(2)(B)-ADD, 22(2)(B)-1, 22(2)(B)-2, 22(2)(B)-3. As such, the control circuit 46 is operable in the first LTE MIMO mode, the second LTE MIMO mode, the third LTE MIMO mode, the fourth LTE MIMO mode, the fifth LTE MIMO mode, and the first LTE diversity mode described above with respect to FIGS. 8, 8A-8C. In addition, since the MTMEMS 14(2)(B)' also includes the throw port 22(3)(B)-CO that provides the RF receive signal RXTDD-CO (as described above with respect to FIGS. 9 and 9A-9C), the control circuit 46 is further operable in the third LTE diversity mode described above, except with the pole port 24(2)(B) rather than the pole port 24(3)(B). The MTMEMS 14(2)(B)' further includes the throw ports 126, 128, 130. The MTMEMS 14(2)(B)' is configured to transmit an RF receive signal RXMIMOA, an RF receive signal RXMIMOB, and an RF receive signal RXMIMOC from the throw ports 126, 128, 130, respectively. The operation of the control circuit 46 with respect to the RF receive signal RXMIMOA, the RF receive signal RXMIMOB, and the RF receive signal RXMIMOC is explained in further detail below.

Referring again to FIGS. 10, 10A, and 10B, FIG. 10B illustrates a more detailed view of one embodiment of the DPMTMEMS 122. As shown in FIG. 10B, the DPMTMEMS 122 includes a pole port 132 and a set of throw ports (referred to generically as elements 134, and specifically as elements 134(1), 134(2), 134(3), 134(4), 134(5)). The DPMTMEMS 122 also includes a pole port 136 and a set of throw ports (referred to generically as elements 138, and specifically as elements 138(1), 138(2), 138(3), 138(4), 138(5), 138(6), 138(7), 138(8), 138(9)). The DPMTMEMS 122 is configured to selectively couple the pole port 132 to any one of the throw ports 134, and to selectively couple the pole port 136 to any one of the throw ports 138. Each of the throw ports 134(1), 134(2), 134(3), 134(4), 134(5) is directly coupled to one of the throw ports 138(1), 138(2), 138(3), 138(4), 138(5), respectively. However, the throw ports 138(6), 138(7), 138(8), 138(9) are not coupled to any of the throw ports 134 and are thus independent throw ports. As a result, the DPMTMEMS 122 is only a partially integrated DPMTMEMS.

Referring again to FIGS. 10, 10A, and 10B, the antenna switching circuitry 118 includes a directional coupler 110C coupled between the pole port 136 of the DPMTMEMS 122 and the antenna port 20" (and thus the antenna ANT3). The throw switch network TSN is operably associated with the directional coupler 110C. Through the throw switch network TSN, the control circuit 46 is configured to switch a signal flow of the directional coupler 110C using the switch control output 50(TSN). The antenna ANT3 is configured so as to operate in the high band. By selectively coupling one of the throw ports 138 to the pole port 136, the control circuit 46 selectively couples the antenna port 20" and the antenna ANT3 to the selected throw port 138. When the control circuit 46 decouples all of the throw ports 138 from the pole port 136, the antenna port 20" and the antenna ANT3 are decoupled.

Note that in this embodiment, the pole port 132 is coupled to the RF port RFHB3 of the front-end switching circuitry 75. Since each of the throw ports 134(1), 134(2), 134(3), 134(4), 134(5) is directly coupled to one of the throw ports 138(1), 138(2), 138(3), 138(4), 138(5), the antenna port 20" and the antenna ANT3 are coupled to the RF port RFHB3 when the pole port 136 is selectively coupled to any one of the throw ports 138(1), 138(2), 138(3), 138(4), 138(5), and when the pole port 132 is selectively coupled to the throw port 134(1), 134(2), 134(3), 134(4), 134(5) that is directly connected to the selected one of the throw ports 138(1), 138(2), 138(3), 138(4), 138(5). The antenna port 20" and the antenna ANT3 are decoupled from the RF port RFHB3 when 1) the pole port 136 is decoupled from all of the throw ports 138; 2) the pole port 132 is not selectively coupled to the throw port 134(1), 134(2), 134(3), 134(4), 134(5) that is directly connected to the throw port 138(1), 138(2), 138(3), 138(4), 138(5) that is selectively coupled to the pole port 136; 3) the pole port 132 is decoupled from all of the throw ports 134 (or alternatively, it is coupled to a grounded throw port (not shown)); or 4) the throw port 136 is selectively coupled to one of the throw ports 138(6), 138(7), 138(8), 138(9) (i.e., the independent throw ports).

As shown in FIGS. 10 and 10B, each of the throw ports 138(1), 138(2), 138(3), 138(4), 138(5), 138(6), 138(7), 138(8) is further coupled to the RF transceiver circuitry 120. More specifically, each of the throw ports 138(1), 138(2), 138(3), 138(4), 138(5), 138(6), 138(7), 138(8) is coupled to one of the RF transceiver ports TR8, TR9, TR24, TR25, TR26, TR27, TR28, TR29, respectively. The antenna port 20"

and the antenna ANT3 are selectively coupled to one of the RF transceiver ports TR27, TR28, TR29 when the pole port 136 is selectively coupled to any one of the throw ports 138(6), 138(7), 138(8), regardless of which throw port 134 is selectively coupled to the pole port 132. In contrast, the antenna port 20" and the antenna ANT3 are selectively coupled to one of the RF transceiver ports TR8, TR9, TR24, TR25, TR26 when the pole port 136 is selectively coupled to any one of the throw ports 138(1), 138(2), 138(3), 138(4), 138(5) and when either the pole port 132 is not selectively coupled to the throw port 134(1), 134(2), 134(3), 134(4), 134(5) that is directly connected to the selected one of the throw ports 138(1), 138(2), 138(3), 138(4), 138(5), or the pole port 132 is decoupled from all of the throw ports 134 (or alternatively, is coupled to a grounded throw port (not shown)).

Since the throw ports 138(6), 138(7), 138(8), 138(9) are independent throw ports, the RF port RFHB3 cannot be coupled to the RF transceiver ports TR27, TR28, TR29 of the DPMTMEMS 122. However, the RF port RFHB3 is selectively coupled to any one of the RF transceiver ports TR8, TR9, TR24, TR25, TR26, when the pole port 132 is selectively coupled to any one of the throw ports 134(1), 134(2), 134(3), 134(4), 134(5) and when 1) the throw port 136 is selectively coupled to one of the throw ports 138(6), 138(7), 138(8), 138(9); 2) the pole port 136 is not selectively coupled to the throw port 138(1), 138(2), 138(3), 138(4), 138(5) that is directly connected to the selected one of the throw ports 134(1), 134(2), 134(3), 134(4), 134(5); or 3) the pole port 136 is decoupled from all of the throw ports 138(1), 138(2), 138 (3), 138(4), 138(5). Note that it is possible for the RF port RFHB3 to be selectively coupled to one of the RF transceiver ports TR8, TR9, TR24, TR25, TR26 and the antenna port 20" to be simultaneously selectively coupled to any one of the RF transceiver ports TR8, TR9, TR24, TR25, TR26, TR27, TR28, TR29, so long as the pole port 136 is not simultaneously selectively coupled to the throw port 138(1), 138(2), 138(3), 138(4), 138(5) that is directly connected to the selected one of the throw ports 134(1), 134(2), 134(3), 134 (4), 134(5).

With respect to the first LTE MIMO mode, the second LTE MIMO mode, the third LTE MIMO mode, the fourth LTE MIMO mode, the fifth LTE MIMO mode, the second LTE diversity mode, and the third LTE diversity mode, the control circuit 46 operates as described above with respect to the antenna port 20 and the antenna port 20', while the antenna port 20" and the antenna ANT3 are not used. Accordingly, the control circuit 46 selectively couples the pole port 136 of the DPMTMEMS 122 to the throw port 138(9) (the grounded throw port 138) or decouples the pole port 136 from all of the throw ports 138 while the control circuit 46 is in the first LTE MIMO mode, the second LTE MIMO mode, the third LTE MIMO mode, the fourth LTE MIMO mode, the fifth LTE MIMO mode, the second LTE diversity mode, or the third LTE diversity mode.

In this embodiment, the RF transmission signal TXMIMO1 is received from the RF transceiver port TR8 and the RF receive signal RXMIMO1 is transmitted from the RF transceiver port TR8. As such, in the first LTE MIMO mode, the control circuit 46 selectively couples the pole port 132 of the MTMEMS to the throw port 134(1).

The control circuit 46 is also operable in a sixth LTE MIMO mode. The control circuit 46 sets the signal flow of the directional coupler 110HA to the receive signal flow, the signal flow of the directional coupler 110HB to the receive signal flow, and the signal flow of the directional coupler 110C to the receive signal flow while the control circuit 46 is in the sixth LTE MIMO mode. In the sixth LTE MIMO mode, an RF receive signal RXP1 is a primary receive MIMO signal and the RF receive signal RXMIMOA is a secondary receive MIMO signal. Both of the RF receive signals RXP1, RXMIMOA are in a high band.

While the control circuit 46 is in the sixth LTE MIMO mode, the control circuit 46 controls the selective coupling of the MTMEMS 14(2)(B)' such that the pole port 24(2)(B) is selectively coupled to the throw port 130 shown in FIG. 10A. In this manner, the RF receive signal RXMIMOA may be transmitted to the RF transceiver port TR15 in the RF transceiver circuitry from the throw port 130. However, as explained in further detail below, the RF receive signal RXMIMOA may also be transmitted from the RF transceiver port TR27 to the RF transceiver circuitry 120. The RF receive signal RXP1 is transmitted to the RF transceiver port TR25 from the throw port 138(4) in the DPMTMEMS 122 as shown in FIG. 10B.

The control circuit 46 also controls the selective coupling of the DPMTMEMS 122 such that the pole port 132 is selectively coupled to the throw port 134(4), and thus the RF port RFHB3 is coupled to the throw port 134(4) while the control circuit 46 is in the sixth LTE MIMO mode. To receive the RF receive signal RXP1 at the antenna port 20" from the antenna ANT3 during the sixth LTE MIMO mode, the control circuit 46 controls the selective coupling of the DPMTMEMS 122 such that the pole port 136 is selectively coupled to the throw port 138(4). The pole ports 94, 96, 102, 104 are also decoupled from the throw ports 98-4, 100-4, 106-4, and 108-4. Instead, to receive the RF receive signal RXMIMOA from the antenna ANT1 at the antenna port 20 during the sixth LTE MIMO mode when the antenna port 20" receives the RF receive signal RXP1, the control circuit 46 selectively couples the pole port 102 to the throw port 106-3. In this manner, the RF port RFHB2 is selectively coupled to the pole port 102 and the antenna ANT1, and the RF receive signal RXMIMOA is transmitted to the RF transceiver port TR15.

In contrast, to receive the RF receive signal RXMIMOA from the antenna ANT2 at the antenna port 20' during the sixth LTE MIMO mode when the antenna port 20" receives the RF receive signal RXP1, the control circuit 46 selectively couples the pole port 104 to the throw port 108-3. In this manner, the RF port RFHB2 is selectively coupled to the pole port 104 and the antenna ANT2 and the RF receive signal RXMIMOA is transmitted to the RF transceiver port TR15. Accordingly, the control circuit 46 is configured to select from which antenna ANT1, ANT2 to receive the RF receive signal RXMIMOA (the secondary receive MIMO signal) during the sixth LTE MIMO mode when the antenna port 20" (and thus the antenna ANT3) receives the RF receive signal RXP1 (the primary receive MIMO signal).

To receive the RF receive signal RXMIMOA at the antenna port 20" from the antenna ANT3 in the sixth LTE MIMO mode, the control circuit 46 controls the selective coupling of the DPMTMEMS 122 such that the pole port 136 is selectively coupled to the throw port 138(6). In this case, the RF receive signal RXMIMOA provided by the antenna ANT3 is transmitted from the throw port 138(6) to the RF transceiver port TR27 in the RF transceiver circuitry 120. The pole ports 94, 96, 102, 104 are decoupled from the throw ports 98-3, 100-3, 106-3, and 108-3. Instead, to receive the RF receive signal RXP1 from the antenna ANT1 at the antenna port 20 during the sixth LTE MIMO mode when the antenna port 20" receives the RF receive signal RXMIMOA, the control circuit 46 selectively couples the pole port 102 to the throw port 106-4. As mentioned above, the pole port 132 is still coupled to the throw port 134(4). In this manner, the RF port RFHB3 is selectively coupled to the pole port 102 and the antenna ANT1, and the RF receive signal RXP1 is transmitted to the RF transceiver port TR25.

In contrast, to receive the RF receive signal RXP1 from the antenna ANT2 at the antenna port 20' during the sixth LTE MIMO mode when the antenna port 20" receives the RF receive signal RXMIMOA, the control circuit 46 selectively couples the pole port 104 to the throw port 108-4. In this manner, the RF port RFHB3 is selectively coupled to the pole port 104 and the antenna ANT2, and the RF receive signal RXP1 is transmitted to the RF transceiver port TR25. Accordingly, the control circuit 46 is configured to select from which antenna ANT1, ANT2 to receive the RF receive signal RXP1 (the primary receive MIMO signal) during the sixth LTE MIMO mode when the antenna port 20" (and thus the antenna ANT3) receives the RF receive signal RXMIMOA (the secondary receive MIMO signal). Also note that while the control circuit 46 is in the sixth LTE MIMO mode, the control circuit 46 is configured to select whether to receive the RF receive signal RXP1 from the antenna ANT3 (and thus at the antenna port 20") or from either of the antennas ANT1, ANT2 (and thus at either of the antenna ports 20, 20').

The control circuit 46 is also operable in a fourth LTE diversity mode. The control circuit 46 sets the signal flow of the directional coupler 110HA to the receive signal flow, the signal flow of the directional coupler 110HB to the receive signal flow, and the signal flow of the directional coupler 110C to the receive signal flow while the control circuit 46 is in the fourth LTE diversity mode. In the fourth LTE diversity mode, the RF receive signal RXTDD-CO is one of the diversity receive signals, which, as mentioned above, is in the high band. An RF receive signal RXD1 is another diversity receive signal and is also in a high band. The RF receive signal RXD1 and the RF receive signal RXTDD-CO may each be encoded with the same data. While the control circuit 46 is in the fourth LTE diversity mode, the control circuit 46 controls the selective coupling of the MTMEMS 14(2)(B)' such that the pole port 24(2)(B) is selectively coupled to the throw port 22(3)(B)-CO. In this manner, the RF receive signal RXTDD-CO may be transmitted to the RF transceiver port TR18 in the RF transceiver circuitry 120 by the throw port 22(3)(B)-CO as shown in FIG. 10B. The RF receive signal RXD1 may also be transmitted to the RF transceiver port TR28 and to the RF transceiver circuitry 120 as shown in FIG. 10B.

Referring again to FIGS. 10, 10A, and 10B, the control circuit 46 also controls the selective coupling of the DPMT-MEMS 122 such that the pole port 132 is decoupled from all of the throw ports 134 (or alternatively, is coupled to a grounded throw port (not shown)). Furthermore, the control circuit 46 also controls the selective coupling of the DPMT-MEMS 122 such that the pole port 136 is selectively coupled to the throw port 138(7). As such, the RF receive signal RXD1 (one of the diversity receive signals) is received from the antenna port 20" (and thus the antenna ANT3) while the control circuit 46 is in the fourth LTE diversity mode. To receive the RF receive signal RXTDD-CO from the antenna ANT1 at the antenna port 20 during the fourth LTE diversity mode, the control circuit 46 selectively couples the pole port 102 to the throw port 106-3. In this manner, the RF port RFHB2 is selectively coupled to the pole port 102 and the antenna ANT1, and the RF receive signal RXTDD-CO is transmitted to the RF transceiver port TR18. In contrast, to receive the RF receive signal RXTDD-CO from the antenna ANT2 at the antenna port 20' during the fourth LTE diversity mode, the control circuit 46 selectively couples the pole port 104 to the throw port 108-3. In this manner, the RF port RFHB2 is selectively coupled to the pole port 104 and the antenna ANT2, and the RF receive signal RXTDD-CO is transmitted to the RF transceiver port TR18, as shown in FIG. 10B. Accordingly, the control circuit 46 is configured to select from which antenna ANT1, ANT2 to receive the RF receive signal RXTDD-CO (the other diversity receive signal) during the fourth LTE diversity mode when the antenna port 20" (and thus the antenna ANT3) receives the RF receive signal RXD1.

FIG. 11 illustrates exemplary RF front-end circuitry that includes another embodiment of front-end switching circuitry 75'. The front-end switching circuitry 75' is similar to the front-end switching circuitry 75 shown in FIGS. 7, 7B, 7C, 8, 8B, 8C, 9, 9B, 9C, and 10. The front-end switching circuitry 75' includes the low band switching circuitry 78 and the high band switching circuitry 80 described above with respect to FIGS. 7, 7B, 8, 8B, 9, 9B, and 10. However, in this embodiment, the front-end switching circuitry 75' has low band antenna selection circuitry 82' and high band antenna selection circuitry 84'.

The low band antenna selection circuitry 82' is the same as the low band antenna selection circuitry 82 in FIGS. 7, 7C, 8, 8C, 9, 9C, and 10, except that in this embodiment, the throw ports 98 of the low band antenna selection circuitry 82' further include a throw port 98-M1 and a throw port 98-M2, and the throw ports 100 further include a throw port 100-M1 and a throw port 100-M2. The throw ports 98-M1 and 98-M2 are not coupled to any of the throw ports 100 and the throw ports 100-M1 and 100-M2 are not coupled to any of the throw ports 98. Thus, each of the throw ports 98-M1, 98-M2, 100-M1, 100-M2 is an independent throw port. The low band antenna selection circuitry 82' is a DPMTMEMS that is only partially integrated, because the throw ports 98-M1 and 98-M2 are not coupled to any of the throw ports 100 and the throw ports 100-M1 and 100-M2 are not coupled to any of the throw ports 98.

With regard to the high band antenna selection circuitry 84', the high band antenna selection circuitry 84' is the same as the high band antenna selection circuitry 84 in FIGS. 7, 7C, 8, 8C, 9, 9C, and 10, except that in this embodiment, the throw ports 106 of the high band antenna selection circuitry 84' further include a throw port 106-M1 and a throw port 106-M2, and the throw ports 108 further include the throw port 108-M1 and the throw port 108-M2. Otherwise, the front-end switching circuitry 75' is the same as the front-end switching circuitry 75 and thus embodiments of the front-end switching circuitry 75' may be used with the embodiments of the antenna switching circuitry 74 illustrated in FIGS. 7, 7B, 7C, 8, 8B, 8C, 9, 9B, 9C, and 10. The control circuit 46 thus operates the front-end switching circuitry 75' in the same manner as described above with respect to the first LTE MIMO mode through the sixth LTE MIMO mode, and with respect to the first LTE diversity mode through the fourth LTE diversity mode.

As shown in FIG. 11, the throw ports 106-M1 and 106-M2 are not coupled to any of the throw ports 108 and the throw ports 108-M1 and 108-M2 are not coupled to any of the throw ports 106. Thus, each of the throw ports 106-M1, 106-M2, 108-M1, 108-M2 is an independent throw port. Accordingly, the high band antenna selection circuitry 84' is a DPMT-MEMS that is only partially integrated, because the throw ports 106-M1 and 106-M2 are not coupled to any of the throw ports 108 and the throw ports 108-M1 and 108-M2 are not coupled to any of the throw ports 106. Since the throw ports 106-M1, 106-M2, 108-M1, 108-M2 are independent, the throw ports 98-M1, 98-M2, 100-M1, 100-M2, 106-M1, 106-M2, 108-M1, 108-M2 experience less capacitance. This allows for low insertion losses and better RF performance.

In this embodiment, the throw ports 98-M1, 98-M2, 100-M1, 100-M2, 106-M1, 106-M2, 108-M1, 108-M2 further permit the control circuit 46 to operate in several modes, including carrier aggregation modes. These carrier aggregation modes provide antenna switching functionality in order to implement RF communication specifications that require RF signals to be formatted based on diversity and/or MIMO. The carrier aggregation modes may be used for both transmit diversity and transmit MIMO RF specifications, and thus may be implemented in different LTE MIMO modes and diversity modes.

The control circuit 46 is operable in various carrier aggregation modes. For example, the control circuit 46 operates in accordance with carrier aggregation modes that provide low band/low band transmit carrier aggregation, high band/high band receive carrier aggregation, low band/high band transmit carrier aggregation, high band/low band receive carrier aggregation, high band/high band transmit carrier aggregation, or low band/low band receive carrier aggregation. The carrier aggregation modes may provide additional versatility in that these carrier aggregation modes can be implemented so as to be applicable to RF communication specifications for both LTE diversity and LTE MIMO.

FIG. 11A illustrates the front-end switching circuitry 75' while the control circuit 46 is operating in a low band/low band transmit/high band/high band receive (LLT/HHR) carrier aggregation mode. The control circuit 46 sets the signal flow of the directional coupler 110LA to the transmission signal flow, and sets the signal flow of the directional coupler 110HA to the receive signal flow. The control circuit 46 also sets the signal flow of the directional coupler 110LB to the transmission signal flow, and sets the signal flow of the directional coupler 110HB to the receive signal flow.

While the control circuit 46 is in the LLT/HHR carrier aggregation mode, the control circuit 46 controls the selective coupling of the low band antenna selection circuitry 82' such that the pole port 94 is selectively coupled to the throw port 98-M1, controls the selective coupling of the low band antenna selection circuitry 82' such that the pole port 96 is selectively coupled to the throw port 100-M2, controls the selective coupling of the high band antenna selection circuitry 84' such that the pole port 102 is selectively coupled to the throw port 106-M1, and controls the selective coupling of the high band antenna selection circuitry 84' such that the pole port 104 is selectively coupled to the throw port 108-M2. Since the pole port 94 is selectively coupled to the throw port 98-M1, the antenna ANT1, the antenna port 20, and the low band port 101LA are thus also selectively coupled to the throw port 98-M1. Additionally, since the pole port 96 is selectively coupled to the throw port 100-M2, the antenna ANT2, the antenna port 20', and the low band port 101LB are selectively coupled to the throw port 100-M2. Furthermore, since the pole port 102 is selectively coupled to the throw port 106-M1, the antenna ANT1, the antenna port 20, and the high band port 101HA are selectively coupled to the throw port 106-M1. Finally, since the pole port 104 is selectively coupled to the throw port 108-M2, the antenna ANT2, the antenna port 20', and the high band port 101HB are also selectively coupled to the throw port 108-M2.

The throw port 98-M1 is coupled to receive an RF transmission signal TXCA1 from the RF transceiver circuitry (not shown) and is selectively coupled to the pole port 94. The throw port 100-M2 is coupled to receive an RF transmission signal TXCA2 from the RF transceiver circuitry and is selectively coupled to the pole port 96. The RF transmission signal TXCA1 and the RF transmission signal TXCA2 are each in a low band and propagate through the low band port 101LA, 101LB, respectively. Accordingly, the RF transmission signal TXCA1 is transmitted from the antenna ANT1 at the antenna port 20 and the RF transmission signal TXCA2 is transmitted from the antenna ANT2 at the antenna port 20'. When the RF transmission signal TXCA1 and the RF transmission signal TXCA2 are diversity signals with the same data, there is no need to switch which of the antennas ANT1, ANT2 is used to transmit the RF transmission signals TXCA1, TXCA2. However, when the RF transmission signal TXCA1 and the RF transmission signal TXCA2 are MIMO signals formatted in accordance with an RF MIMO specification, the RF transmission signal TXCA1 and the RF transmission signal TXCA2 may be provided to either one of the antennas ANT1, ANT2.

To select which of the antennas ANT1, ANT2 transmits the RF transmission signal TXCA1 and the RF transmission signal TXCA2, the throw ports 98-M1, 100-M2 are swapped so that the RF transmission signal TXCA2 is received at the throw port 98-M1 from the RF transceiver circuitry and the RF transmission signal TXCA1 is received at the throw port 100-M2 from the RF transceiver circuitry. In this manner, switching is not required by the front-end switching circuitry 75' in order to select which of the antennas ANT1, ANT2 transmits the RF transmission signal TXCA1 and the RF transmission signal TXCA2. This therefore reduces the switching operations of the front-end switching circuitry 75' and thereby increases performance. Furthermore, the LLT/HHR carrier aggregation mode may be used to implement an LTE diversity specification or an LTE MIMO specification with the RF transmission signal TXCA1 and the RF transmission signal TXCA2. The swapping of the throw ports 98-M1, 100-M2 with regard to the RF transmission signals TXCA1, TXCA2 may be implemented by the RF transceiver circuitry, as explained in further detail below.

With regard to reception, the throw port 106-M1 is selectively coupled to the pole port 102 (and thus the high band port 101HA) so that the throw port 106-M1 transmits an RF receive signal RXCA1 to the RF transceiver circuitry (not shown). The throw port 108-M2 is selectively coupled to the pole port 104 (and thus the high band port 101HB) so that the pole port 104 transmits an RF receive signal RXCA2 to the RF transceiver circuitry (not shown). Each of the RF receive signal RXCA1 and the RF receive signal RXCA2 is in a high band. Accordingly, the RF receive signal RXCA1 is received by the antenna ANT1 at the antenna port 20 and the RF receive signal RXCA2 is received by the antenna ANT2 at the antenna port 20'.

When the RF receive signal RXCA1 and the RF receive signal RXCA2 are diversity signals with the same data, there is no need to switch which of the antennas ANT1, ANT2 is used to receive the RF receive signals RXCA1, RXCA2. However, when the RF receive signal RXCA1 and the RF receive signal RXCA2 are MIMO signals formatted in accordance in an LTE MIMO specification, the RF receive signal RXCA1 and the RF receive signal RXCA2 may be provided to either one of the antennas ANT1, ANT2. To select which of the antennas ANT1, ANT2 receives the RF receive signal RXCA1 and the RF receive signal RXCA2, the throw ports 106-M1, 108-M2 are swapped. For example, the RF receive signal RXCA2 may be received at the throw port 106-M1 and the RF receive signal RXCA1 may be received at the throw port 108-M2. The swapping of the throw ports 106-M1, 108-M2 with regard to the RF receive signals RXCA1, RXCA2 may be implemented by the RF transceiver circuitry. As such, switching is not required by the front-end switching circuitry 75', which increases the performance of the front-end switching circuitry 75'.

FIG. 11B illustrates the front-end switching circuitry 75' while the control circuit 46 is operating in a high band-high band transmit/low band-low band receive (HHT/LLR) carrier aggregation mode. The control circuit 46 sets the signal flow of the directional coupler 110LA to the receive signal flow, and sets the signal flow of the directional coupler 110HA to the transmission signal flow. The control circuit 46 also sets the signal flow of the directional coupler 110LB to the receive signal flow, and sets the signal flow of the directional coupler 110HB to the transmission signal flow.

While the control circuit 46 is in the HHT/LLR carrier aggregation mode, the control circuit 46 controls the selective coupling of the low band antenna selection circuitry 82' such that the pole port 94 is selectively coupled to the throw port 98-M2, controls the selective coupling of the low band antenna selection circuitry 82' such that the pole port 96 is selectively coupled to the throw port 100-M1, controls the selective coupling of the high band antenna selection circuitry 84' such that the pole port 102 is selectively coupled to the throw port 106-M2, and controls the selective coupling of the high band antenna selection circuitry 84' such that the pole port 104 is selectively coupled to the throw port 108-M1.

Since the pole port 94 is selectively coupled to the throw port 98-M2, the antenna ANT1, the antenna port 20, and the low band port 101LA are selectively coupled to the throw port 98-M2. Since the pole port 96 is selectively coupled to the throw port 100-M1, the antenna ANT2, the antenna port 20', and the low band port 101LB are also selectively coupled to the throw port 100-M1. Additionally, since the pole port 102 is selectively coupled to the throw port 106-M2, the antenna ANT1, the antenna port 20, and the high band port 101HA are selectively coupled to the throw port 106-M2. Finally, since the pole port 104 is selectively coupled to the throw port 108-M1, the antenna ANT2, the antenna port 20', and the high band port 101HB are also selectively coupled to the throw port 108-M1.

By having the throw port 98-M2 selectively coupled to the pole port 94, the throw port 98-M2 is coupled to transmit an RF receive signal RXCA3 to the RF transceiver circuitry (not shown) from the antenna ANT1. Similarly, the throw port 100-M1 is coupled to transmit an RF receive signal RXCA4 to the RF transceiver circuitry from the antenna ANT2 since the throw port 100-M1 is selectively coupled to the pole port 96. When the RF receive signal RXCA3 and the RF receive signal RXCA4 are diversity signals with the same data, there is no need to switch which of the antennas ANT1, ANT2 is used to receive the RF receive signals RXCA3, RXCA4. However, when the RF receive signal RXCA3 and the RF receive signal RXCA4 are MIMO signals formatted in accordance with an LTE MIMO specification, the RF receive signal RXCA3 and the RF receive signal RXCA4 may be provided to either one of the antennas ANT1, ANT2. For example, the RF receive signal RXCA4 may be received at the throw port 98-M2, rather than the throw port 100-M1, and the RF receive signal RXCA3 may be received at the throw port 100-M1, rather than the throw port 98-M2. The swapping of the throw ports 98-M2, 100-M1 with regard to the RF receive signals RXCA3, RXCA4 may be implemented by the RF transceiver circuitry. As such, switching is not required by the front-end switching circuitry 75', which increases the performance of the front-end switching circuitry 75'.

By having the throw port 106-M2 selectively coupled to the pole port 102, the throw port 106-M2 is coupled to transmit an RF transmission signal TXCA3 from the RF transceiver circuitry to the antenna ANT1 at the antenna port 20. The throw port 108-M1 is coupled to transmit an RF transmission signal TXCA4 from the RF transceiver circuitry to the antenna ANT2 at the antenna port 20' since the throw port 108-M1 is selectively coupled to the pole port 104. Each of the RF transmission signal TXCA3 and the RF transmission signal TXCA4 is in a high band. When the RF transmission signal TXCA3 and the RF transmission signal TXCA4 are diversity signals with the same data, there is no need to switch which of the antennas ANT1, ANT2 is used to transmit the RF transmission signal TXCA3, TXCA4. However, when the RF transmission signal TXCA3 and the RF transmission signal TXCA4 are MIMO signals formatted in accordance with an LTE MIMO specification, the RF transmission signal TXCA3 and the RF transmission signal TXCA4 may be provided to either one of the antennas ANT1, ANT2. For example, the RF transmission signal TXCA4 may be received at the throw port 106-M2 from the RF transceiver circuitry, rather than at the throw port 108-M1, and the RF transmission signal TXCA3 may be received at the throw port 108-M1, rather than at the throw port 106-M2. The swapping of the throw ports 106-M2, 108-M1 with regard to the RF transmission signals TXCA3, TXCA4 may be implemented by the RF transceiver circuitry. As such, switching is not required by the front-end switching circuitry 75', which increases the performance of the front-end switching circuitry 75'.

FIG. 11C illustrates the front-end switching circuitry 75' while the control circuit 46 is operating in a low band/high band transmit/low band/high band receive (LHT/LHR) carrier aggregation mode. Initially, the control circuit 46 sets the signal flow of the directional coupler 110LA to the transmission signal flow, and sets the signal flow of the directional coupler 110HA to the transmission signal flow. The control circuit 46 also sets the signal flow of the directional coupler 110LB to the receive signal flow, and sets the signal flow of the directional coupler 110HB to the receive signal flow.

While the control circuit 46 is initially in the HHT/LLR carrier aggregation mode, the control circuit 46 controls the selective coupling of the low band antenna selection circuitry 82' such that the pole port 94 is selectively coupled to the throw port 98-M1, controls the selective coupling of the low band antenna selection circuitry 82' such that the pole port 96 is selectively coupled to the throw port 100-M1, controls the selective coupling of the high band switching circuitry 80 such that the pole port 90 is selectively coupled to the throw port 92-3, controls the selective coupling of the high band antenna selection circuitry 84' such that the pole port 102 is selectively coupled to the throw port 106-2, and controls the selective coupling of the high band antenna selection circuitry 84' such that the pole port 104 is selectively coupled to the throw port 108-3.

In this example, an RF transmission signal TXCA5 is received at the throw port 98-M1 from RF transceiver circuitry and transmitted by the antenna ANT1 at the antenna port 20. An RF receive signal RXCA5 is received by the antenna ANT2 at the antenna port 20' and is transmitted to the RF transceiver circuitry from the throw port 100-M1. The RF transmission signal TXCA5 and the RF receive signal RXCA5 are both in a low band. Also, an RF transmission signal TXCA6 is received at the throw port 92-3 from the RF transceiver circuitry. The RF transmission signal TXCA6 is then transmitted to the pole port 90 and is received by the throw port 106-2. Since the throw port 106-2 is selectively coupled to the pole port 102, the transmission signal TXCA6 is transmitted by the antenna ANT1 at the antenna port 20. An RF receive signal RXCA6 is received at the antenna ANT2 at the antenna port 20' and is transmitted to the throw port 108-3 and then the RF port RFHB2. The RF transmission signal TXCA6 and the RF receive signal RXCA6 are both in a high band.

When the RF transmission signals TXCA5, TXCA6 and the RF receive signal RXCA5, RXCA6 are diversity signals with the same data, there is no need to switch which of the antennas ANT1, ANT2 is used to transmit the RF transmission signals TXCA5, TXCA6 and the RF receive signals RXCA5, RXCA6. However, when the RF transmission signals TXCA5, TXCA6 and the RF receive signal RXCA5, RXCA6 are MIMO signals formatted in accordance with an RF MIMO specification, the RF transmission signals TXCA5, TXCA6 and the RF receive signals RXCA5, RXCA6 may be provided to either one of the antennas ANT1, ANT2.

FIG. 11D illustrates the front-end switching circuitry 75' while the control circuit 46 is still operating in the LHT/LHR carrier aggregation mode but after the antennas ANT1, ANT2 have been swapped. To switch the antennas ANT1, ANT2, the control circuit 46 sets the signal flow of the directional coupler 110LA to the receive signal flow, and sets the signal flow of the directional coupler 110HA to the receive signal flow. The control circuit 46 also sets the signal flow of the directional coupler 110LB to the transmission signal flow, and sets the signal flow of the directional coupler 110HB to the transmission signal flow.

While the control circuit 46 is in the LHT/LHR carrier aggregation mode and to switch the antennas ANT1, ANT2, the control circuit 46 controls the selective coupling of the low band antenna selection circuitry 82' such that the pole port 94 is selectively coupled to the throw port 98-M1, controls the selective coupling of the low band antenna selection circuitry 82' such that the pole port 96 is selectively coupled to the throw port 100-M1, controls the selective coupling of the high band switching circuitry 80 such that the pole port 90 is selectively coupled to the throw port 92-3, controls the selective coupling of the high band antenna selection circuitry 84' such that the pole port 102 is selectively coupled to the throw port 106-3, and controls the selective coupling of the high band antenna selection circuitry 84' such that the pole port 104 is selectively coupled to the throw port 108-2.

Since the pole port 94 is selectively coupled to the throw port 98-M1, the antenna ANT1, the antenna port 20, and the low band port 101LA are selectively coupled to the throw port 98-M1. Since the pole port 96 is selectively coupled to the throw port 100-M1, the antenna ANT2, the antenna port 20', and the low band port 101LB are also selectively coupled to the throw port 100-M1. Additionally, since the pole port 102 is selectively coupled to the throw port 106-3, the antenna ANT1, the antenna port 20, and the high band port 101HA are selectively coupled to the throw port 106-3, and thus to the RF port RFHB2. Finally, since the pole port 104 is selectively coupled to the throw port 108-2, the antenna ANT2, the antenna port 20', and the high band port 101HB are also selectively coupled to the throw port 108-2 and the throw port 92-3.

In this example, the RF transmission signal TXCA5 is received at the throw port 100-M1 from the RF transceiver circuitry and is transmitted by the antenna ANT2 at the antenna port 20'. The RF receive signal RXCA5 is received by the antenna ANT1 at the antenna port 20 and is transmitted to the RF transceiver circuitry from the throw port 98-M1. The RF transmission signal TXCA6 is received at the throw port 92-3 and is transmitted to the throw port 108-2. The throw port 108-2 receives the RF transmission signal TXCA6 so that the RF transmission signal TXCA6 is transmitted by the antenna ANT2 at the antenna port 20'. The RF receive signal RXCA6 is received by the antenna ANT1 at the antenna port 20 and is then transmitted to the throw port 106-3. The throw port 106-3 then receives the RF receive signal RXCA6 and transmits the RF receive signal RXCA6 to the RF port RFHB2. While the control circuit 46 is in the LHT/LHR carrier aggregation mode, the control circuit 46 is operable to switch to and from the switching configurations shown in FIG. 11C and FIG. 11D in order to swap the antennas ANT1, ANT2 based on TRP and/or TIS measurements.

FIG. 12 illustrates one embodiment of a RF front-end module 140. The RF front-end module 140 includes the front-end switching circuitry 75' described above with respect to FIGS. 11 and 11A-11D. In addition, the RF front-end module 140 includes RF transceiver circuitry 142, which in this example has transmit chains (referred to generically as elements 144, and specifically as elements 144A-144D). The transmit chains 144 of the RF transceiver circuitry 142 are configured to allow antenna swapping as described above with respect to FIGS. 11A-11D.

At a beginning of the transmit chains 144, a digital multiplexer DMUX that receives data signal D1 and data signal D2 with encoded data. The digital multiplexer DMUX is operable to select one or both of the data signals D1, D2. In this example, it is presumed that both the data signal D1 and the data signal D2 have been selected for the sake of simplicity. The data signals D1, D2 are then each received by a digital modulator DM1, DM2, respectively.

The digital modulator DM1 is configured to convert the data signal D1 into an I signal IS1 and a Q signal Q1. Similarly, the digital modulator DM2 is configured to convert the data signal D2 into an I signal IS2 and a Q signal Q2. The I signal IS1 and the Q signal Q1 are then measured by a gain control circuit GCC1, while the I signal IS2 and the Q signal Q2 are measured by a gain control circuit GCC2. Based on the I signals IS1, IS2 and the Q signals Q1, Q2, the gain control circuits GCC1, GCC2 each generate a differential gain control signal Vramp1, Vramp2 respectively. The differential gain control signals Vramp1, Vramp2 are used to regulate power, as explained in further detail below.

The I signal IS1 and the Q signal Q1 are then fed into a digital gain controller DGC1 and the I signal IS2 and the Q signal Q2 are fed into a digital gain controller DGC2. Each of the digital gain controllers DCG1, DGC2 is programmable to generate differential digital signals (not shown) at base band, which are fed into digital-to-analog converters DACs and then filtered by filters F1, F2, F3, F4. Resultant RF signals (not shown) are then received by mixers MAL, MAH, MBL, MBH. The mixer MAL is configured to mix a resultant RF signal with a carrier signal in a low band. In this embodiment, the RF transmission signal TXCA1, as described above with respect to FIG. 11A, is generated from the mixer MAL. The mixer MAH is configured to mix a resultant RF signal with a carrier signal in a high band. In this embodiment, the RF transmission signal TXCA3, as described above with respect to FIG. 11B is generated from the mixer MAH. The mixer MBL is configured to mix a resultant RF signal with another carrier signal in a low band. In this embodiment, the RF transmission signal TXCA2, as described above with respect to FIG. 11A, is generated from the mixer MBL. The mixer MBH is configured to mix a resultant RF signal with another carrier signal in a high band. In this embodiment, the RF transmission signal TXCA4, as described above with respect to FIG. 11B is generated from the mixer MBH.

Each of the RF transmission signal TXCA1 and the RF transmission signal TXCA2 is then amplified by a low band power amplifier LA, LB, respectively. The RF transmission signal TXCA3 and the RF transmission signal TXCA4 are amplified by high band power amplifiers HA, HB, respectively. A power converter PC is configured to generate power supply voltages from a power source voltage in order to power amplification of the RF transmission signals TXCA1, TXCA2, TXCA3, TXCA4. Power control circuitry PCC1 is configured to regulate the power supply voltages to the low band power amplifiers LA, LB in accordance with the differential gain control signal Vramp1. Similarly, power control circuitry PCC2 is configured to regulate the power supply voltages to the high band power amplifiers HA, HB in accordance with the differential gain control signal Vramp2.

Once the RF transmission signals TXCA1, TXCA2, TXCA3, TXCA4 are amplified, the RF transmission signal TXCA1 is received by an MT switch MTA, the RF transmission signal TXCA2 is received by an MT switch MTB, the RF transmission signal TXCA3 is received by an MT switch MTC and the RF transmission signal TXCA4 is received by an MT switch MTD. The MT switch MTA is configured to selectively couple an output of the low band power amplifier LA to any one of the throw ports 98-M1, 98-M2, 100-M1, 100M2, 106-M1, 106-M2, 108-M1, 108-M2. Also, the MT switch MTB is configured to selectively couple an output of the low band power amplifier LB to any one of the throw ports 98-M1, 98-M2, 100-M1, 100M2, 106-M1, 106-M2, 108-M1, 108-M2. In addition, the MT switch MTC is configured to selectively couple an output of the high band power amplifier HA to any one of the throw ports 98-M1, 98-M2, 100-M1, 100M2, 106-M1, 106-M2, 108-M1, 108-M2. Finally, the MT switch MTD is configured to selectively couple an output of the high band power amplifier HB to any one of the throw ports 98-M1, 98-M2, 100-M1, 100M2, 106-M1, 106-M2, 108-M1, 108-M2. In this manner, the RF transceiver circuitry 142 is configured to provide antenna swapping for the RF transmission signals TXCA1, TXCA2, TXCA3, TXCA4, as described above with respect to FIGS. 11A and 11B. The RF transceiver circuitry 142 may be configured to make TRP and/or TIS measurements to determine to which antenna ANT1, ANT2 to transmit the RF transmission signals TXCA1, TXCA2, TXCA3, TXCA4 based on a TRP parameter or a TIS parameter. Note that the RF transceiver circuitry 142 may include duplexers, such as duplexers DUP1, DUP2, in order to both transmit and receive using the throw ports 98-M1, 98-M2, 100-M1, 100M2, 106-M1, 106-M2, 108-M1, 108-M2.

FIG. 13 illustrates exemplary RF front-end circuitry that includes yet another embodiment of antenna switching circuitry 146. The antenna switching circuitry 146 includes front-end switching circuitry 148. The front-end switching circuitry 148 is the similar to the front-end switching circuitry 75' shown in FIGS. 11 and 11A-11D, but the front-end switching circuitry 148 does not include the low band switching circuitry 78 or the high band switching circuitry 80. As such, the front-end switching circuitry 148 includes the low band antenna selection circuitry 82', the high band antenna selection circuitry 84', the diplexers 76A, 76B, the directional couplers 110LA, 110HA, 110LB, 110HB, and the throw switch network TSN. Furthermore, the antenna switching circuitry 146 also includes the control circuit 46 described above. However, as mentioned above, the front-end switching circuitry 148 does not include the low band switching circuitry 78 and the high band switching circuitry 80. Instead, the antenna switching circuitry 146 includes low band switching circuitry 78' and high band switching circuitry 80'.

The low band switching circuitry 78' includes the pole port 86 and the set of the throw ports 88 described above with respect to the low band switching circuitry 78. Also, like the low band switching circuitry 78, the low band switching circuitry 78' is configured to selectively couple the pole port 86 to any of the throw ports 88. However, in this embodiment, the low band switching circuitry 78' is an SPMTMEMS instead of an SPMTSTS. Otherwise, the low band switching circuitry 78' shown in FIG. 13 is coupled to the low band antenna selection circuitry 82' in the same manner that the low band switching circuitry 78 is coupled to the low band antenna selection circuitry 82, as described above. Similarly the high band switching circuitry 80' includes the pole port 90 and the set of the throw ports 92 described above with respect to the high band switching circuitry 80. Also, like the high band switching circuitry 80, the high band switching circuitry 80' is configured to selectively couple the pole port 90 to any of the throw ports 92. However, in this embodiment, the high band switching circuitry 80' is an SPMTMEMS instead of an SPMTSTS. Otherwise, the high band switching circuitry 80' shown in FIG. 13 is coupled to the high band antenna selection circuitry 84' in the same manner that the high band switching circuitry 80 is coupled to the high band antenna selection circuitry 84, as described above.

In this embodiment, the MTMEMS 14(3)(A) and the MTMEMS 14(3)(B) are coupled to the front-end switching circuitry 148 in the same manner as described above with respect to the antenna switching circuitry 74 in FIGS. 9 and 9A. With respect to the control circuit 46, the control circuit 46 is configured to operate the low band switching circuitry 78' and the high band switching circuitry 80' in the same manner as described above with respect to the low band switching circuitry 78 and the high band switching circuitry 80. However, instead of the transistor switch subcontroller 56 generating the switch control output 50(SLB) and the switch control output 50(SHB) in response to the transistor switch control mode output 62, the MEMS subcontroller 58 generates the switch control output 50(SLB) and the switch control output 50(SHB) in accordance with the MEMS switch control mode output 64. The switch control output 50(SLB) is received by the low band switching circuitry 78' and the switch control output 50(SHB) is received by the high band switching circuitry 80'. In this manner, the low band switching circuitry 78' and the high band switching circuitry 80' are operated in the same manner as described above with respect to FIG. 9. Thus, the antenna switching circuitry 146 can be operated by the control circuit 46 in all the same LTE modes described above with respect to FIGS. 7 and 8. Also, since the front-end switching circuitry 148 includes the low band antenna selection circuitry 82' and the high band antenna selection circuitry 84', the control circuit 46 can also operate the antenna switching circuitry 146 in the LTE modes described above with respect to FIGS. 11 and 11A-11D. Furthermore, while the antenna switching circuitry 146 includes the MTMEMSs 14(3)(A) and 14(3)(B) described above with respect to FIG. 9, alternative embodiments of the antenna switching circuitry 146 may includes the MTMEMSs 14(1)(A) and 14(1)(B) like those in FIG. 7, or the MTMEMSs 14(2)(A) and 14(2)(B) like those in FIG. 8, and/or any combination of the components described herein.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency (RF) front-end circuitry comprising:
a first antenna port;
a second antenna port;
a third antenna port;
front-end switching circuitry having a first RF port wherein the front-end switching circuitry is configured to selectively couple the first RF port to any one of the first antenna port and the second antenna port; and a multiple throw microelectromechanical switch (MT-MEMS) having a first pole port and a first set of throw ports, wherein the first pole port of the MTMEMS is coupled to the third antenna port and the MTMEMS is configured to selectively couple the first pole port to any one of the first set of throw ports.

2. The RF front-end circuitry of claim 1 further comprising:
a directional coupler coupled between the third antenna port and the first pole port, wherein the directional coupler is configured to direct a signal flow from the third antenna port.

3. The RF front-end circuitry of claim 2 wherein the front-end switching circuitry further has a second RF port and comprises a double pole multiple throw solid-state transistor switch (DPMTSTS) having a second pole port coupled to the first antenna port, a second set of throw ports, a third pole port coupled to the second antenna port, and a third set of throw ports, and wherein:
the first RF port is coupled to a first throw port in the second set of throw ports and a second throw port in the third set of throw ports;
the second RF port is coupled to a third throw port in the second set of throw ports and a fourth throw port in the third set of throw ports;
the DPMTSTS is configured to selectively couple the second pole port to any one of the second set of throw ports; and
the DPMTSTS is configured to selectively couple the third pole port to any one of the third set of throw ports.

4. The RF front-end circuitry of claim 1 further comprising a control circuit operably associated with the front-end switching circuitry and the MTMEMS wherein the control circuit is configured to:
control the selective coupling of the front-end switching circuitry to selectively couple the first RF port to either the first antenna port or the second antenna port; and
control the selective coupling of the MTMEMS such that the first pole port is selectively coupled to a first throw port of the first set of throw ports.

5. The RF front-end circuitry of claim 4 further comprising a directional coupler coupled between the third antenna port and the first pole port, wherein the directional coupler is configured to direct a signal flow from the third antenna port, and wherein:
the control circuit is operably associated with the directional coupler; and
the control circuit is operable in a first mode and is configured to set the signal flow from the third antenna port to a receive signal flow in the first mode.

6. The RF front-end circuitry of claim 1 wherein the front-end switching circuitry has a second RF port, wherein the front-end switching circuitry is further configured to selectively couple the second RF port to any one of the first antenna port and the second antenna port.

7. The RF front-end circuitry of claim 1 further comprising:
a second MTMEMS having a second pole port coupled to the first RF port and a second set of throw ports, wherein the second MTMEMS is further configured to selectively couple the second pole port to any one of the second set of throw ports.

8. The RF front-end circuitry of claim 1 further comprising a second MTMEMS wherein the front-end switching circuitry further has a second RF port and wherein:
the front-end switching circuitry is further configured to selectively couple the second RF port to any one of the first antenna port and the second antenna port.

9. The RF front-end circuitry of claim 1 wherein the MTMEMS has a second set of throw ports and a second pole port coupled to the first RF port, and wherein the MTMEMS is further configured to selectively couple the second pole port to any one of the second set of throw ports.

10. The RF front-end circuitry of claim 9 wherein a first throw port of the first set of throw ports is directly connected to a second throw port of the second set of throw ports.

11. The RF front-end circuitry of claim 9 further comprising a control circuit operably associated with the front-end switching circuitry and the MTMEMS, wherein the control circuit is operable in a first mode, and while the control circuit is in the first mode the control circuit is configured to:
control the selective coupling of the front-end switching circuitry to selectively couple the first RF port to either the first antenna port or the second antenna port;
control the selective coupling of the MTMEMS such that the first pole port is selectively coupled to a first throw port of the first set of throw ports; and
control the selective coupling of the MTMEMS such that the second pole port is selectively coupled to a second throw port of the first set of throw ports.

12. The RF front-end circuitry of claim 11 wherein the front-end switching circuitry further has a second RF port and is further configured to selectively couple the second RF port to the first antenna port and the second antenna port, and wherein:
the control circuit in the first mode is further configured to control the selective coupling of the front-end switching circuitry such that the second RF port is selectively coupled to either the first antenna port or the second antenna port.

13. The RF front-end circuitry of claim 12 wherein the front-end switching circuitry comprises a first double pole multiple throw solid-state transistor switch (DPMTSTS) comprising a third pole port coupled to the first antenna port and a third set of throw ports, and a fourth pole port coupled to the second antenna port and a fourth set of throw ports, each of the third set of throw ports being directly coupled to a different one of the fourth set of throw ports, and wherein the first RF port is coupled to one of the fourth set of throw ports and the second RF port is coupled to another one of the fourth set of throw ports.

14. The RF front-end circuitry of claim 12 wherein the front-end switching circuitry further has a third RF port and is further configured to selectively couple the third RF port to any one of the first antenna port and the second antenna port, and wherein:
the control circuit is operable in a second mode, and while the control circuit is in the second mode, the control circuit is configured to:
control the selective coupling of the MTMEMS such that the second pole port is decoupled from the second set of throw ports;
control the selective coupling of the front-end switching circuitry such that the second RF port is selectively coupled to either the first antenna or the second antenna; and
control the selective coupling of the MTMEMS such that the third RF port is selectively coupled to either the first antenna or the second antenna.

15. The RF front-end circuitry of claim 9 wherein:
  a first throw port of the first set of throw ports is directly connected to a second throw port of the second set of throw ports; and
  a third throw port of the first set of throw ports is not coupled to any of the second set of throw ports.

16. The RF front-end circuitry of claim 15 further comprising a control circuit operably associated with the front-end switching circuitry and the MTMEMS, wherein the control circuit is operable in a first mode, and while the control circuit is in the first mode the control circuit is configured to:
  control the selective coupling of the front-end switching circuitry to selectively couple the first RF port to either the first antenna port or the second antenna port;
  control the selective coupling of the MTMEMS such that the first pole port is selectively coupled to either the first throw port or the third throw port of the first set of throw ports; and
  control the selective coupling of the MTMEMS such that the second pole port is selectively coupled to the second throw port of the second set of throw ports.

17. The RF front-end circuitry of claim 16 further comprising a directional coupler coupled between the third antenna port and the first pole port, wherein the directional coupler is configured to direct a signal flow from the third antenna port, and wherein:
  the control circuit is operably associated with the directional coupler; and
  while the control circuit is in the first mode, the control circuit is further configured to set the signal flow to a receive signal flow in the first mode.

18. The RF front-end circuitry of claim 1 wherein the front-end switching circuitry further comprises:
  a first diplexer coupled to the first antenna port and having a first low band port and a first high band port; and
  a second diplexer coupled to the second antenna port and having a second low band port and a second high band port.

19. The RF front-end circuitry of claim 18 wherein the front-end switching circuitry comprises:
  a first directional coupler coupled to the first low band port, the first directional coupler being configured to direct a first signal flow from the first antenna port;
  a second directional coupler coupled to the first high band port, the second directional coupler being configured to direct a second signal flow from the first antenna port;
  a third directional coupler coupled to the second low band port, the second directional coupler being configured to direct a third signal flow from the second antenna port;
  a fourth directional coupler coupled to the second high band port, the second directional coupler being configured to direct a fourth signal flow from the second antenna port; and
  a fifth directional coupler coupled between the third antenna port and the first pole port of the MTMEMS, the third directional coupler being configured to direct a fifth signal flow from the third antenna port.

20. The RF front-end circuitry of claim 19 further comprising:
  a throw switch network operably associated with the first directional coupler, the second directional coupler, the third directional coupler, the fourth directional coupler, and the fifth directional coupler, wherein the throw switch network is configured to switch the first signal flow of the first directional coupler, switch the second signal flow of the second directional coupler, switch the third signal flow of the third directional coupler, switch the fourth signal flow of the fourth directional coupler, and switch the fifth signal flow of the fifth directional coupler.

* * * * *